United States Patent
Huang et al.

(10) Patent No.: US 12,080,646 B2
(45) Date of Patent: Sep. 3, 2024

(54) SEMICONDUCTOR STRUCTURES AND METHODS OF FORMING THE SAME

(71) Applicant: Taiwan Semiconductor Manufacturing Co., Ltd., Hsin-Chu (TW)

(72) Inventors: Lin-Yu Huang, Hsinchu (TW); Li-Zhen Yu, New Taipei (TW); Cheng-Chi Chuang, New Taipei (TW); Kuan-Lun Cheng, Hsin-Chu (TW); Chih-Hao Wang, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 18/446,113

(22) Filed: Aug. 8, 2023

(65) Prior Publication Data

US 2023/0387010 A1    Nov. 30, 2023

Related U.S. Application Data

(62) Division of application No. 17/337,962, filed on Jun. 3, 2021, now Pat. No. 11,862,559.

(60) Provisional application No. 63/059,430, filed on Jul. 31, 2020.

(51) Int. Cl.
*H01L 23/528* (2006.01)
*H01L 21/768* (2006.01)
*H01L 29/40* (2006.01)
*H01L 29/417* (2006.01)

(52) U.S. Cl.
CPC .... *H01L 23/5283* (2013.01); *H01L 21/76883* (2013.01); *H01L 21/76892* (2013.01); *H01L 29/401* (2013.01); *H01L 29/41775* (2013.01); *H01L 21/76885* (2013.01)

(58) Field of Classification Search
CPC .......... H01L 23/5283; H01L 21/76883; H01L 21/76892; H01L 21/76885
See application file for complete search history.

(56) References Cited

U.S. PATENT DOCUMENTS

| | | | |
|---|---|---|---|
| 9,236,267 B2 | 1/2016 | De | |
| 9,551,923 B2 | 1/2017 | Wang | |
| 9,634,141 B1 | 4/2017 | Wang | |
| 2010/0084770 A1 | 4/2010 | Sakuma | |
| 2012/0038056 A1 | 2/2012 | Cabral, Jr. | |

(Continued)

FOREIGN PATENT DOCUMENTS

| | | |
|---|---|---|
| KR | 20180069672 A | 6/2018 |
| WO | 2019190495 A1 | 10/2019 |

*Primary Examiner* — Joseph C. Nicely
(74) *Attorney, Agent, or Firm* — Haynes and Boone, LLP

(57) ABSTRACT

A method having a semiconductor substrate received and a first dielectric layer is formed over the semiconductor substrate. A trench is formed in the first dielectric layer. The trench is filled to form a conductive layer in the first dielectric layer. The conductive layer is segmented to form a first conductive feature and a second conductive feature separated from each other by a recess. The recess is filled with a second dielectric layer, such that one or both of the conductive features are end-capped by a portion of the first dielectric layer and a portion of the second dielectric layer.

20 Claims, 54 Drawing Sheets

(56) References Cited

U.S. PATENT DOCUMENTS

| | | | |
|---|---|---|---|
| 2014/0252625 A1* | 9/2014 | Ting | ............... H01L 23/5226 |
| | | | 257/751 |
| 2017/0069573 A1* | 3/2017 | Ting | ............... H01L 21/7684 |
| 2018/0026150 A1 | 1/2018 | Sato | |
| 2018/0040732 A1 | 2/2018 | Chang | |
| 2018/0138076 A1* | 5/2018 | Yang | ............... H01L 21/7682 |
| 2018/0261501 A1 | 9/2018 | Tseng | |
| 2020/0105586 A1 | 4/2020 | Hsu | |
| 2020/0126913 A1* | 4/2020 | Ting | ............ H01L 21/76816 |
| 2022/0359815 A1 | 11/2022 | Ku | |

* cited by examiner

US 12,080,646 B2

SEMICONDUCTOR STRUCTURES AND METHODS OF FORMING THE SAME

PRIORITY DATA

This application is a divisional application of U.S. patent application Ser. No. 17/337,962, filed Jun. 3, 2021, which claims the benefit of U.S. Provisional Patent Application Ser. No. 63/059,430, filed Jul. 31, 2020, the entire disclosures of which are hereby incorporated by reference.

BACKGROUND

The semiconductor integrated circuit (IC) industry has experienced rapid growth. Technological advances in IC materials and design have produced continuous improvements in succeeding generations of ICs. Each generation has smaller and more complex circuits than the previous generation. However, these advances have increased the complexity of processing and manufacturing ICs.

In the course of IC evolution, functional density (i.e., the number of interconnected devices per chip area) has generally increased while geometric size (i.e., scale of the smallest component (or line) that can be created using a fabrication process) has decreased. This scaling-down process generally provides benefits by increasing production efficiency and reducing associated costs.

However, as the feature sizes continue to decrease, fabrication processes continue to become more difficult to perform. Thus, there is a challenge to form reliable semiconductor devices of smaller and smaller sizes.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
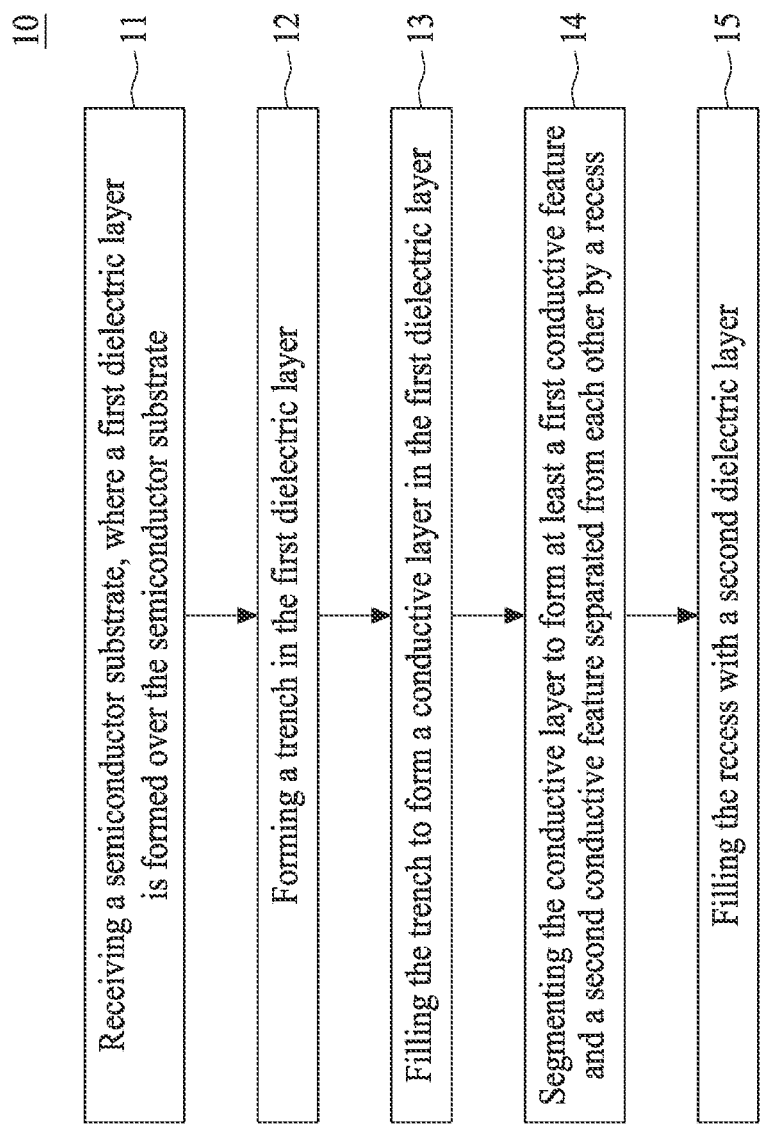
FIG. 1 is a flowchart of a method 10 for forming a semiconductor structure according to various aspects of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm. Still further, spatially relative terms, such as "beneath," "below," "lower," "above," "upper," "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 100 degrees or at other orientations) and the spatially relative descriptors used herein may likewise be interpreted accordingly.

As used herein, the terms such as "first," "second" and "third" describe various elements, components, regions, layers and/or sections, but these elements, components, regions, layers and/or sections should not be limited by these terms. These terms may be only used to distinguish one element, component, region, layer or section from another. The terms such as "first," "second" and "third" when used herein do not imply a sequence or order unless clearly indicated by the context.

An IC manufacturing process flow can typically be divided into three categories: front-end-of-line (FEOL), middle-end-of-line (MEOL) and back-end-of-line (BEOL). FEOL generally encompasses processes related to fabrication of IC devices, such as transistors. For example, FEOL processes can include formation of isolation structures for isolating IC devices, gate structures, and source and drain structures (also referred to as source/drain structures) that form a transistor. MEOL generally encompasses processes related to fabrication of connecting structures (also referred to as contacts or plugs) that connect to conductive features (or conductive regions) of the IC devices. For example, MEOL processes can include formation of connecting structures that connect to the gate structures and connecting structures that connect to the source/drain structures. BEOL generally encompasses processes related to fabrication of multilayer interconnect (MLI) structures that electrically connect the IC devices to the connecting structures fabricated by FEOL and MEOL. Accordingly, operation of the IC devices can be enabled. As mentioned above, the scaling-down processes have increased the complexity of processing and manufacturing ICs.

In some embodiments, a BEOL MLI includes a plurality of metal layers (or metallization lines) referred to as, in ascending order, a zeroth metal layer M0, a first metal layer M1, and an Nth metal layer Mn, and a plurality of connecting vias referred to as a first via V1, a second via V2, and an (N−1)th via Vn−1, where n is a positive integer. The connecting vias are configured to electrically couple together two adjacent metal layers. For example, the (N−1)th metal layer Mn−1 and the Nth metal layer Mn may be electrically connected by the (N−1)th via Vn−1. Further, the metal layer Mn and the connecting vias Vn−1 may be formed in an inter-metal dielectric (IMD) layer IMDn to provide mechanical support and electrical isolation therebetween. In some embodiments, the formation of the metal layers and the connecting vias include forming openings in an IMD layer, filling the openings with a conductive material(s), and performing a planarization process, such as a chemical mechanical polishing (CMP) operation, to the conductive material(s). In some comparative approaches, it is found that when the metal layers become shorter due to downscaling, the above-mentioned filling of the openings with conductive material(s) becomes much more challenging. Such challenge associated with opening-filling or gap-filling may cause voids in the metal layers, which may adversely impact device performance.

The present disclosure provides a semiconductor structure and a method for forming the same. In the present embodiments, a metallization line is formed in an inter-metal dielectric layer and a metal-cutting operation is performed to remove portions of the metallization line, thereby segmenting the metallization line into multiple metallization features. Subsequently, openings formed by the segmenting are filled with a dielectric material to provide isolation between the metallization features. Accordingly, the gap-filling issue may be mitigated, and the device performance can be ensured.

FIG. 1 is a flowchart representing a method 10 for forming a semiconductor structure 200 according to aspects of the present disclosure. In some embodiments, the method 10 includes a number of operations (11, 12, 13, 14 and 15) and is further described below according to one or more embodiments. It should be noted that the operations of the method may be omitted, rearranged, or otherwise modified within the scope of the various aspects. It should further be noted that additional operations may be provided before, during, and after the method 10, and that some other operations may be only briefly described herein. In the present embodiments, the method 10 is used to form a BEOL interconnection (e.g., MLI) structure, in part or in entirety, over a semiconductor structure.

In some embodiments, the method 10 can be used to form a zeroth metal layer M0 of a semiconductor structure. For example, FIGS. 2A, 3A, 4A, 5A, 6A, 7A, 8A, 9A, 10A, 11A, 13A, 14A, 15A, 16A, 17A, 18A, and 19A are schematic planar top views of a semiconductor structure at various stages of the method 10 according to aspects of one or more embodiments of the present disclosure. Further, FIGS. 2B, 3B, 4B, 5B, 6B, 7B, 8B, 9B, 10B, 11B, 13B, 14B, 15B, 16B, 17B, 18B, and 19B are schematic cross-sectional views of the semiconductor structure taken along line II-If of FIGS. 2A, 3A, 4A, 5A, 6A, 7A, 8A, 9A, 10A, 11A, 13A, 14A, 15A, 16A, 17A, 18A, and 19A, respectively, according to aspects of one or more embodiments of the present disclosure. FIGS. 2C, 3C, 4C, 5C, 6C, 7C, 8C, 9C, 10C, 11C, 12, 13C, 14C, 15C, 16C, 17C, 18C, and 19C are schematic cross-sectional views taken along line I-f of FIGS. 2A, 3A, 4A, 5A, 6A, 7A, 8A, 9A, 10A, 11A, 13A, 14A, 16A, 17A, 18A, and 19A, respectively, according to aspects of one or more embodiments of the present disclosure.

Figure 2A:
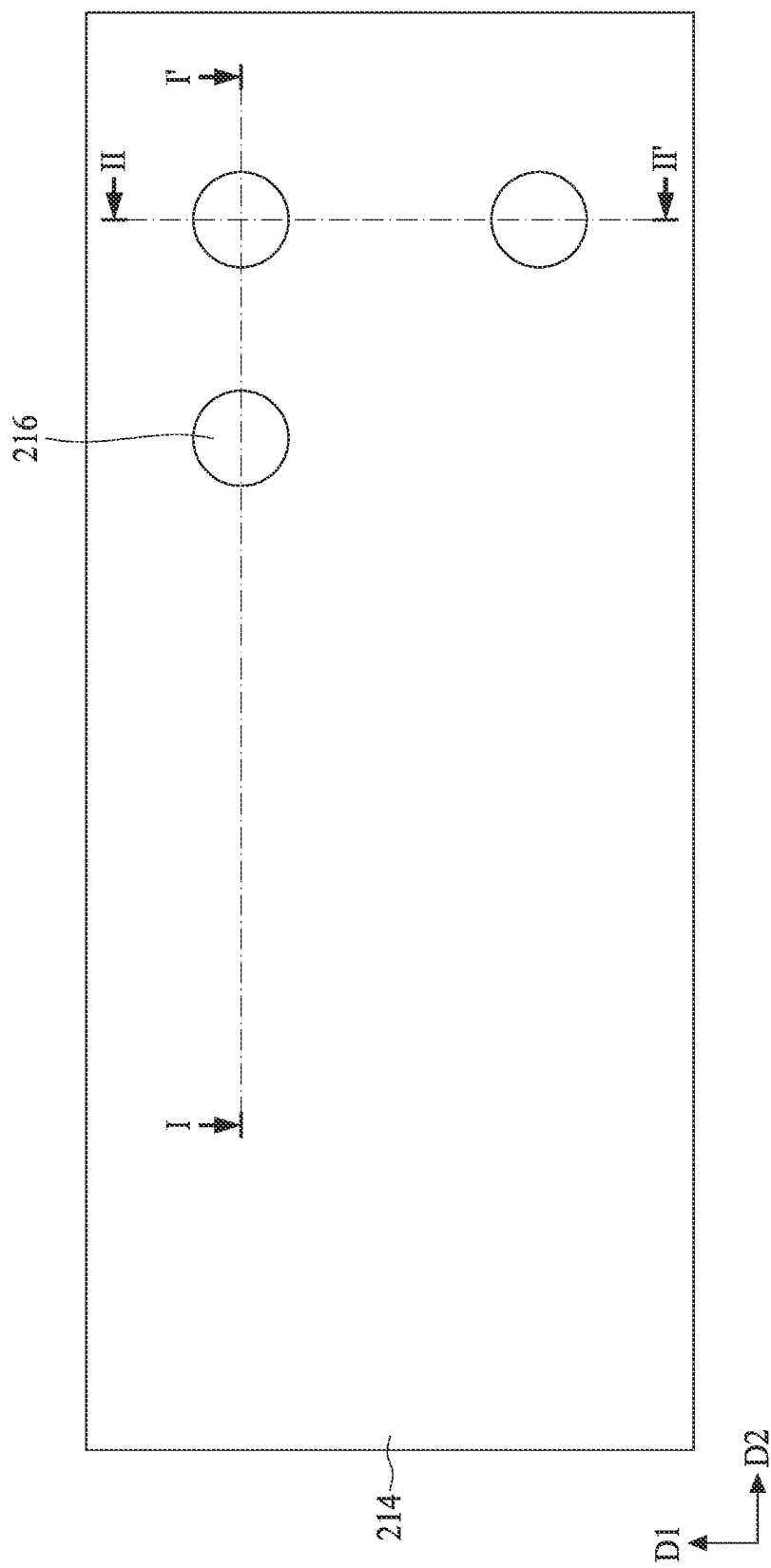
FIGS. 2A, 3A, 4A, 5A, 6A, 7A, 8A, 9A, 10A, 11A, 13A, 14A, 15A, 16A, 17A, 18A, and 19A are schematic planar top views of a semiconductor structure at various stages of the method 10 according to aspects of one or more embodiments of the present disclosure.
Figure 2B:
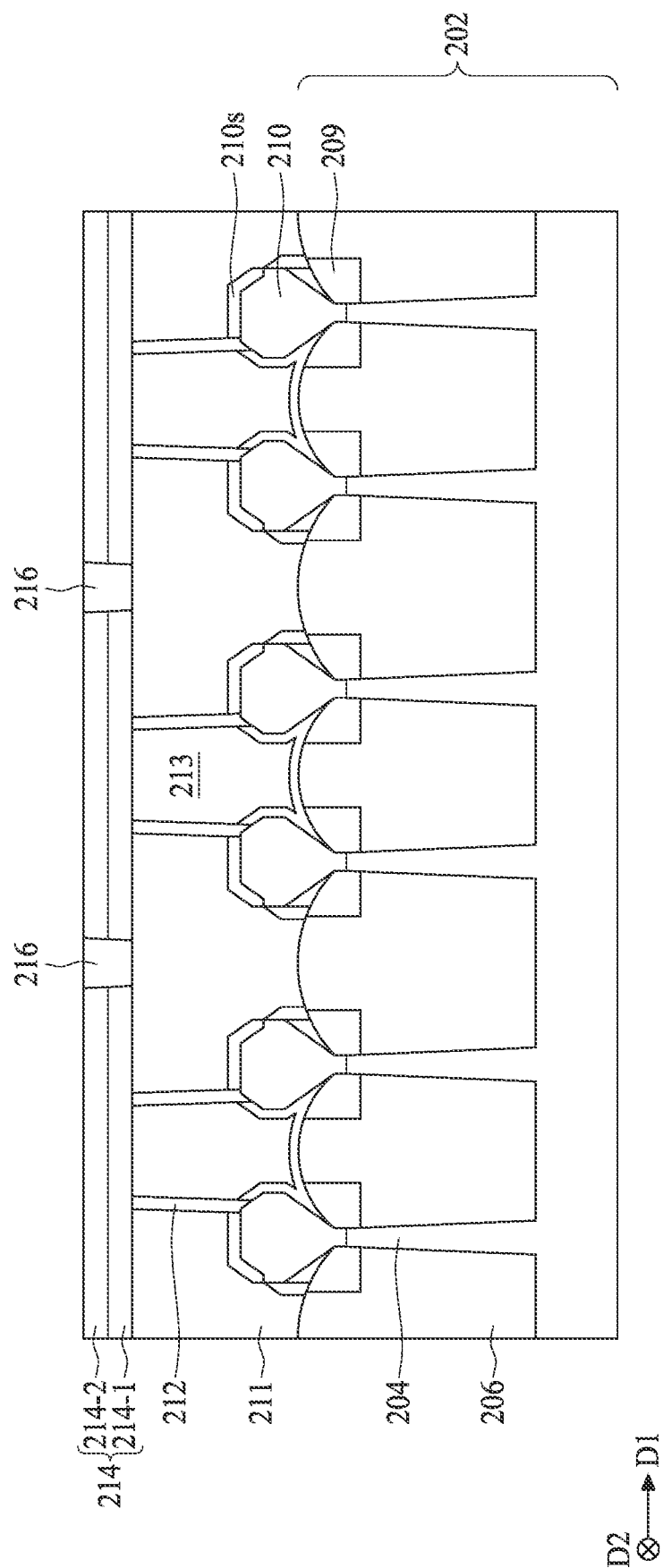
FIGS. 2B, 3B, 4B, 5B, 6B, 7B, 8B, 9B, 10B, 11B, 13B, 14B, 15B, 16B, 17B, 18B, and 19B are schematic cross-sectional views of the semiconductor structure taken along line II-II' of FIGS. 2A, 3A, 4A, 5A, 6A, 7A, 8A, 9A, 10A, 11A, 13A, 14A, 15A, 16A, 17A, 18A, and 19A, respectively, according to aspects of one or more embodiments of the present disclosure.
Figure 2C:
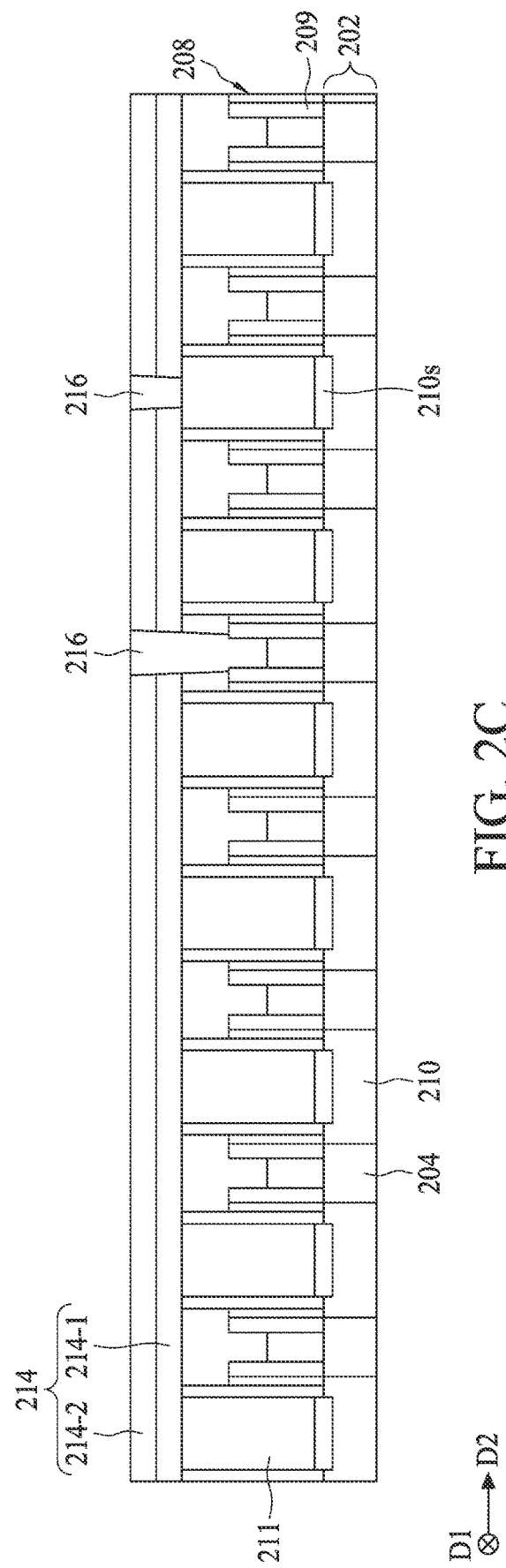
FIGS. 2C, 3C, 4C, 5C, 6C, 7C, 8C, 9C, 10C, 11C, 13C, 14C, 15C, 16C, 17C, 18C, and 19C are schematic cross-sectional views taken along line I-I' of FIGS. 2A, 3A, 4A, 5A, 6A, 7A, 8A, 9A, 10A, 11A, 13A, 14A, 15A, 16A, 17A, 18A, and 19A, respectively, according to aspects of one or more embodiments of the present disclosure.

Referring to FIGS. 2A to 2C, in operation 11, the method 10 receives (or is provided with) a semiconductor structure 200 (hereinafter referred to as structure 200) that includes a semiconductor substrate 202. In some embodiments, the semiconductor substrate 202 including one or more FEOL devices can be a portion of an IC chip, a system on chip (SoC), or a portion of a system on chip. In some embodiments, the semiconductor substrate 202 can be a substrate accommodating FEOL devices such as microprocessors, memories, and/or other IC devices. In some embodiments, the semiconductor substrate 202 can include various passive and active microelectronic devices, such as resistors, capacitors, inductors, diodes, p-type field-effect transistors (PPETs), n-type field-effect transistors (NFETs), metal-oxide semiconductor field-effect transistors (MOSFETs), complementary metal-oxide semiconductor (CMOS) transistors, bipolar junction transistors (BJTs), laterally-diffused MOS (LDMOS) transistors, high-voltage transistors, high-frequency transistors, other suitable components, or combinations thereof. The transistors may be planar transistors or multi-gate transistors, such as fin-like FETs (FinFETs). FIGS. 2A to 2C have been simplified for the sake of clarity to better illustrate the inventive concepts of the present disclosure.

In some embodiments, the semiconductor substrate 202 includes silicon. Alternatively or additionally, the semiconductor substrate 202 includes another elementary semiconductor, such as germanium; a compound semiconductor, such as silicon carbide, gallium arsenide, gallium phosphide, indium phosphide, indium arsenide, and/or indium antimonide; an alloy semiconductor, such as silicon germanium (SiGe), GaAsP, AlInAs, AlGaAs, GaInAs, GaInP, and/or GaInAsP; or a combination thereof. In some implementations, the semiconductor substrate 202 includes one or more group III-V materials, one or more group II-IV materials, or a combination thereof. In some implementations, the semiconductor substrate 202 is a semiconductor-on-insulator substrate, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other suitable methods.

In the present embodiments, the semiconductor substrate 202 includes one or more three-dimensional, fin-like active regions (or fins) 204 over which components including gate structures and epitaxial source/drain features are subsequently formed to provide one or more FEOL devices. Referring to FIG. 2B, the fins 204 are oriented lengthwise along a direction D2 and spaced from each other along a direction D1 that is substantially perpendicular to the direction D2. In some embodiments, the fin 204 includes a single semiconductor layer configured to provide a fin-like device, such as fin-like field-effect transistor (FinFET). In some embodiments, the fin 204 includes a stack of semiconductor layers interleaved with a portion of a gate structure to provide a gate-all-around (GAA) device, such as GAA FET.

The semiconductor substrate 202 may include various doped regions (not shown) configured according to design requirements of an FEOL device, such as p-type doped regions, n-type doped regions, or combinations thereof. P-type doped regions (for example, p-type wells) include p-type dopants, such as boron, indium, another p-type dopant, or a combination thereof. N-type doped regions (for example, n-type wells) include n-type dopants, such as phosphorus, arsenic, another n-type dopant, or a combination thereof. In some implementations, the semiconductor substrate 202 includes doped regions formed with a combination of p-type dopants and n-type dopants. The various doped regions can be formed directly on and/or in the semiconductor substrate 202, for example, providing a p-well structure, an n-well structure, a dual-well structure, a raised structure, or combinations thereof. An ion implantation process, a diffusion process, and/or another suitable doping process can be performed to form the various doped regions.

The structure 200 further includes isolation features 206 formed over and/or in the semiconductor substrate 202 to electrically isolate various regions, such as various device regions, of the structure 200. For example, the isolation features 206 can define and electrically isolate active device regions and/or passive device regions from each other. The isolation features 206 can include silicon oxide, silicon nitride, silicon oxynitride, another suitable isolation material, or a combination thereof. The isolation features 206 can include different structures, such as shallow trench isolation (STI) structures, deep trench isolation (DTI) structures, and/or local oxidation of silicon (LOCOS) structures.

Various gate structures can be disposed over the semiconductor substrate 202, such as gate structures 208. In some embodiments, the gate structures 208 extend lengthwise along the direction D1 and spaced from each other along the direction D2, i.e., the gate structures 208 are oriented substantially perpendicular to the fins 204. As shown in FIG. 2B, the gate structures 208 interpose a source region and a drain region, where a channel region is defined between the source region and the drain region. In some embodiments, the gate structures 208 are formed over a fin structure. In some embodiments, the gate structures 208 include a metal gate structure. In some embodiments, the metal gate structure includes a gate dielectric layer and a gate electrode disposed over the gate dielectric layer. The gate dielectric layer includes a dielectric material, such as silicon oxide, a high-k dielectric material, other suitable dielectric materials, or combinations thereof. A high-k dielectric material generally refers to a dielectric material having a high dielectric constant, for example, a dielectric constant greater than that of silicon oxide (k≈3.9). Example high-k dielectric materials include hafnium, aluminum, zirconium, lanthanum, tantalum, titanium, yttrium, oxygen, nitrogen, other suitable materials, or combinations thereof. For example, the gate dielectric layer may include $HfO_2$, HfSiO, HfSiON, HfTaO, HfTiO, HfZrO, $ZrO_2$, $Al_2O_3$, $HfO_2$—$Al_2O_3$, $TiO_2$, $Ta_2O_5$, $La_2O_3$, $Y_2O_3$, other suitable high-k dielectric materials, or combinations thereof. In some embodiments, the gate structure 208 may include other material layers, such as an interfacial layer (IL) including, for example, silicon oxide, a barrier layer, a capping layer, other suitable layers, or combinations thereof.

The gate electrode includes an electrically-conductive material, such as one or more metals. Accordingly, the gate structures 208 may be referred to as high-k metal gate stacks. In some implementations, the gate electrode includes multiple layers, such as one or more work function metal layers and gap-filling metal layers. The work function metal layer includes a conductive material tuned to have a desired work function (such as an n-type work function or a p-type work function). Example work function materials include TiN, TaN, Ru, Mo, Al, $ZrSi_2$, $MoSi_2$, $TaSi_2$, $NiSi_2$, WN, Ti, Ag, Mn, Zr, TiAl, TiAlC, TaC, TaCN, TaSiN, TaAl, TaAlC, TiAlN, other suitable work function materials, or combinations thereof. The gap-filling metal layer may include a suitable conductive material, such as Al, W, Cu, Co, Ru, other suitable conductive materials, or combinations thereof.

The gate structures 208 may further include spacers 209, which are disposed adjacent to (for example, along sidewalls of) the gate structures 208. The spacers 209 may be formed by any suitable process and include a dielectric material. The dielectric material may include silicon, oxygen, carbon, nitrogen, another suitable material, or a combination thereof (for example, silicon oxide, silicon nitride, silicon oxynitride, or silicon carbide). In some embodiments, the spacers 209 include a multilayer structure, such as a first dielectric layer that includes silicon nitride and a second dielectric layer that includes silicon oxide. In some embodiments, more than one set of spacers, such as seal spacers, offset spacers, sacrificial spacers, dummy spacers, and/or main spacers, are formed adjacent to the gate structures 208. Implantation, diffusion, and/or annealing processes can be performed to form lightly-doped source and drain (LDD) features and/or heavily-doped source and drain (HDD) features in the semiconductor substrate 202 before and/or after the forming of the spacers.

In the present embodiments, source/drain (S/D) regions of each fin 204 include epitaxial S/D structures 210. For example, a semiconductor material may be epitaxially grown on the semiconductor substrate 202 to form the epitaxial S/D structures 210 over a source region and a drain region of the semiconductor substrate 202. Accordingly, the gate structure 208, the epitaxial S/D structure 210, and a channel region defined between the epitaxial source/drain structures form an FEOL device, such as a transistor. In some embodiments, the epitaxial S/D structures 210 surround source/drain regions of a fin structure. In some embodiments, the epitaxial S/D structures 210 replace portions of the fin structure. The epitaxial S/D structures 210 are doped with n-type dopants and/or p-type dopants. In some embodiments, where the transistor is configured as an n-type device (for example, a device having an n-channel), the epitaxial S/D structures 210 include silicon-containing epitaxial layers or silicon-carbon-containing epitaxial layers doped with phosphorous, other n-type dopants, or combinations thereof (for example, forming Si:P epitaxial layers or Si:C:P epitaxial layers). In some embodiments, where the transistor is configured as a p-type device (for example, a device having a p-channel), the epitaxial S/D structures 210 include silicon-and-germanium-containing epitaxial layers doped with boron, other p-type dopants, or combinations thereof (for example, forming Si:Ge:B epitaxial layers). In some embodiments, the epitaxial S/D structures 210 include materials and/or dopants that achieve desired tensile stress and/or compressive stress in the channel region. In some embodiments, a metal silicide layer 210s may be formed on top surfaces of the epitaxial S/D structures 210.

As shown in FIGS. 2A to 2C, the structure 200 may further include a plurality of S/D contacts 211 on the epitaxial S/D structures 210 and in dielectric layers 212 and 213. In the present embodiments, the dielectric layer 212 is a contact etch-stop layer (CESL) and includes a suitable dielectric material, such as silicon nitride (SiN), silicon oxide (SiO), silicon oxynitride (SiON), silicon carbide (SiC), silicon oxycarbonitride (SiOCN), silicon carbonitride (SiCN), other dielectric materials, or combinations thereof.

In the present embodiments, the dielectric layer 213 is an interlayer-dielectric (ILD) layer and includes a suitable dielectric material, such as silicon oxide (SiO), tetraethyl orthosilicate (TEOS), phosphosilicate glass (PSG), borophosphosilicate glass (BPSG), a low-k dielectric material, other dielectric materials, or a combination thereof. Example low-k dielectric materials may include fluoride-doped silicate glass (FSG), carbon-doped silicon oxide, Black Diamond® (Applied Materials of Santa Clara, Calif.), Xerogel, Aerogel, amorphous fluorinated carbon, Parylene, BCB, SILK (Dow Chemical, Midland, Mich.), polyimide, other low-k dielectric materials, and combinations thereof. As shown in FIGS. 2A to 2C, the dielectric layer 212 is disposed over the epitaxial S/D structures 210, and the dielectric layer 213 is disposed over the dielectric layer 212.

Furthermore, the structure 200 includes a dielectric layer 214 disposed over the S/D contacts 211 and the dielectric layers 212 and 213. In the present embodiments, the dielectric layer 214 is an etch stop layer having a single-layered structure or a multi-layered structure. For example, in the depicted embodiments, the dielectric layer 214 include a first etch stop layer 214-1 and a second etch stop layer 214-2 over the first etch stop layer 214-1. In some embodiments, the first etch stop layer 214-1 and the second etch stop layer 214-2 may each include silicon nitride (SiN), silicon carbide (SiC), lanthanum oxide (LaO), aluminum oxide (AlO), aluminum oxynitride (AlON), zirconium oxide (ZrO), zirconium nitride (ZrN), zirconium aluminum oxide (ZrAlO), hafnium oxide (HfO), zinc oxide (ZnO), titanium oxide (TiO), tantalum oxide (TaO), tantalum carbonitride (TaCN), yttrium oxide (YO), silicon nitride (SiN), silicon oxide (SiO), silicon oxycarbonitride (SiOCN), silicon carbonitride (SiCN), other suitable materials, or combination thereof. In some embodiments, the first etch stop layer 214-1 and the second etch stop layer 214-2 include different materials. In some embodiments, a thickness of each of the first etch stop layer 214-1 and the second etch stop layer 214-2 is approximately 2 nanometers to approximately 20 nanometers, but the disclosure is not limited thereto.

In some embodiments, a plurality of connecting vias 216 are formed in the dielectric layer 214 over the source/drain region or the gate structure 208, as shown in FIGS. 2A to 2C. In some embodiments, the connecting vias 216 each include a bulk conductive layer having Co, W, Ru, Al, Mo, Ti, Cu, other suitable conductive materials, or combinations thereof. In some embodiments, the connecting vias 216 each include a barrier layer (not shown separately) over which the bulk conductive layer is disposed, and the barrier layer may include titanium nitride (TiN), titanium silicide (TiSi), titanium silicide nitride (TiSiN), cobalt silicide (CoSi), Ni, nickel silicide (NiSi), Cu, tantalum nitride (TaN), other suitable materials, or combination thereof. In some embodiments, the connecting vias 216 include a via-to-gate (VG), which generally refers to a contact coupled to the gate structure 208, such that the gate structure 208 may be connected to a BEOL interconnection (not shown) through the connecting via 216. In some embodiments, the connecting vias 216 include a via-to-drain (VD), which generally refers to a contact coupled to a source/drain region, such that the epitaxial S/D structures 210 may be connected to the BEOL interconnection through the connecting via 216. Accordingly, the FEOL devices can be electrically connected to the BEOL interconnection through the connecting vias 216, which may also be referred to as the MEOL interconnect structures.

Figure 3A:
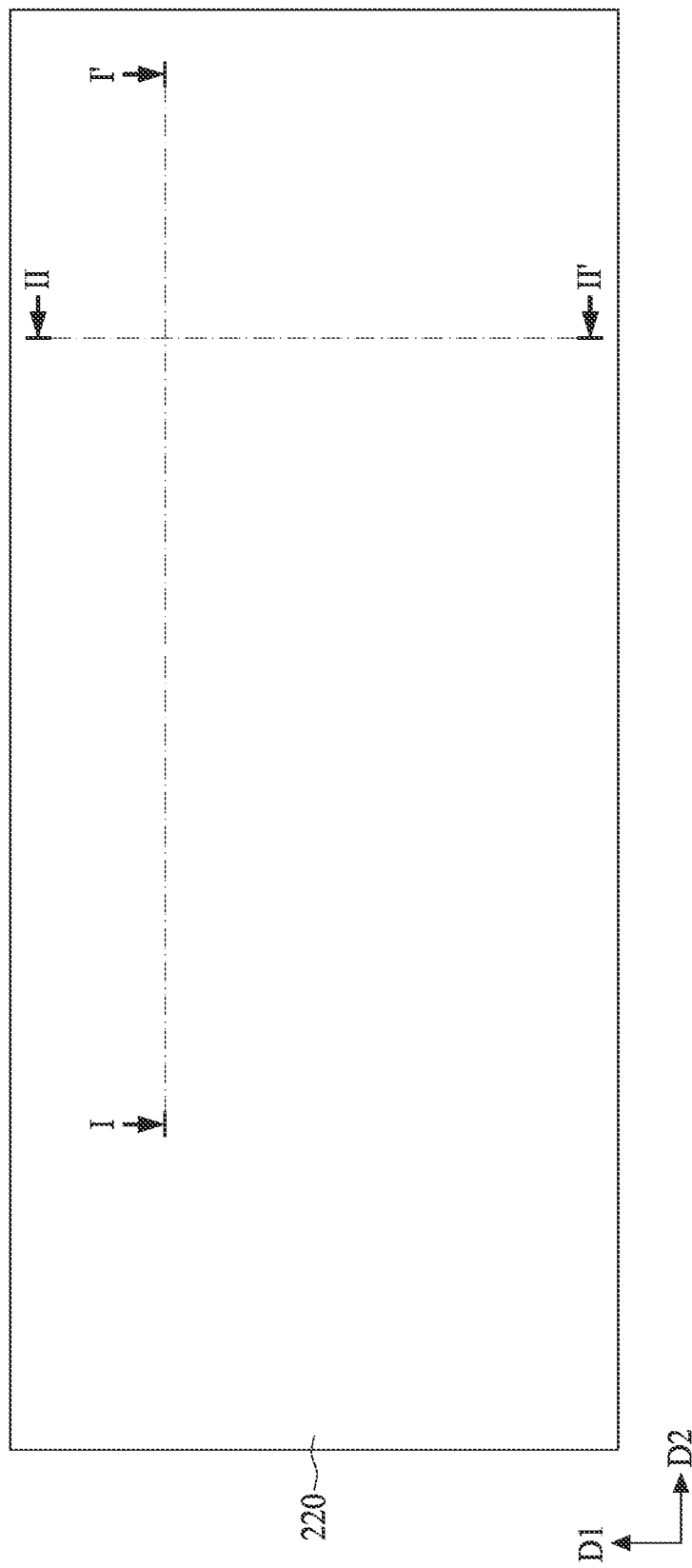
Figure 3B:
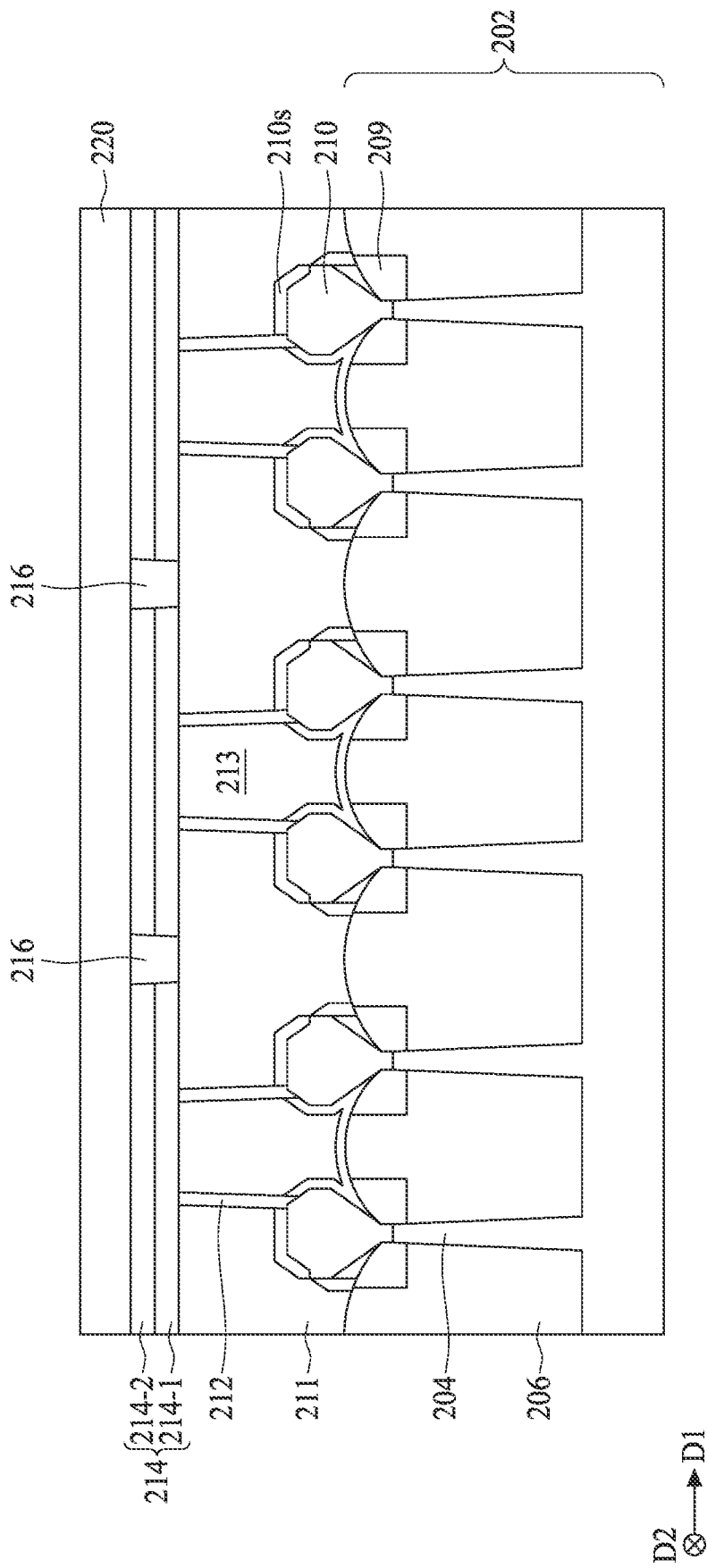
Figure 3C:
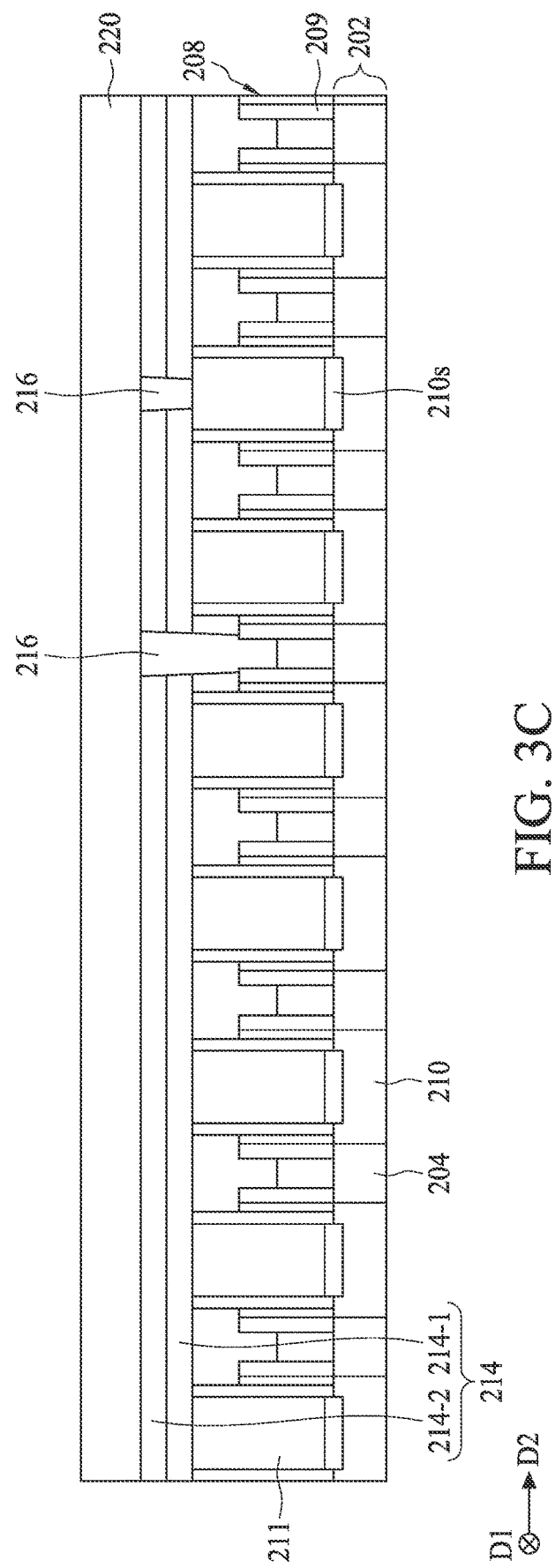

Referring to FIGS. 3A to 3C, in operation 11, the method 10 forms a dielectric layer 220 over the structure 200. The dielectric layer 220 can be referred to as an IMD layer or alternatively, as an ILD layer. The dielectric layer 220 may include a dielectric material including, for example, silicon oxide, TEOS, PSG, BPSG, a low-k dielectric material (examples provided above), another suitable dielectric material, or a combination thereof. In some embodiments, the dielectric layer 220 and the dielectric layer 214 include different materials. In some embodiments, the dielectric layer 220 and the second etch stop layer 214-2 include different materials. A thickness of the dielectric layer 220 may be approximately 0.5 nanometers to approximately 30 nanometers, but the disclosure is not limited thereto. In the present embodiments, the thickness of the dielectric layer 220 is greater than that of the first etch-stop layer 214-1 and the second etch-stop layer 214-2.

Figure 4A:
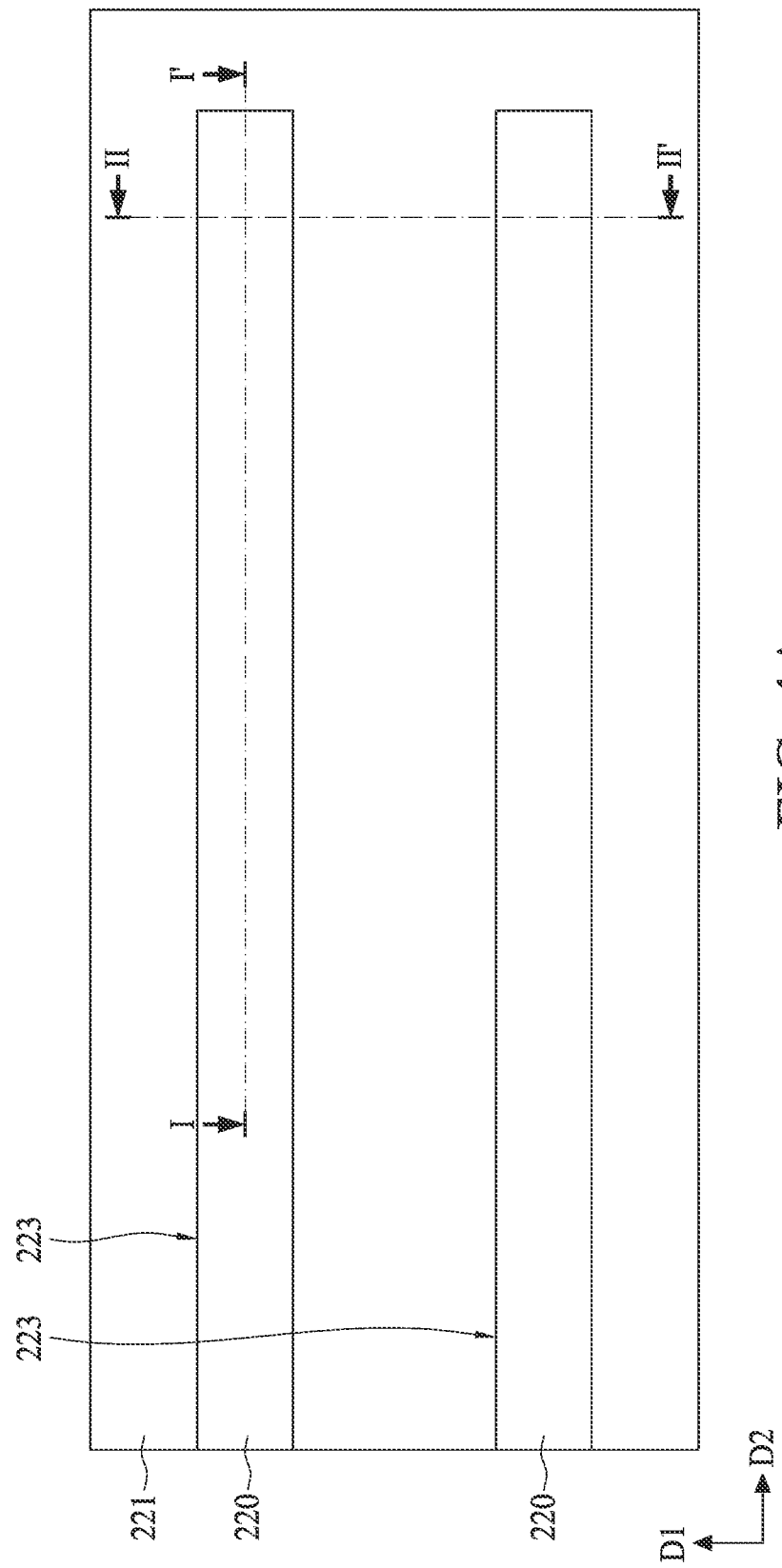
Figure 4B:
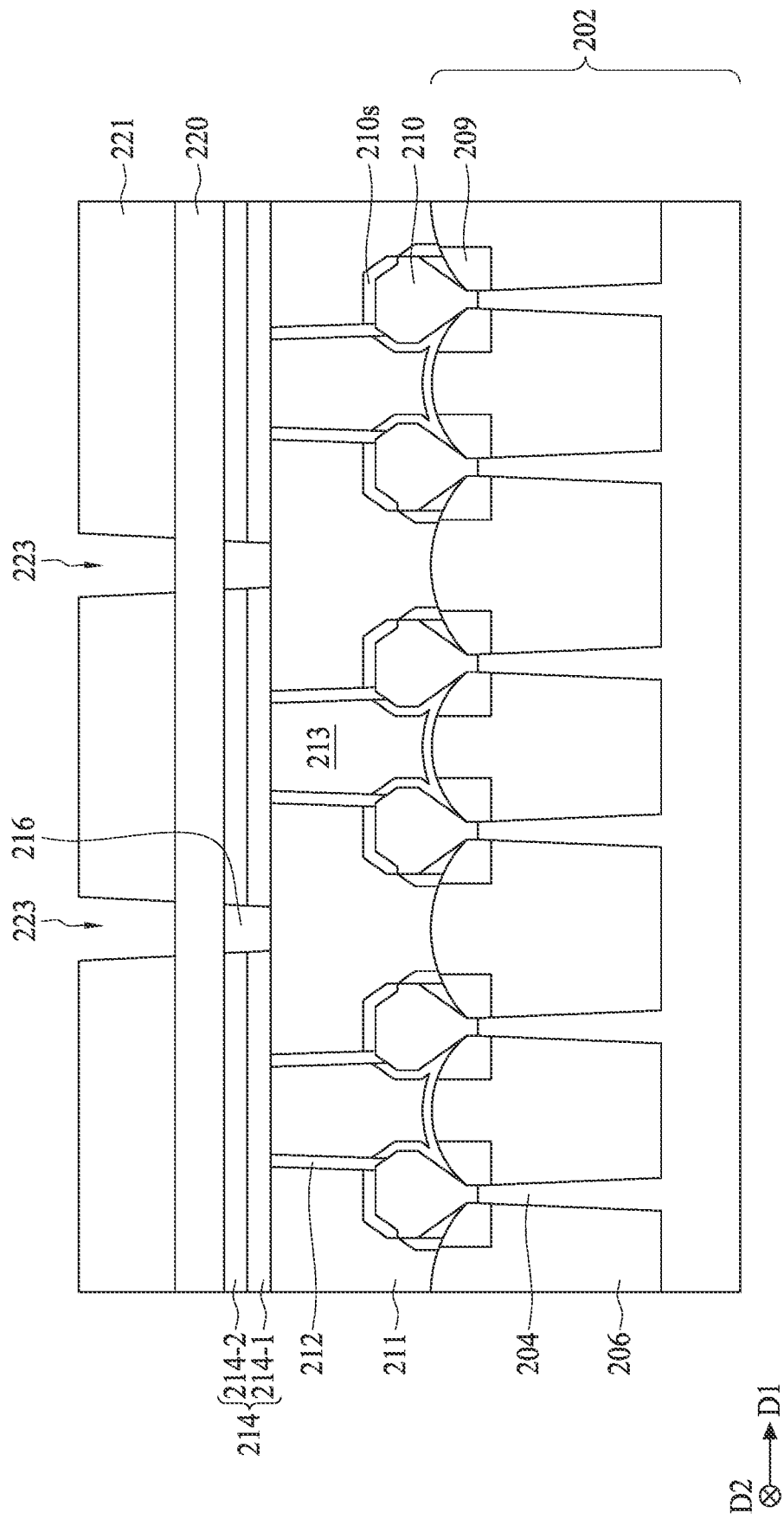
Figure 4C:
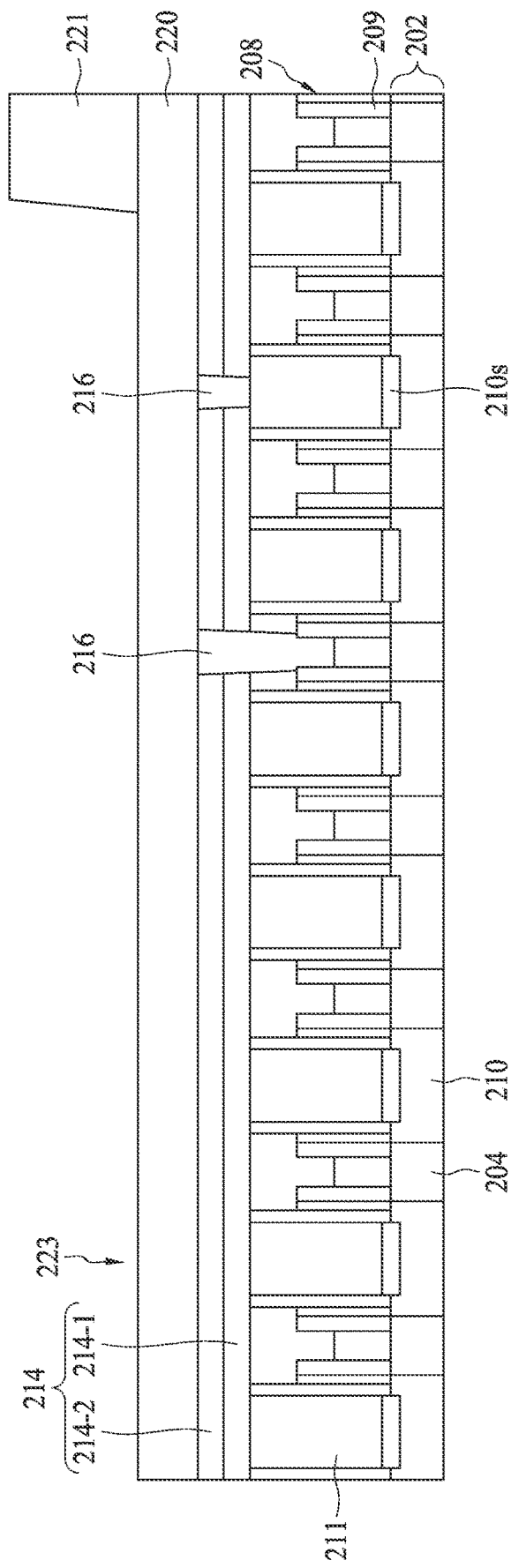

In operation 12, the method 10 forms a trench 225 in the dielectric layer 220. Referring to FIGS. 4A to 4C, in some embodiments, forming the trench 225 includes first forming a patterned masking element 221 over the dielectric layer 220. In some embodiments, the patterned masking element 221 includes a top layer comprising a resist material (e.g., a photoresist layer), a middle layer, and a bottom layer (e.g., an anti-reflective coating). The masking element may be patterned via a series of lithography and etching processes during which the top layer is patterned by being exposed to radiation through a photomask, the exposed top layer is developed to form a patterned resist, and the underlying middle and bottom layers are subsequently etched (by, for example, a dry etching process, a wet etching process, a reactive ion etching (RIE) process, or combinations thereof) using the patterned resist as a mask to form the patterned masking element 221. In the present embodiments, the patterned masking element 221 includes a plurality of openings 223 configured to define a dimension and location of the trench 225 to be formed in the dielectric layer 220. Accordingly, portions of the dielectric layer 220 are exposed though the openings 223.

Figure 5A:
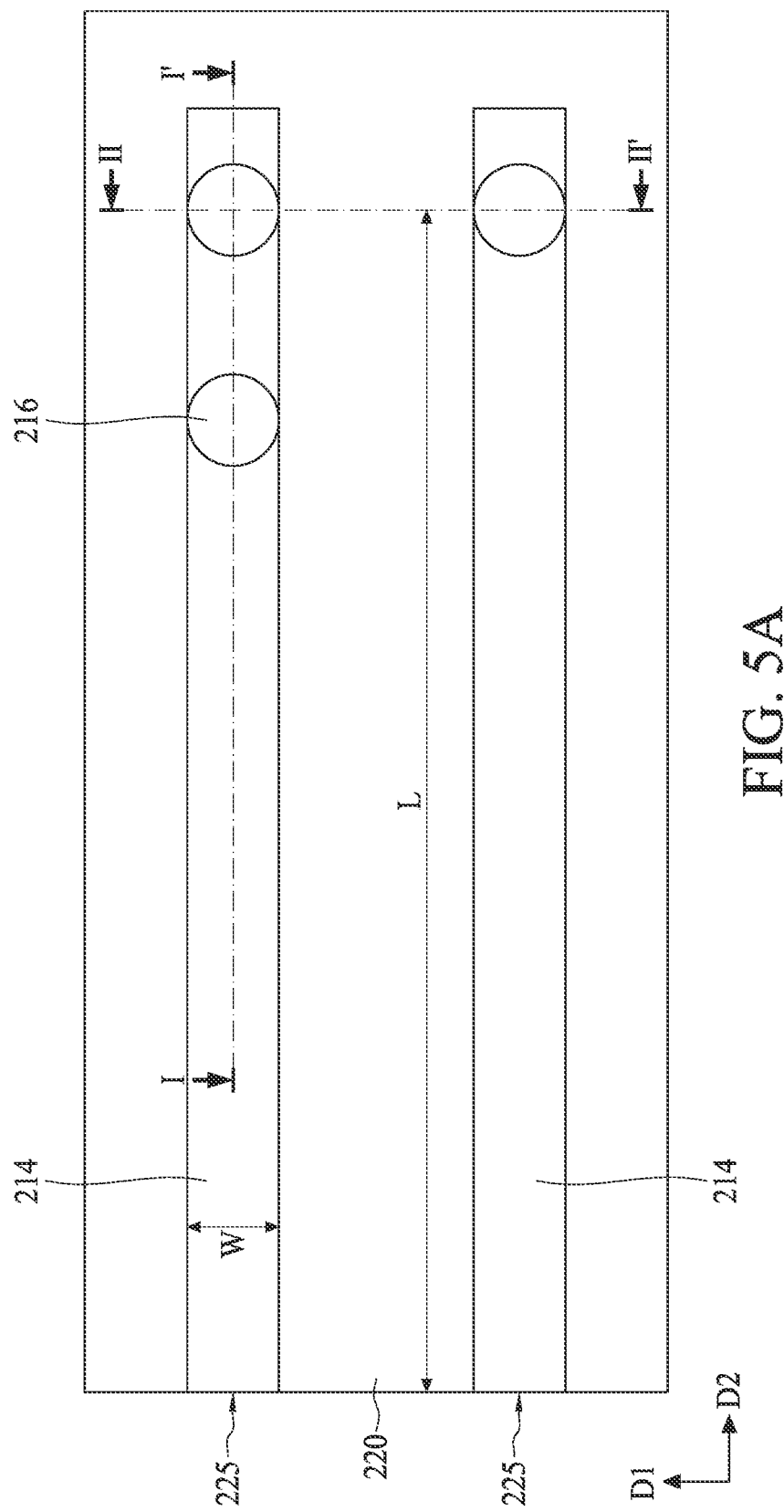
Figure 5B:
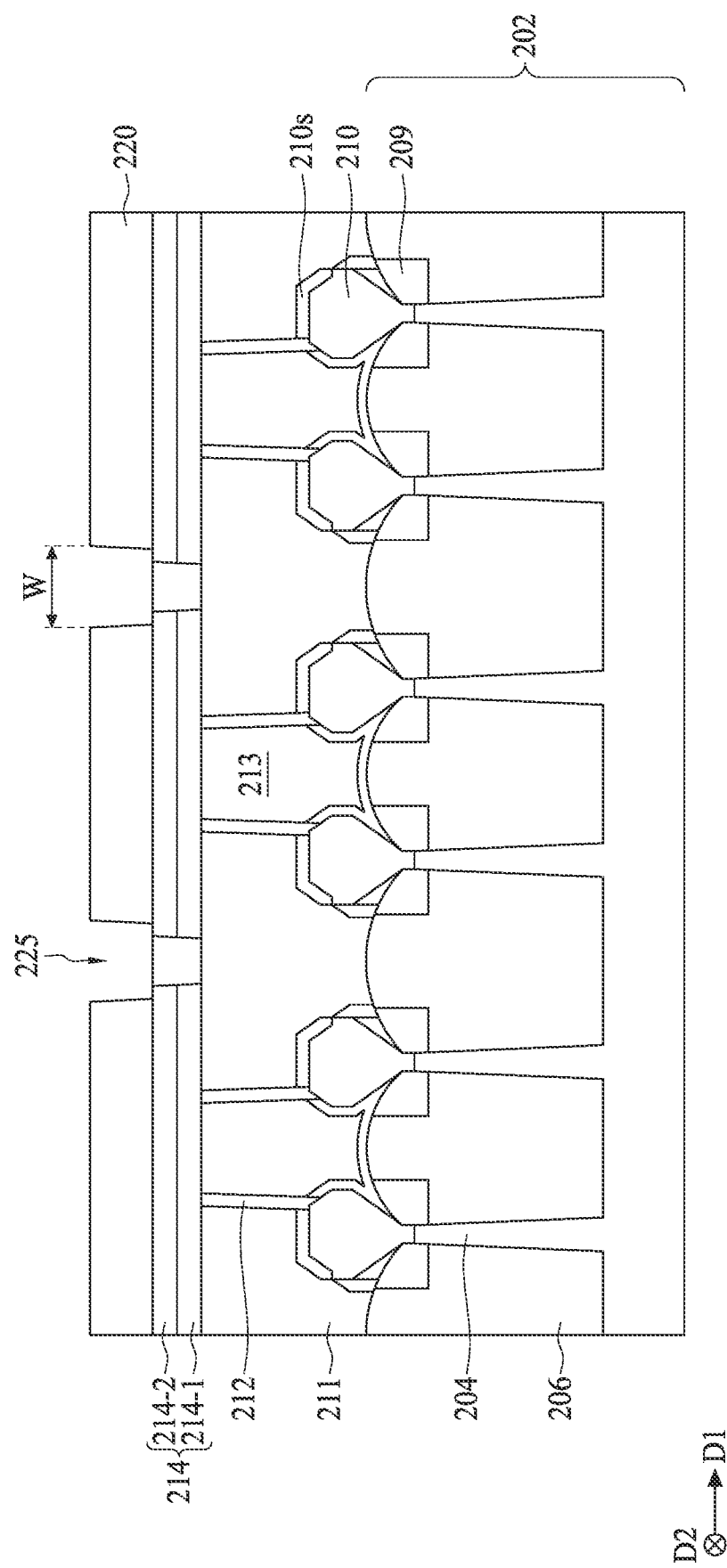
Figure 5C:
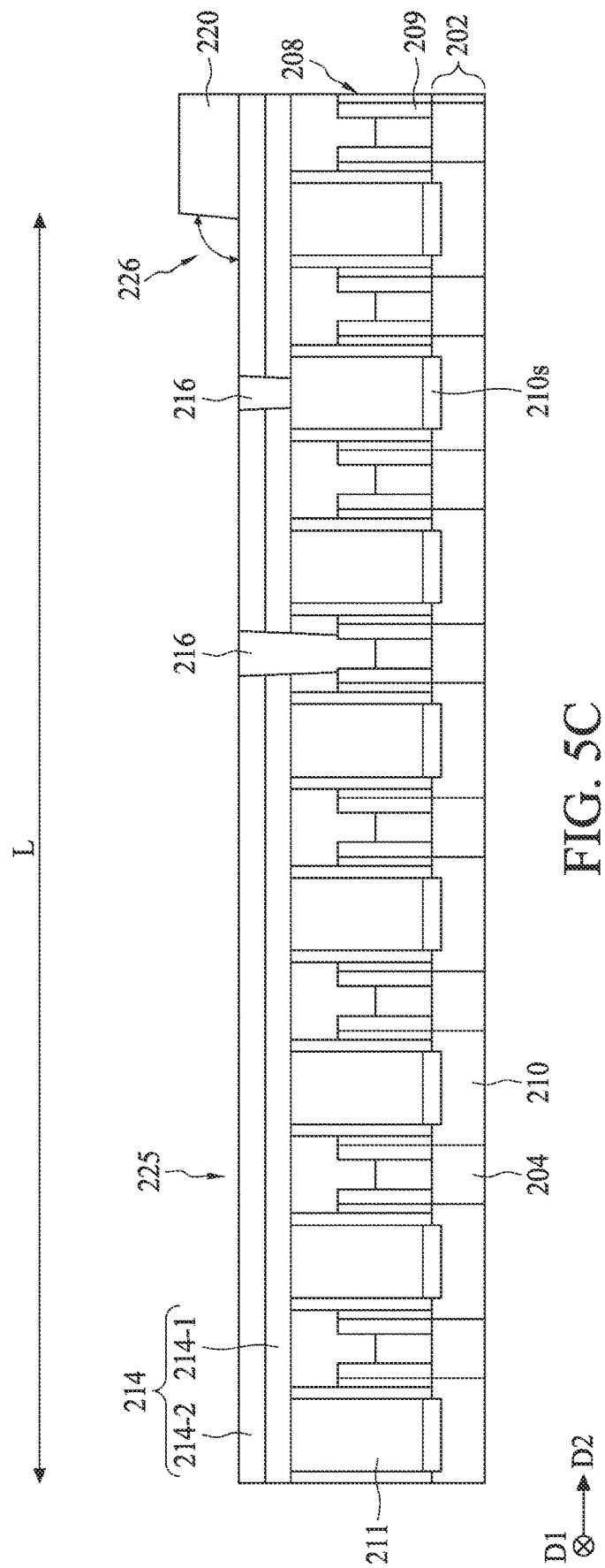

Referring to FIGS. 5A to 5C, the portions of the dielectric layer 220 exposed through the openings 223 of the patterned masking element 221 are removed by one or more suitable etching process, such as a dry etching process, a wet etching process, an RIE process, or combinations thereof, thereby forming one or more trenches 225 in the dielectric layer 220. The patterned masking element 221 is then removed after the forming of the trenches 225 by a suitable method, such as plasma ashing and/or resist stripping. In the present embodiments, the trenches 225 are configured to expose a top surface of each connecting via 216 and the dielectric layer 214 (i.e., the second etch stop layer 214-2), and further define sidewalls of the dielectric layer 220. Due to factors such as uneven etchant loading while forming the trench 225, an opening of a bottom portion of the trench 225 (for example, a length of the trench 225 defined along the direction D2) is less than an opening of a top portion of the trench 225, i.e., the trench 225 is configured with an inverted trapezoidal profile, as shown in FIG. 5C. In other words, an included angle 226 of the trench 225 as shown in FIG. 5C is greater than about 90°, i.e., the included angle 226 is an obtuse angle.

In some embodiments, still referring to FIGS. 5A to 5C, a length L of the trench 225 defined along the direction D2 is greater than a width W of the trench 225 defined along the direction D1, though the present disclosure does not limit the length L or the width W to any particular dimensions. Notably, in the present embodiments, the width W corresponds to a width of a subsequently-formed metallization feature in the trench 225 along the direction D1, while the length L is greater than a length of such metallization feature along the direction D2. In other words, a metallization line subsequently formed in the trench 225 further undergoes a cutting (or etching) process to define multiple metallization features of desired dimension (i.e., length) and locations. In contrast, existing implementations generally form metallization features by directly patterning the dielectric layer 220 to form openings with the desired final dimensions (i.e., both length and width) for the metallization features, and subsequently filling the openings with a conductive material to form the metallization features. In some instances, filling such small openings may introduce unwanted voids, which adversely affects performance of the device. Embodiments provided herein may circumvent such shortcomings by first forming a metallization line in a trench configured to have a greater length than a final length of each metallization feature, thereby reducing the formation of voids, and subsequently segmenting (and isolating) the metallization line to multiple portions that correspond to the final lengths of the metallization features.

Figure 6A:
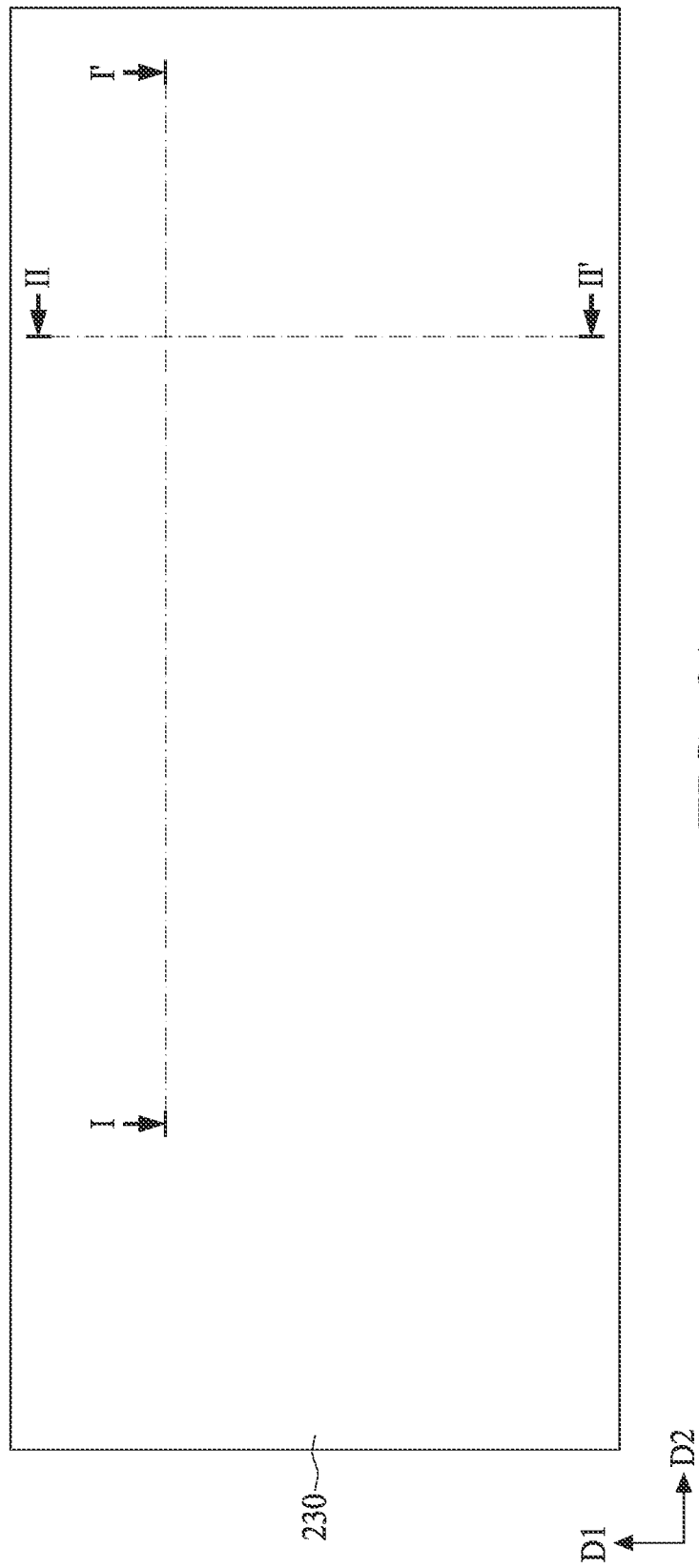
Figure 6B:
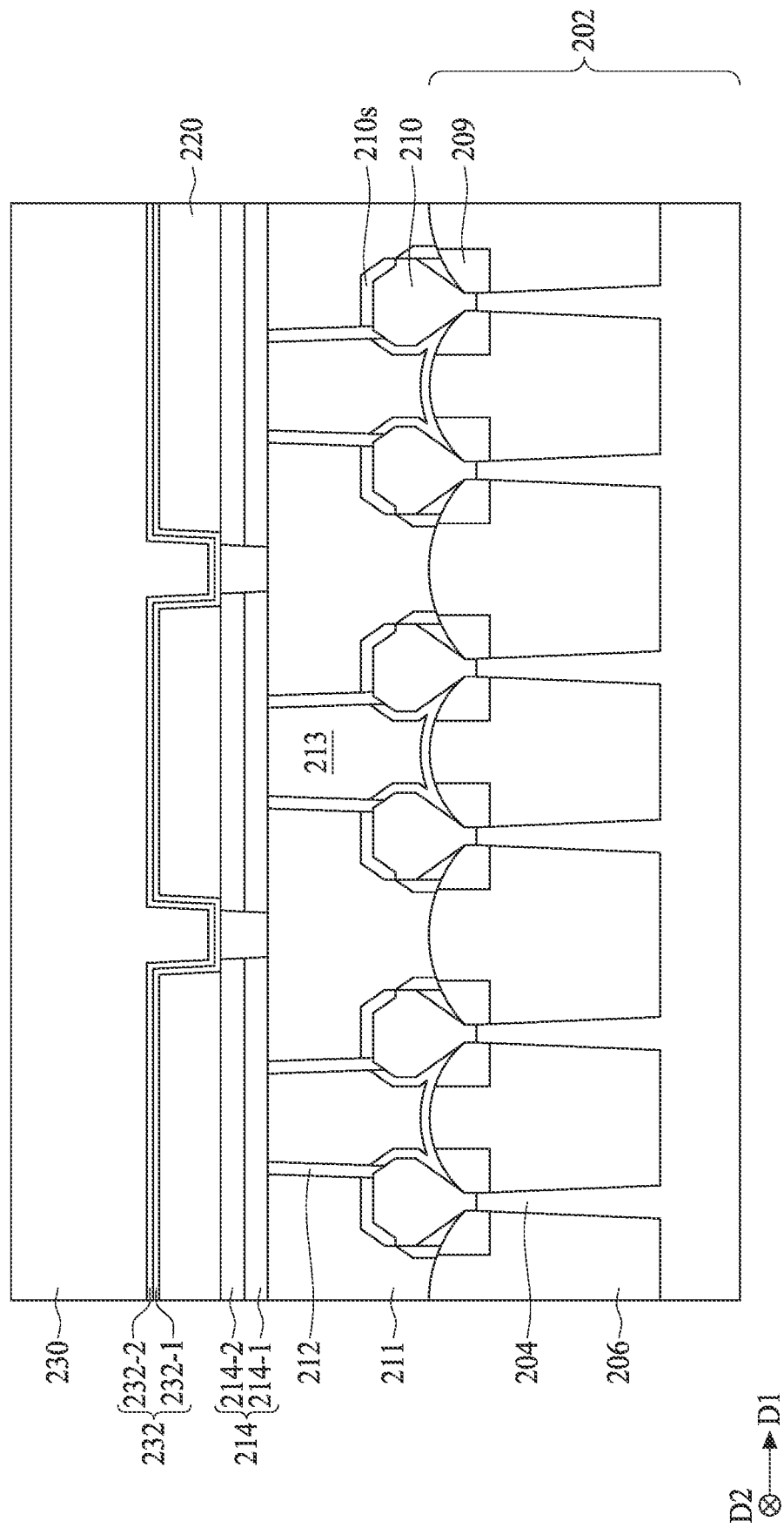
Figure 6C:
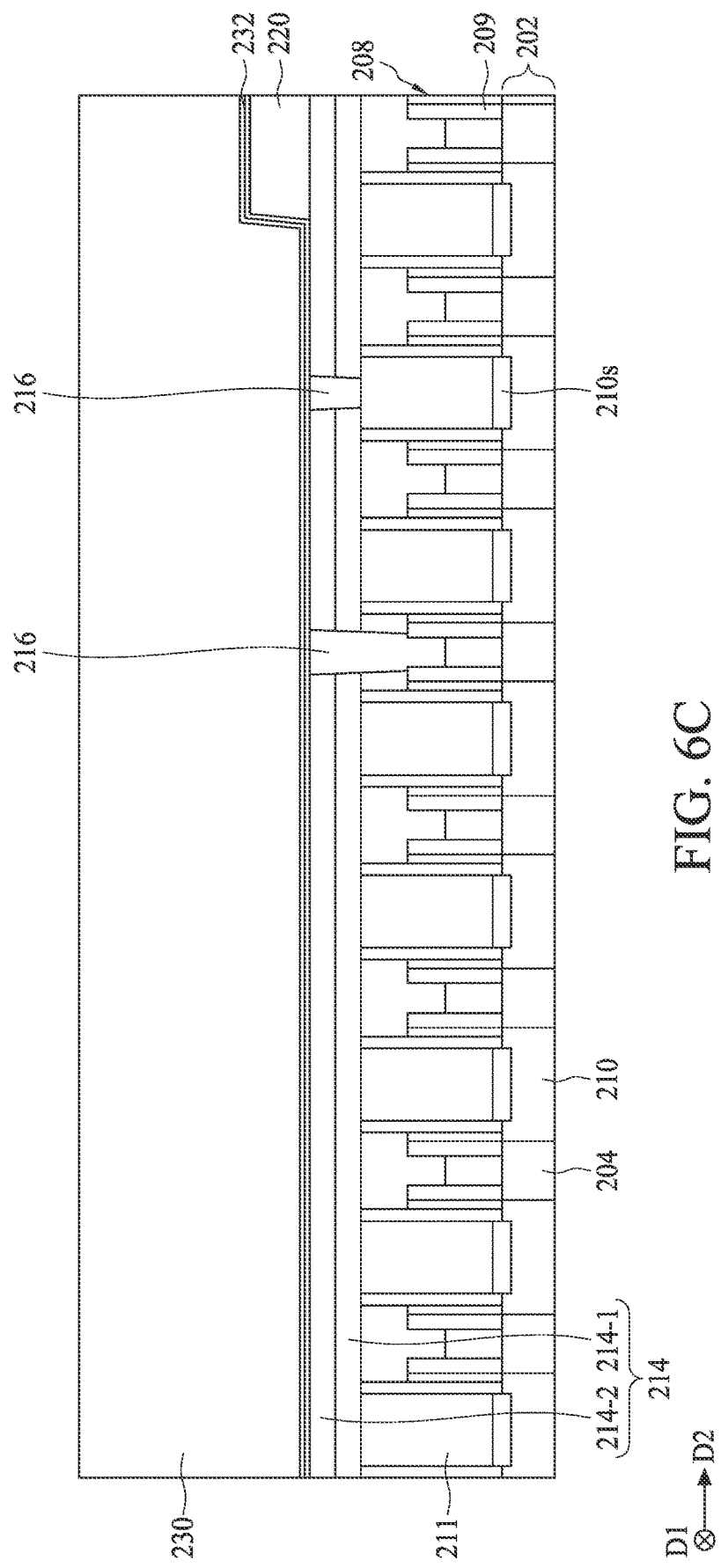

In operation 13, the method 10 fills the trench 225 to form a metallization line (or a metal layer) 234 in the dielectric layer 220. Referring to FIGS. 6A to 6C, in the present embodiments, the trenches 225 are filled with a conductive material 230 including, for example, Co, W, Ru, Al, Mo, Ti, Cu, other suitable conductive materials, or combinations thereof. In some embodiments, the conductive material 230 is the same as the composition of bulk conductive layer of the connecting via 216. The conductive material 230 may be formed by any suitable deposition process including, for example, chemical vapor deposition (CVD), physical vapor deposition (PVD), atomic layer deposition (ALD), electroplating, other suitable processes, or combinations thereof. In the present embodiments, the metallization line 234 is configured with an inverted trapezoidal shape according to the profile of the trench 225 discussed in detail above.

In some embodiments, a barrier layer 232 is formed in the trench 225 prior to the depositing of the conductive material 230. In some embodiments, the barrier layer 232 includes Ti, TiN, Ta, TaN, W, WN, other suitable materials, or combinations thereof. The barrier layer 232 may be formed by any suitable method, such as CVD, ALD, PVD, other methods, or combinations thereof. A thickness of the barrier layer 232 may be approximately 0.5 nanometer to approximately 10 nanometers, but the disclosure is not limited thereto. The barrier layer 232 may be a single-layered structure, or, alternatively, a multi-layered structure. For example, the barrier layer 232 may include a sub-barrier layer 232-1 and a sub-barrier layer 232-2 (both shown in FIG. 12). In such embodiments, the sub-barrier layer 232-1 and the sub-barrier layer 232-2 include different materials. A thickness of the sub-barrier layer 232-1 may be approximately 0.5 nanometer to approximately 10 nanometers, and a thickness of the sub-barrier layer 232-2 may be approximately 0.5 nanometer to approximately 10 nanometers, but the disclosure is not limited thereto.

Figure 7A:
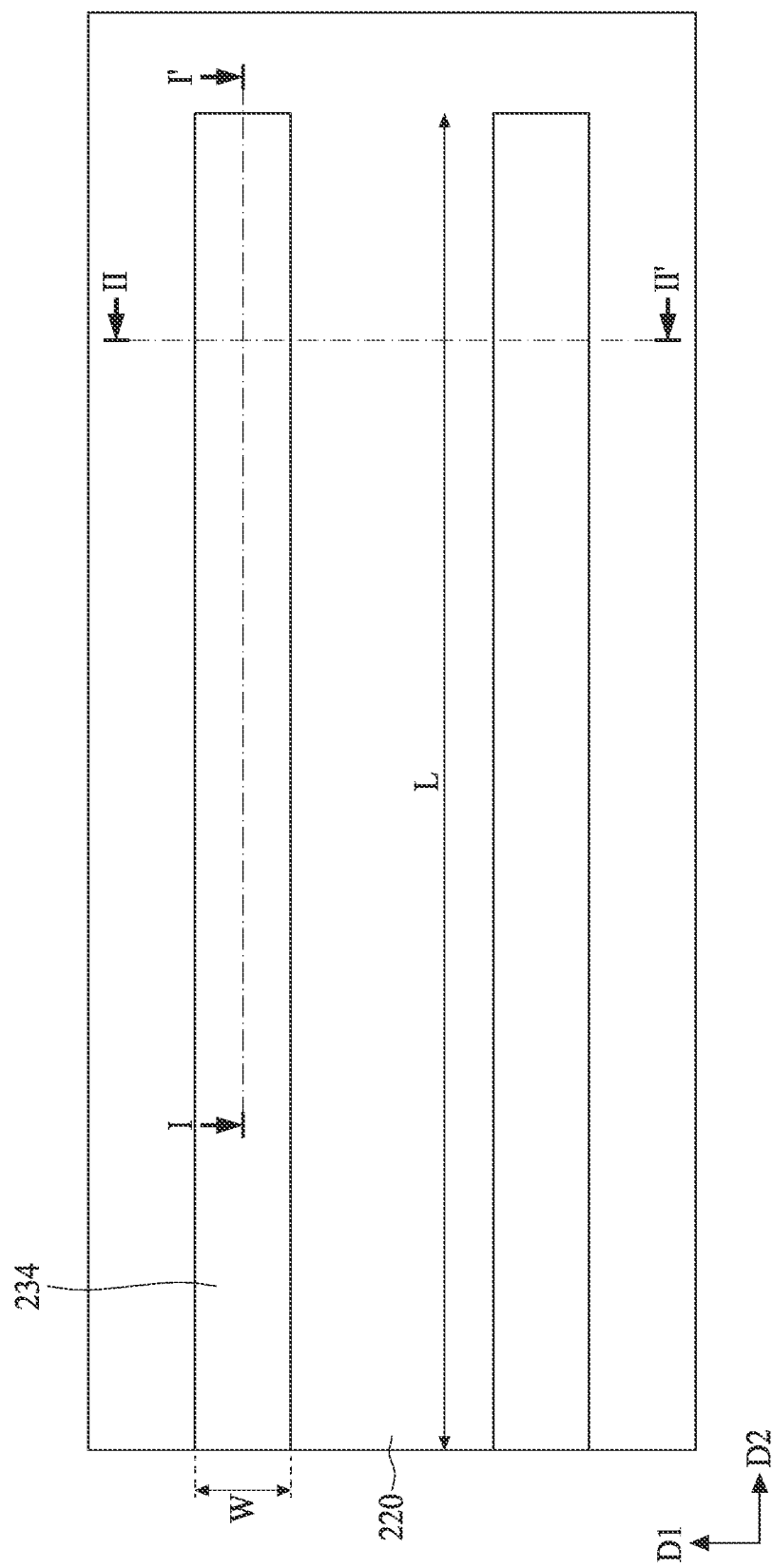
Figure 7B:
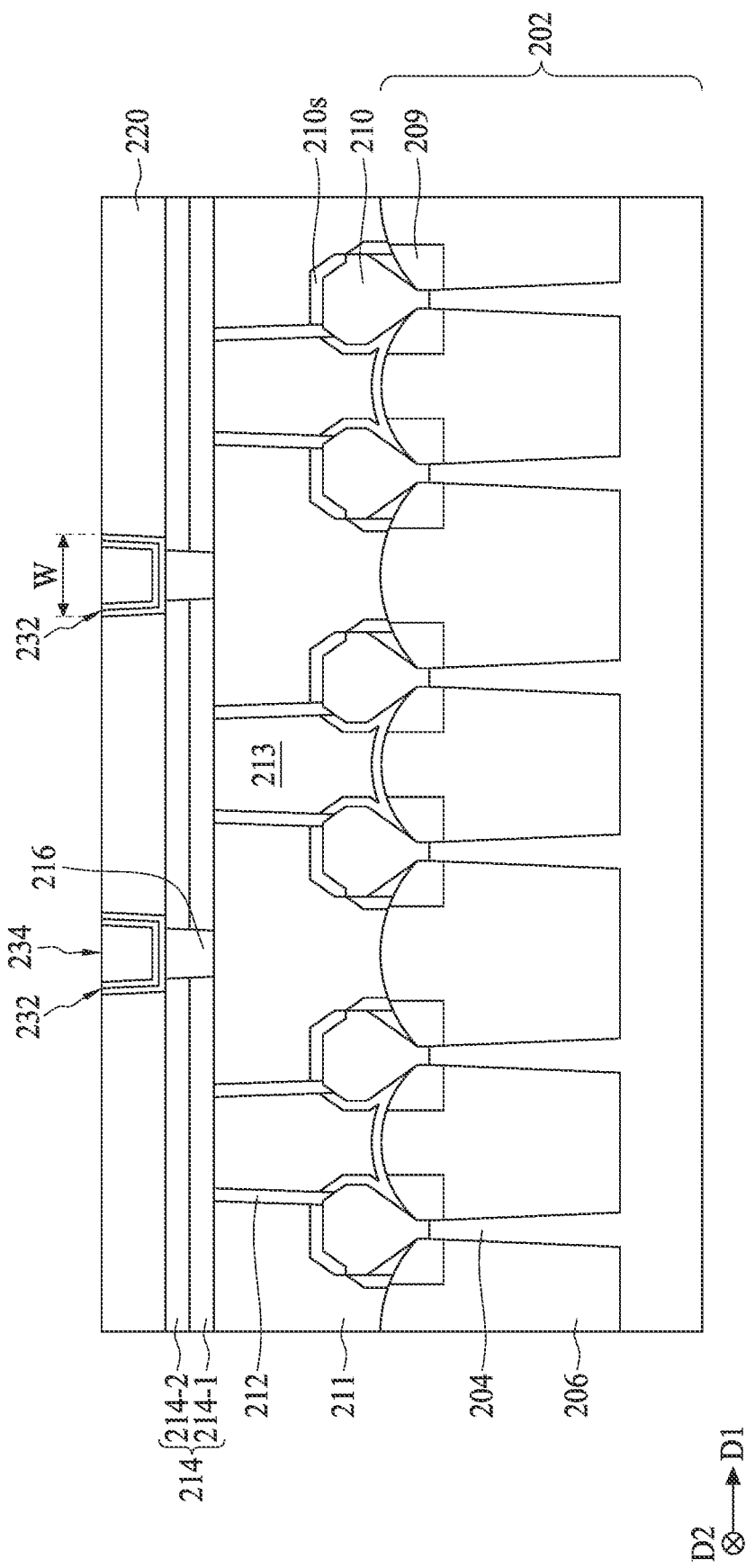
Figure 7C:
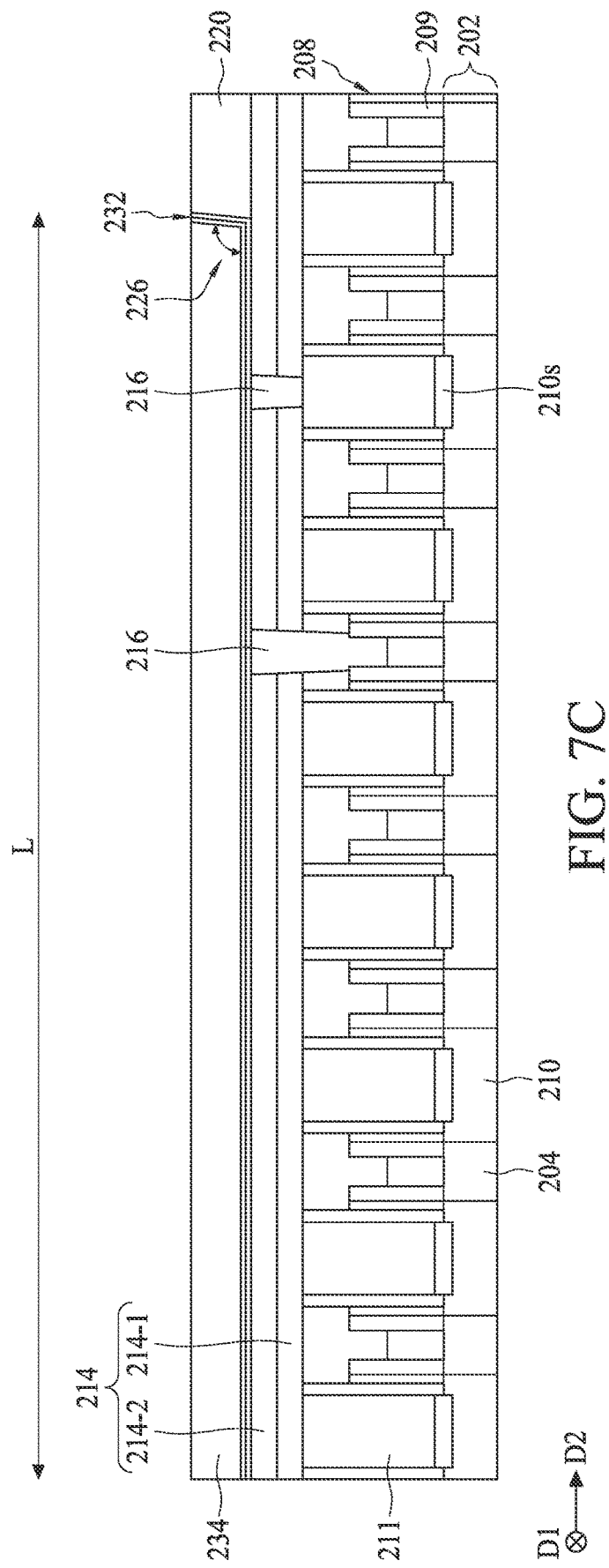

Referring to FIGS. 7A to 7C, the method 10 removes any superfluous materials from a top surface of the dielectric layer 220 in a CMP operation. Accordingly, portions of the conductive material 230 and portions of the barrier layer 232 are removed to obtain a metallization line 234 in the dielectric layer 220. As shown in FIGS. 7A and 7C, the metallization line 234 extends along the direction D2. In some embodiments, a width of the metallization line 234, i.e., the width W defined previously, is greater than a width of the connecting via 216, as shown in FIG. 7B, to ensure that the metallization line 234 is in contact with the connecting via 216 and is thus electrically connected to the FEOL devices formed over the semiconductor substrate 202. In the present embodiments, the metallization line 234 includes a plurality of bottom corners, and each of the bottom corners is defined by the included angle 226 defined previously. Accordingly, in the present embodiments, the included angle 226 of the bottom corners of the metallization line 234 is greater than 90°, i.e., an obtuse angle.

Figure 8A:
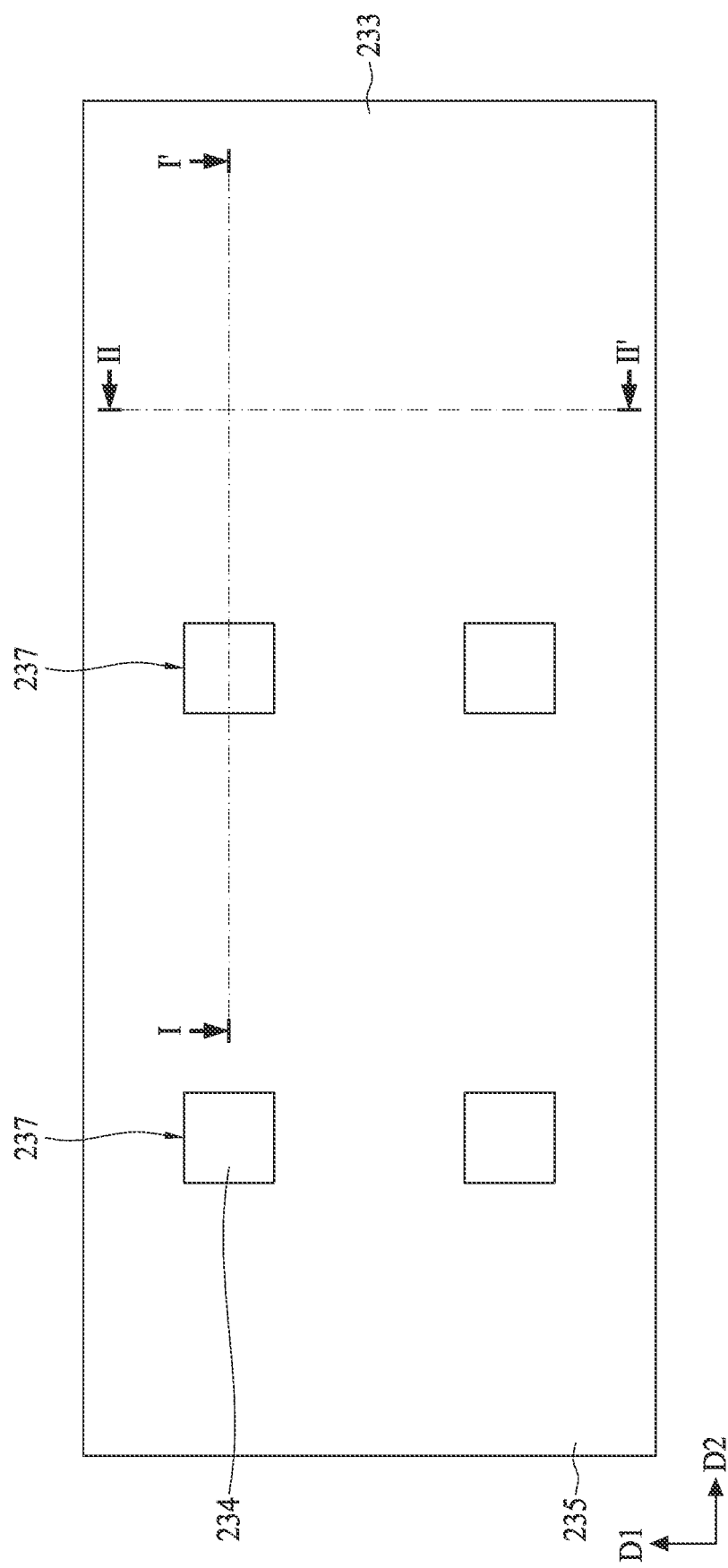
Figure 8B:
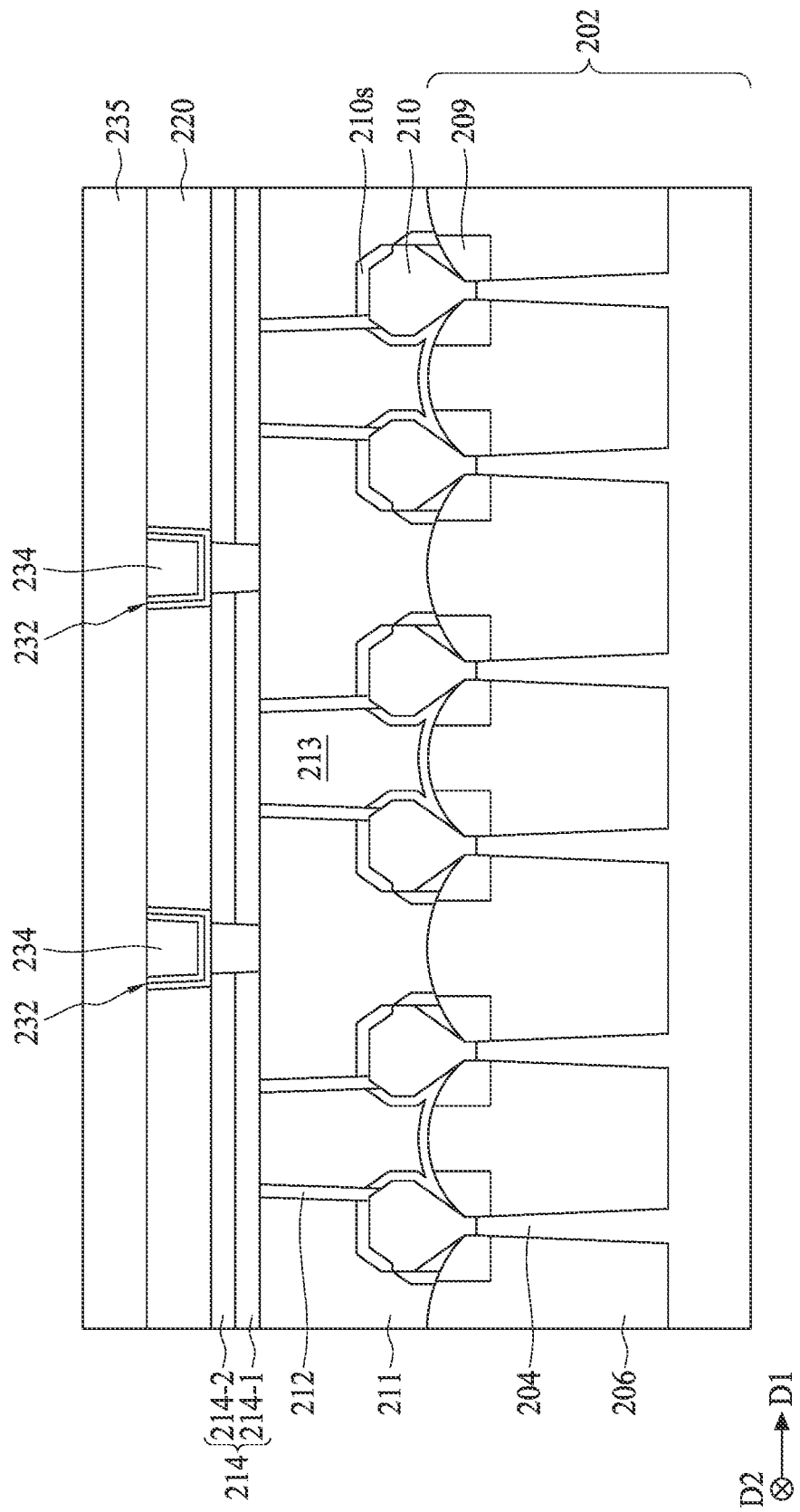
Figure 8C:
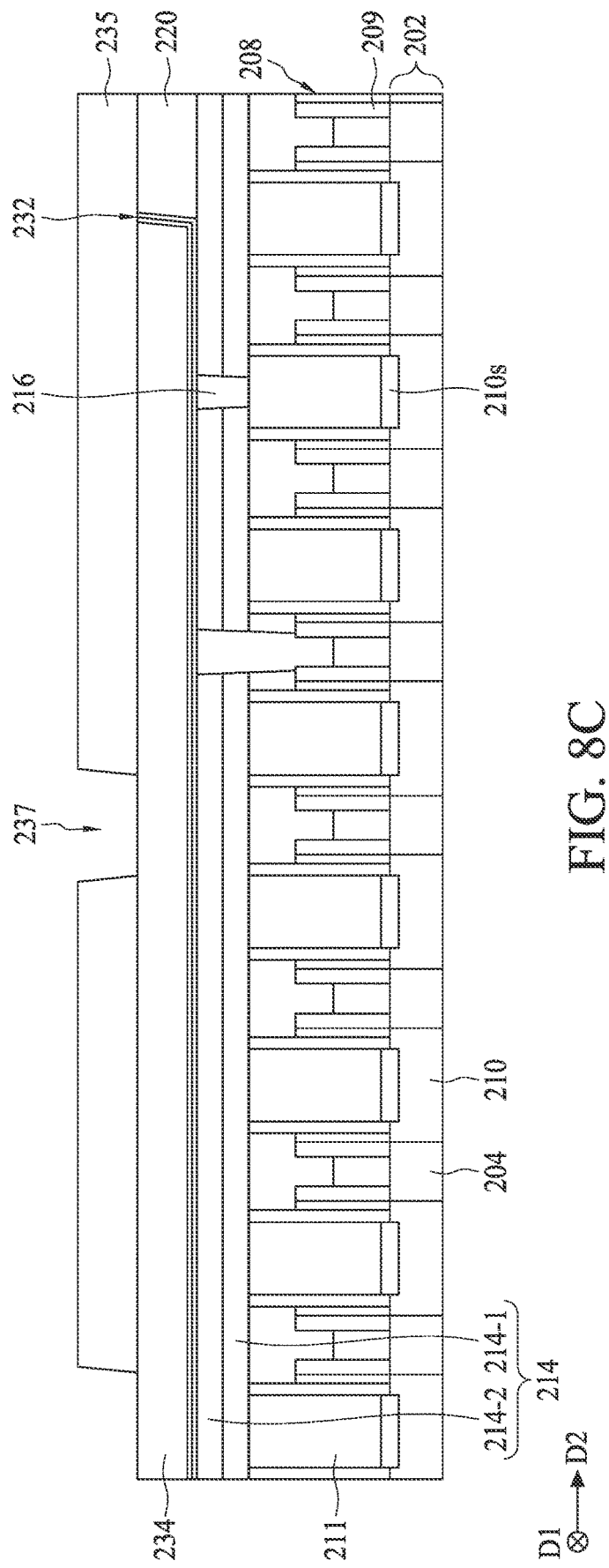

In operation 14, the method 10 segments (or separates) the metallization line 234 to form at least a metallization feature 240a and a metallization feature 240b, disposed adjacent to each other and oriented lengthwise along the direction D2. In the present embodiments, the metallization feature 240a and the metallization feature 240b are separated from each other by a recess 241 defined by the metallization line 234 and the dielectric layer 220 (shown in FIGS. 9A to 9C). Referring to FIGS. 8A to 8C, in the present embodiments, a patterned masking element 235 is formed over the semiconductor substrate 202 and includes a plurality of openings 237 for defining dimensions and locations of recesses 241 to be formed. In some embodiments, the patterned masking element 235 is similar to the patterned masking element 221 in terms of structure and method of processing. In the present embodiment, portions of the metallization line 234 are exposed through the openings 237. In the depicted embodiments, a length of a portion of the metallization line 234 disposed under the patterned masking element 235 corresponds to a length of the subsequently-formed metallization feature 240a or 240b, where a width of each of the metallization features 240a and 240b has been previously defined as the width W.

Figure 9A:
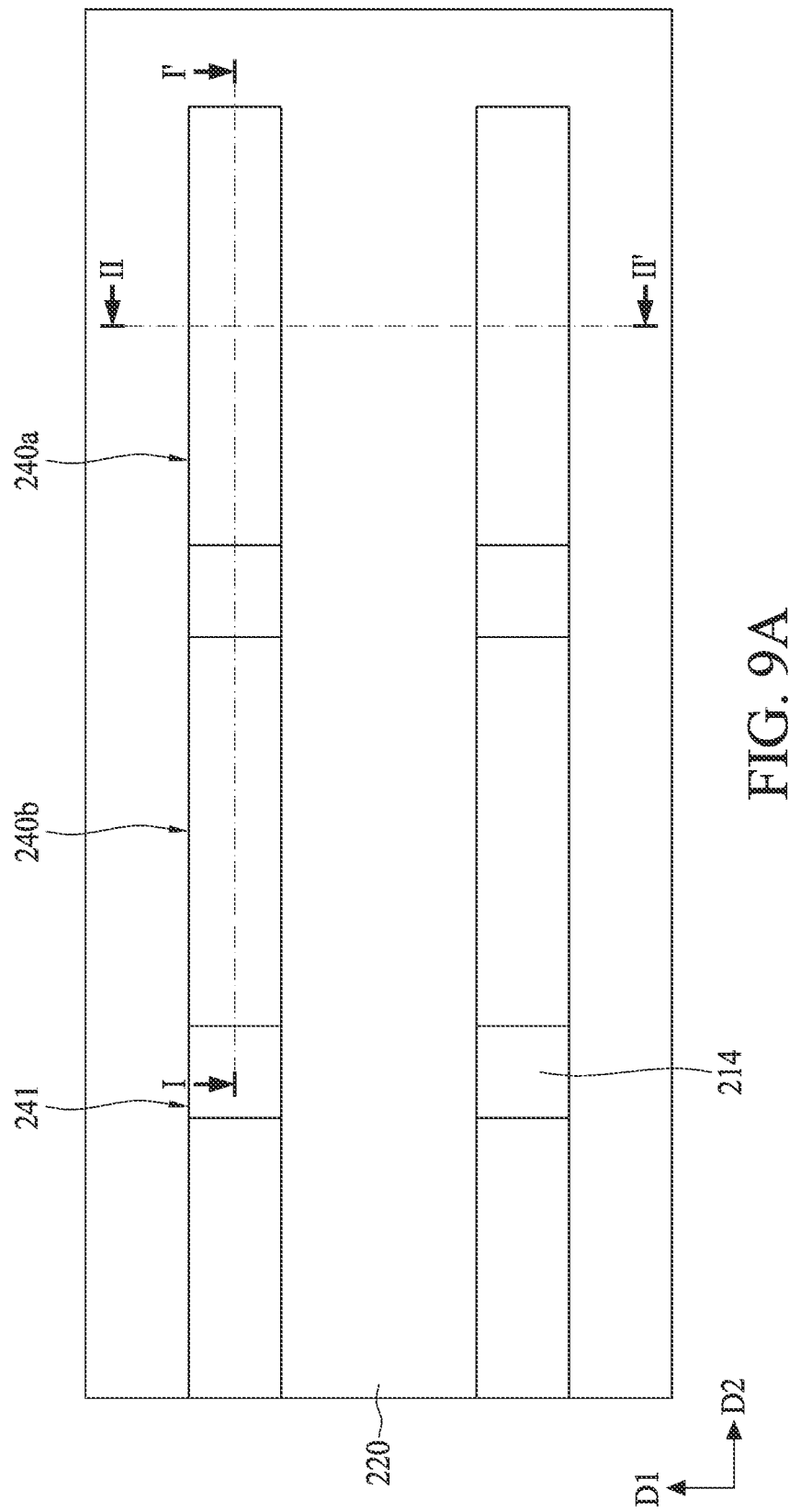
Figure 9B:
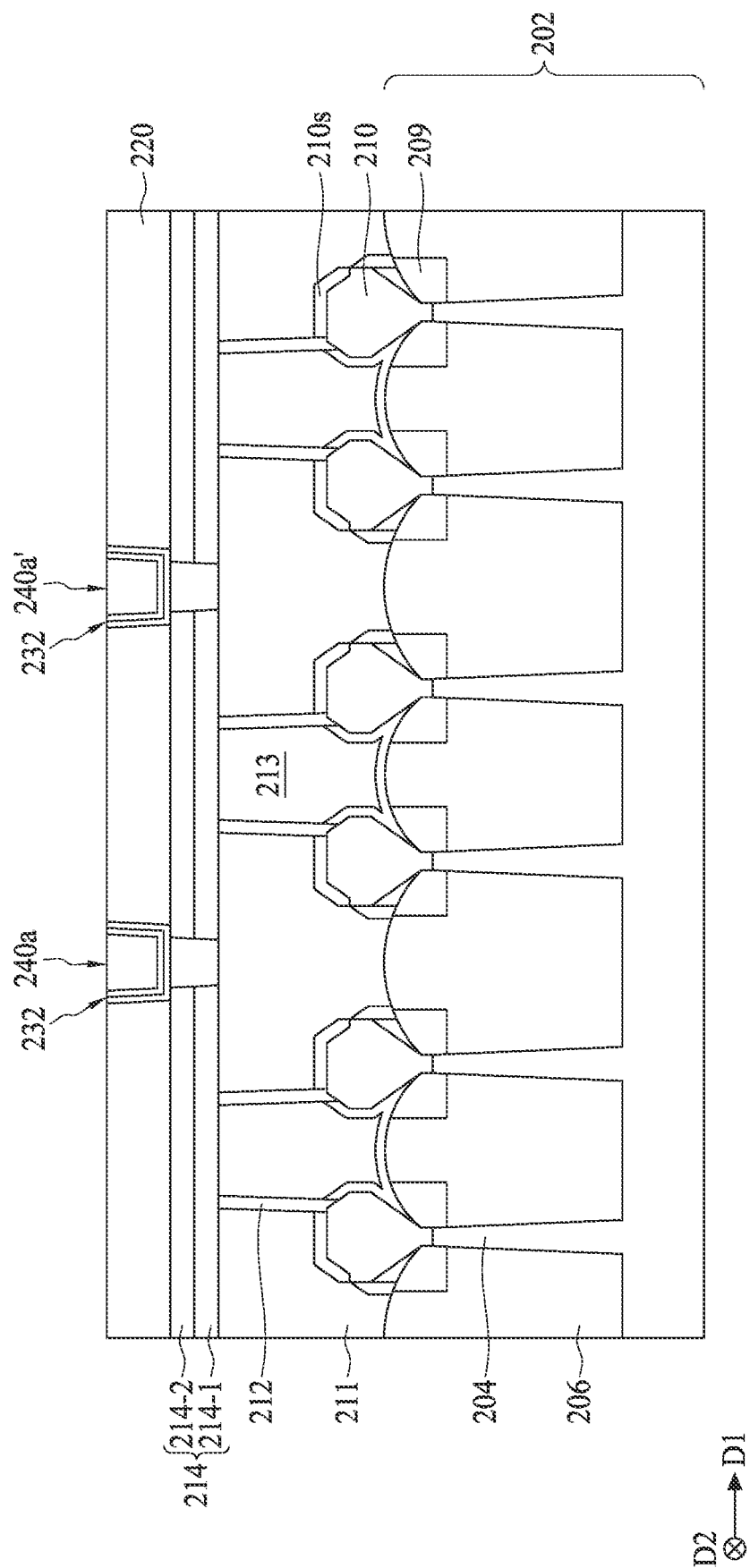
Figure 9C:
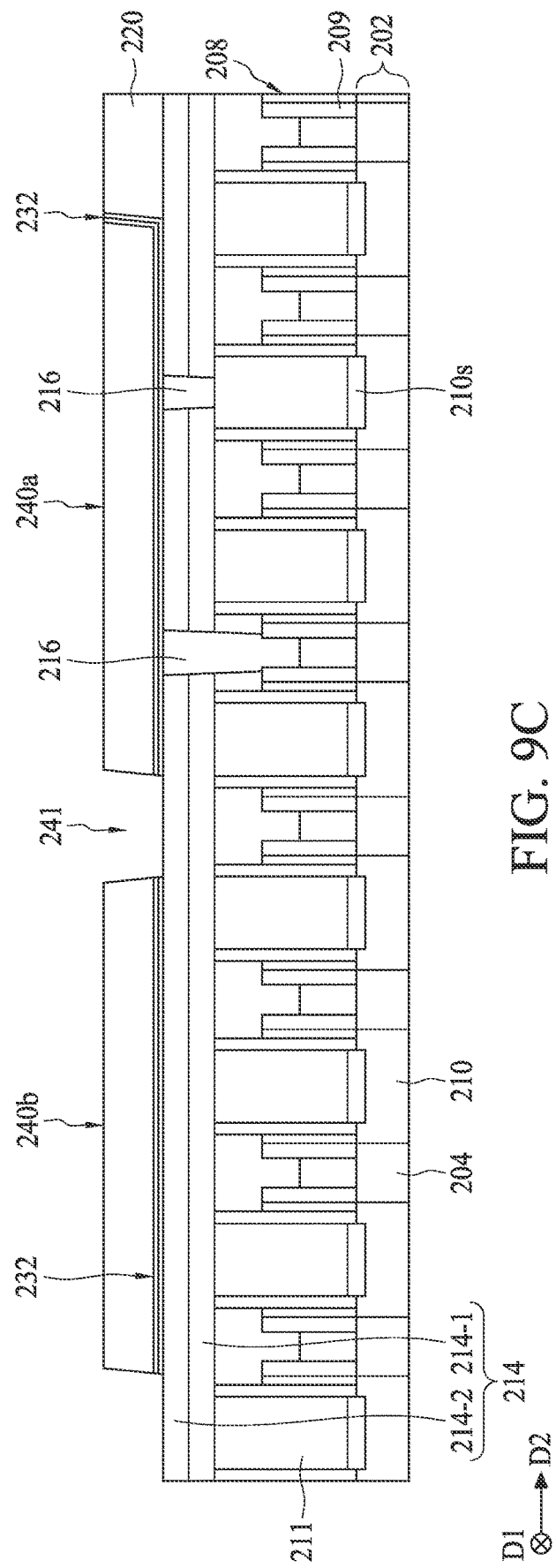

Referring to FIGS. 9A to 9C, the method 10 performs an etching operation, such as a dry etching process, a wet etching process, an RIE process, or combinations thereof, to remove the portions of the metallization line 234 exposed through the patterned masking element 235, resulting in one or more recesses 241. In the present embodiments, the recesses 241 are formed to segment (or separate) the metallization line 234 into at least the metallization features 240a and 240b. In the present embodiments, the recesses 241 expose portions of the dielectric layer 214. In some embodiments, because the metallization features 240a and 240b are formed by etching the metallization line 234, geometric profiles of the metallization features 240a and 240b may be different from each other, the details of which are discussed below. After segmenting the metallization line 234, the patterned masking element 235 is removed from the structure 200 by a suitable method, such as plasma ashing and/or resist stripping.

Figure 10A:
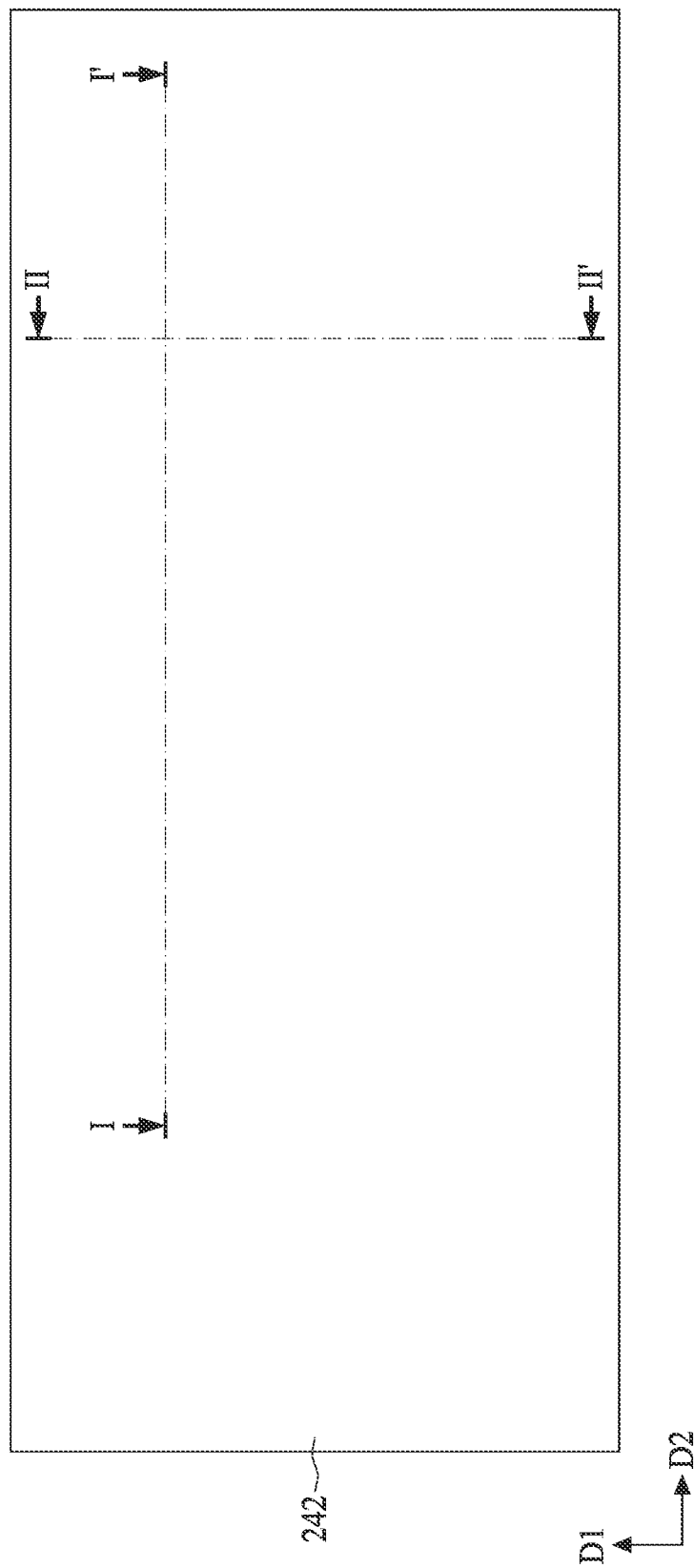
Figure 10B:
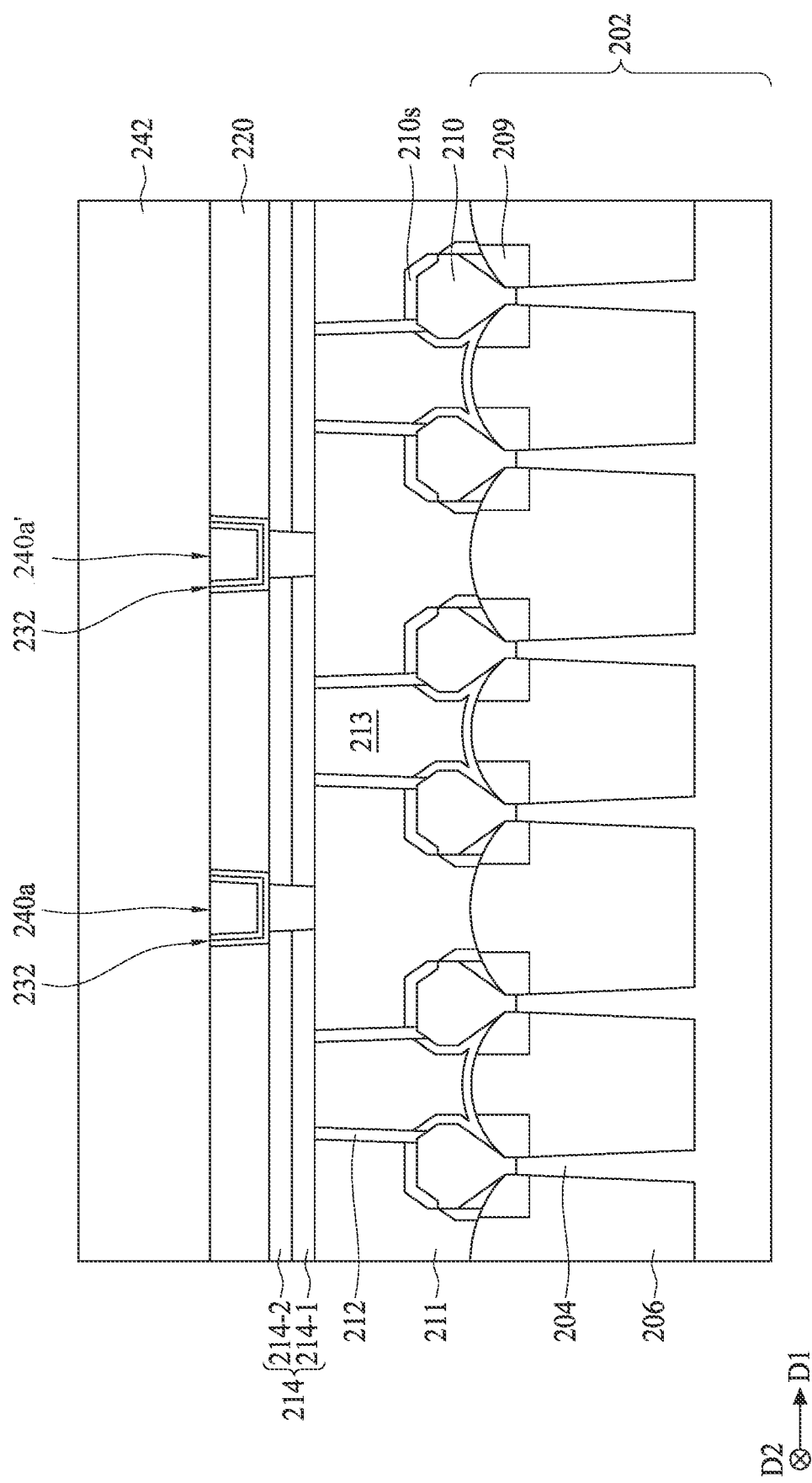
Figure 10C:
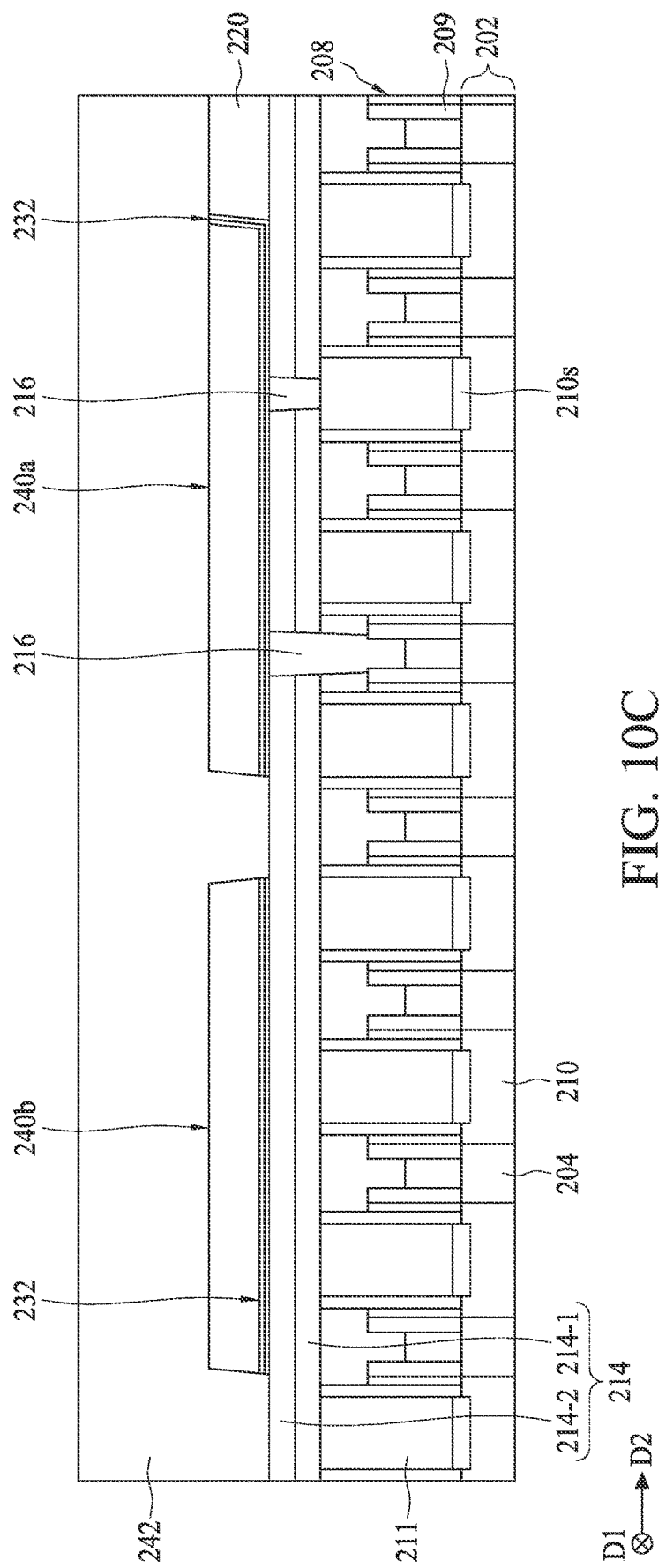

In operation 15, the method 10 fills the recesses 241 with a dielectric material 242. Referring to FIGS. 10A to 10C, in the present embodiments, the dielectric material 242 is formed to fill the recesses 241 and may cover top surfaces of the metallization features 240a and 240b and the dielectric layer 220. The dielectric material 242 may be referred to as an IMD layer. The dielectric material 242 may include, for example, silicon oxide, TEOS, PSG, BPSG, low-k dielectric material (examples provided above), another suitable dielectric material, or a combination thereof. In some embodiments, the dielectric material 242 and the dielectric layer 220 include different materials. In some embodiments, the dielectric material 242 and the dielectric layer 220 include the same material.

Figure 11A:
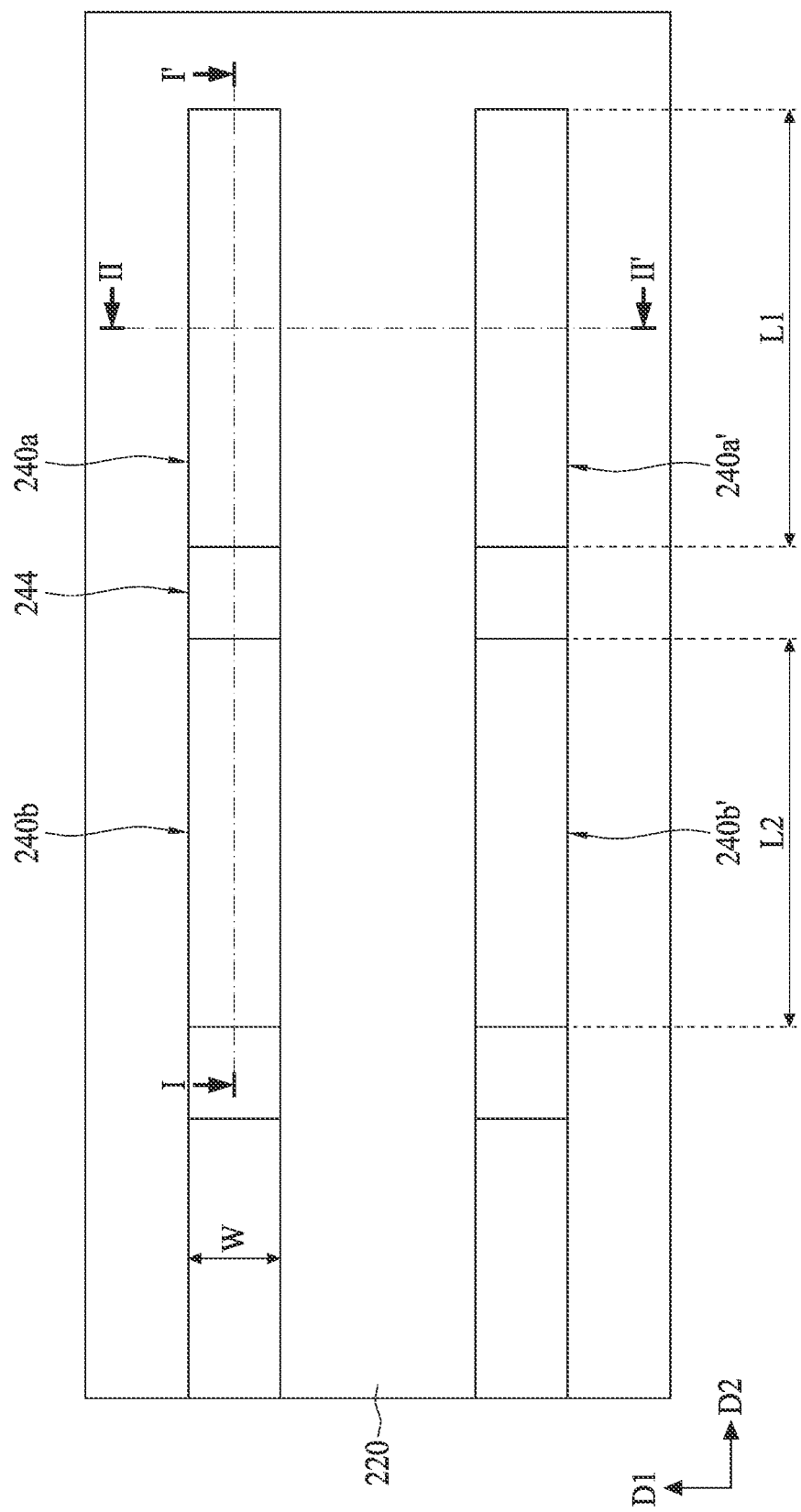
Figure 11B:
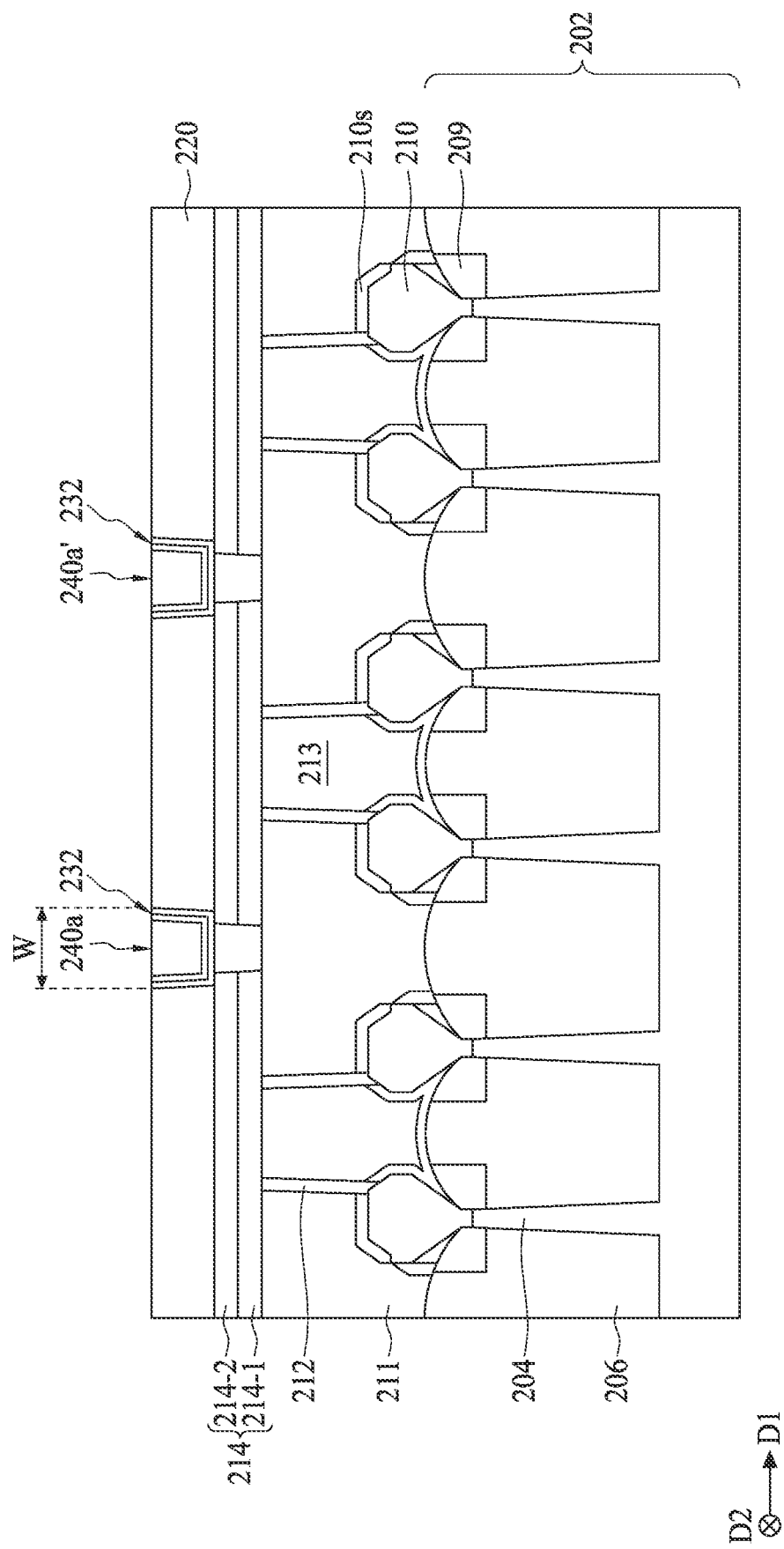
Figure 11C:
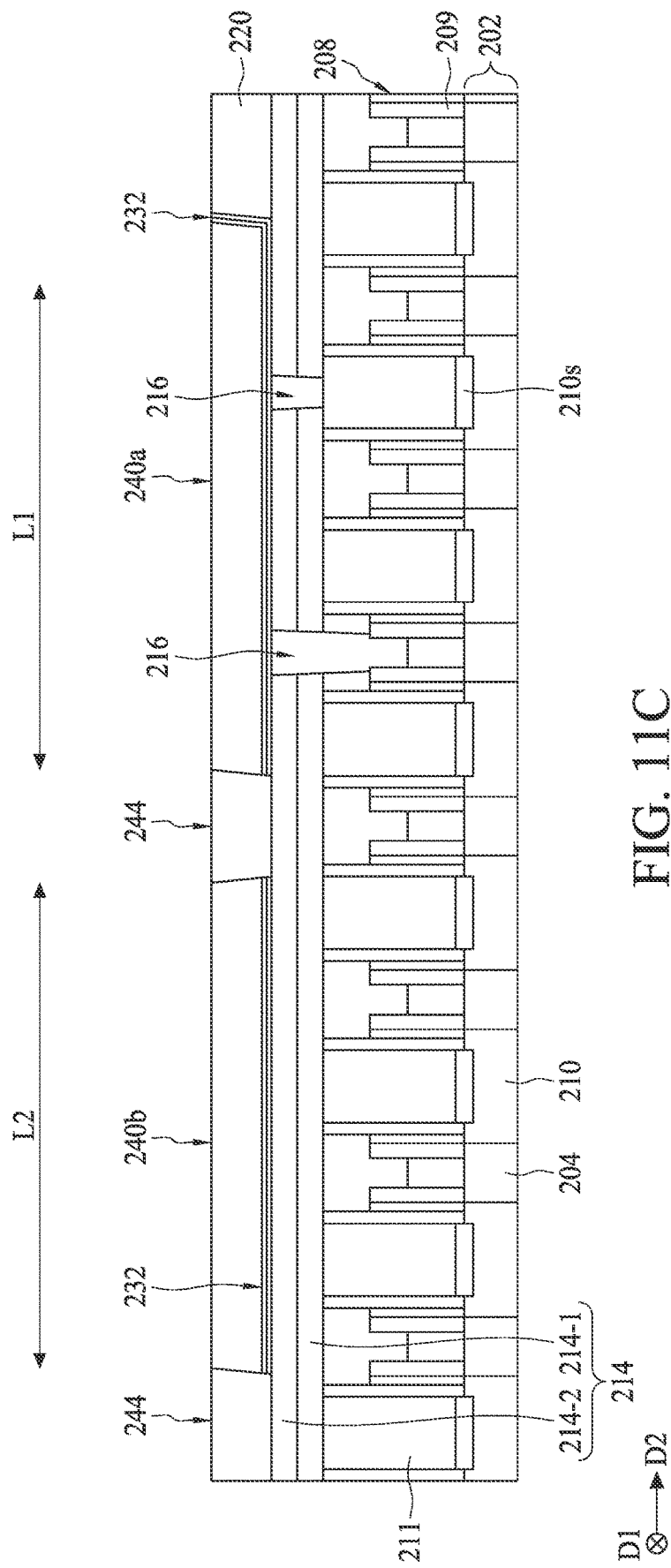

Referring to FIGS. 11A to 11C, in the present embodiments, the method 10 removes superfluous dielectric material 242 by a planarization process, such as a CMP process, thereby forming dielectric features 244 between the metallization features 240*a* and 240*b*. In other words, the metallization feature 240*a* and the metallization feature 240*b* are separated from each other by the dielectric feature 244. For purposes of discussion and not intending to be limiting, metallization features 240*a* and 240*a*' (as well as the metallization features 240*b* and 240*b*') are substantially the same with respect to dimension and geometry and are separated along the direction D1. As depicted herein, when viewed along the direction D2, the metallization feature 240*a* is end-capped by a portion of the dielectric layer 220 and the dielectric feature 244, and the metallization feature 240*b* is end-capped by the dielectric features 244. As shown in FIG. 11C, top surfaces of the metallization features 240*a* and 240*b*, a top surface of the dielectric layer 220, and a top surface of the dielectric feature 244 are substantially aligned with each other, i.e., are substantially co-planar. Accordingly, in the present embodiments, metallization features belonging to different metallization lines 234, such as the metallization features 240*a* and 240*a*' or the metallization features 240*b* and 240*b*', are separated from each other by the dielectric layer 220 along the direction D1. In contrast, metallization features belonging to the same metallization line 234, such as the metallization features 240*a* and 240*b*, are separated from each other by the dielectric features 244. In the depicted embodiments, the metallization feature 240*a* and the metallization feature 240*b* are defined by a length L1 and L2, respectively, along the direction D2, which are both less than the length L of the trench 225 as defined previously.

Figure 12:
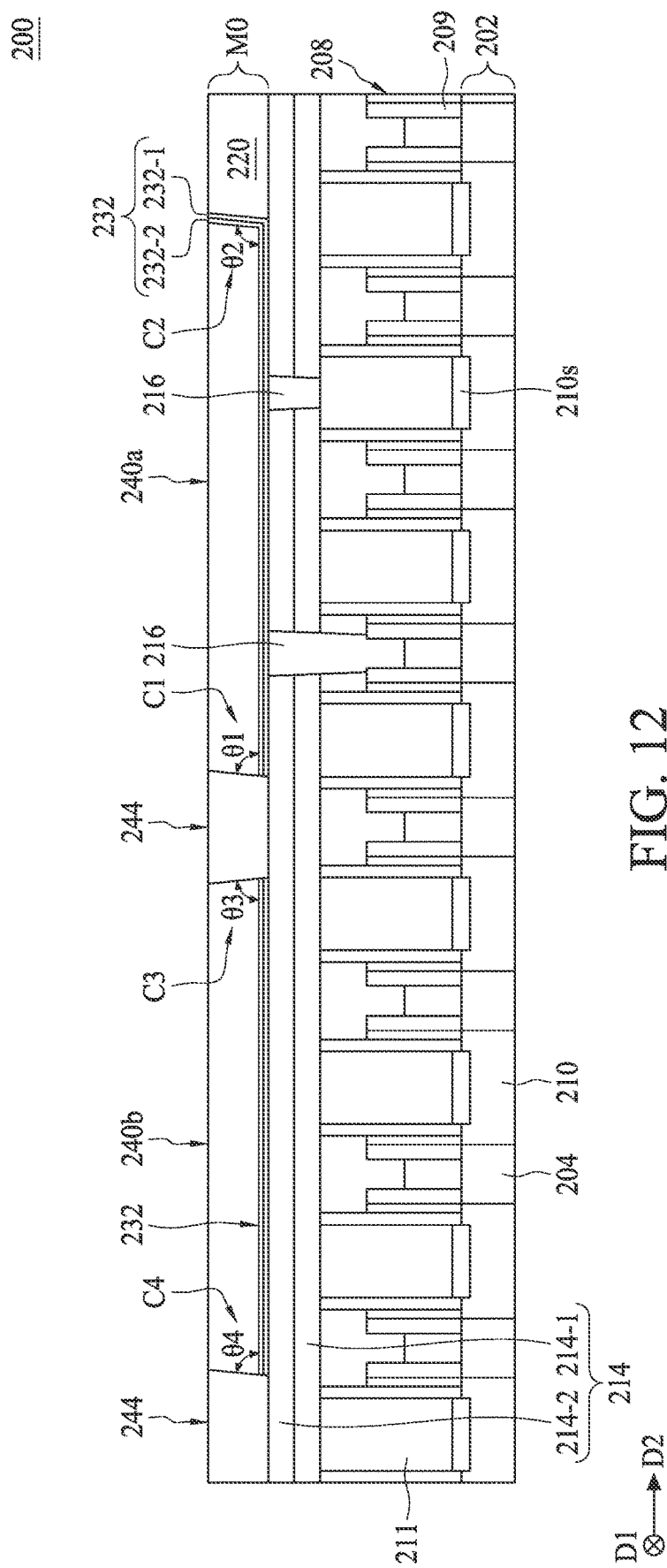
FIG. 12 is a schematic cross-sectional view of the semiconductor structure taken along line I-I' of FIG. 11A according to aspects of one or more embodiments of the present disclosure.

Referring to FIG. 12, which is the same as FIG. 11C but depicted with more details, the structure 200 includes at least a zeroth metal layer M0 formed by the method 10, where the metal layer M0 includes the metallization feature 240*a* and the metallization feature 240*b* having different geometric profiles and separated by the dielectric layer 220 and/or the dielectric feature 244.

In the present embodiments, referring to FIGS. 11A to 11C and 12, the metallization feature 240*a* includes a pair of long sides defined by a portion of the dielectric layer (the portion may alternatively be referred to as dielectric feature 220 hereafter) along the direction D2, one short side defined by the dielectric feature 244, and another short side defined by a portion of the dielectric layer 220 along the direction D1. The metallization feature 240*a* has a first bottom corner C1 adjacent to the dielectric feature 244 and a second bottom corner C2 adjacent to the dielectric layer 220, where the first bottom corner C1 is defined by an included angle $\theta 1$ and the second bottom corner C2 is defined by an included angle $\theta 2$ (corresponding to the included angle 226 as discussed above with reference to FIG. 6C).

In the present embodiments, the included angle $\theta 1$ of the first bottom corner C1 is less than about 90° (i.e., is an acute angle), and the included angle $\theta 2$ of the second bottom corner C2 is greater than about 90° (i.e., is an obtuse angle). Further, in the present embodiments, because the barrier layer 232 is formed before forming the dielectric features 244, the barrier layer 232 is disposed along, and in direct contact with an entirety of, the sidewall of the metallization feature 240*a* defined by the dielectric layer 220 but not along the opposite sidewall of the metallization feature 240*a* defined by the dielectric feature 244. In the present embodiments, portions of the barrier layer 232 are disposed between the metallization feature 240*a* and the underlying dielectric layer 214. Still further, in the present embodiments, the metallization feature 240*a* is in direct contact with at least one connecting via 216, thereby allowing the FEOL device disposed over the semiconductor substrate 202 to be electrically connected to the metallization feature 240*a*.

In the present embodiments, still referring to FIGS. 11A to 11C and 12, the metallization feature 240*b* includes a pair of long sides defined by a portion of the dielectric layer 220 (i.e., the dielectric feature 220) along the direction D2 (as shown in FIG. 11A), and a pair of short sides defined by the dielectric features 244 along the direction D1. In other words, the metallization feature 240*b* is end-capped by the dielectric features 244. The metallization feature 240*b* has a third bottom corner C3 and a fourth bottom corner C4 opposite to the third bottom corner C3 along the direction D2. The third bottom corner C3 is defined by an included angle $\theta 3$ and the fourth bottom corner C4 is defined by an included angle $\theta 4$. In the present embodiments, though the included angle $\theta 3$ of the third bottom corner C3 and the included angle $\theta 4$ of the fourth bottom corner C4 may differ in magnitude, they are both less than 90°, i.e., are both acute angles. Thus, the metallization feature 240*b* is defined by a trapezoid shape, such that its width along the direction D2 increases towards the semiconductor substrate 202. Further, in the present embodiments, because the barrier layer 232 is formed before forming the dielectric features 244, the barrier layer 232 is not entirely disposed along either sidewall of the dielectric features 244 that end-cap the metallization features 240*b*. Of course, the barrier layer 232 is disposed between the metallization feature 240*b* and the dielectric layer 214 as discussed above with respect to the metallization feature 240*a*. Still further, in the present embodiments, the metallization feature 240*b* is in direct contact with at least a connecting via 216 (not shown), thereby electrically connecting the FEOL device formed over the semiconductor substrate 202 to the metallization feature 240*b*.

In the present embodiments, and for reasons discussed above with respect to the included angle 226, the included angle $\theta 2$ of the second bottom corner C2 of the metallization feature 240*a*, which is adjacent to the dielectric layer 220 and formed prior to the forming of the metallization features 240*a* and 240*b*, is greater than about 90°. In contrast, the included angle $\theta 1$ of the first bottom corner C1 of the metallization feature 240*a*, the included angle $\theta 3$ of the third bottom corner C3 of the metallization feature 240*b*, and the included angle $\theta 4$ of the fourth bottom corner C4 of the metallization feature 240*b*, which are adjacent to the dielectric features 244 and formed with the forming of the metallization features 240*a* and 240*b*, are less than about 90°. Accordingly, the present embodiments provide that the dielectric feature 244 is defined by an inverted trapezoid shape. In other words, a width of the dielectric feature 244 defined along the direction D2 decreases towards the semiconductor substrate 202. In some embodiments, a width of a bottom portion of the dielectric feature 244 is approximately 1 nanometer to approximately 13 nanometers, and a width of a top portion of the dielectric feature 244 is approximately 2 nanometers to approximately 15 nanometers; of course, the disclosure is not limited thereto.

In some embodiments, the method 10 may be used to form an Nth metal layer Mn over the structure 200, where N is a positive integer. For example, FIGS. 13A, 14A, 15A, 16A, 17A, 18A, and 19A are schematic planar top views of a semiconductor structure at various stages in the method 10 according to aspects of one or more embodiments of the present disclosure. Further, FIGS. 13B, 14B, 15B, 16B, 17B, 18B, 19B, and 20 are schematic cross-sectional views taken along line II-II' of FIGS. 13A, 14A, 15A, 16A, 17A, 18A, and 19A, respectively. FIGS. 13C, 14C, 15C, 16C, 17C, 18C, and 19C are schematic cross-sectional views taken along line I-I' of FIGS. 13A, 14A, 15A, 16A, 17A, 18A, and 19A, respectively. It should be noted that in the present embodiments, the method 10 is performed to form the zeroth metal layer M0 as discussed above with respect to FIGS. 2A to 12 or to form any subsequent metal layer, e.g., the first metal layer M1 over the zeroth metal layer M0, the second metal layer M2 over the first metal layer M1, etc. Therefore, the same elements of the structure 200 in FIGS. 2A to 12 and in FIGS. 13A to 20 are indicated by the same reference numerals, and repeated descriptions of such elements are omitted for brevity.

Figure 13A:
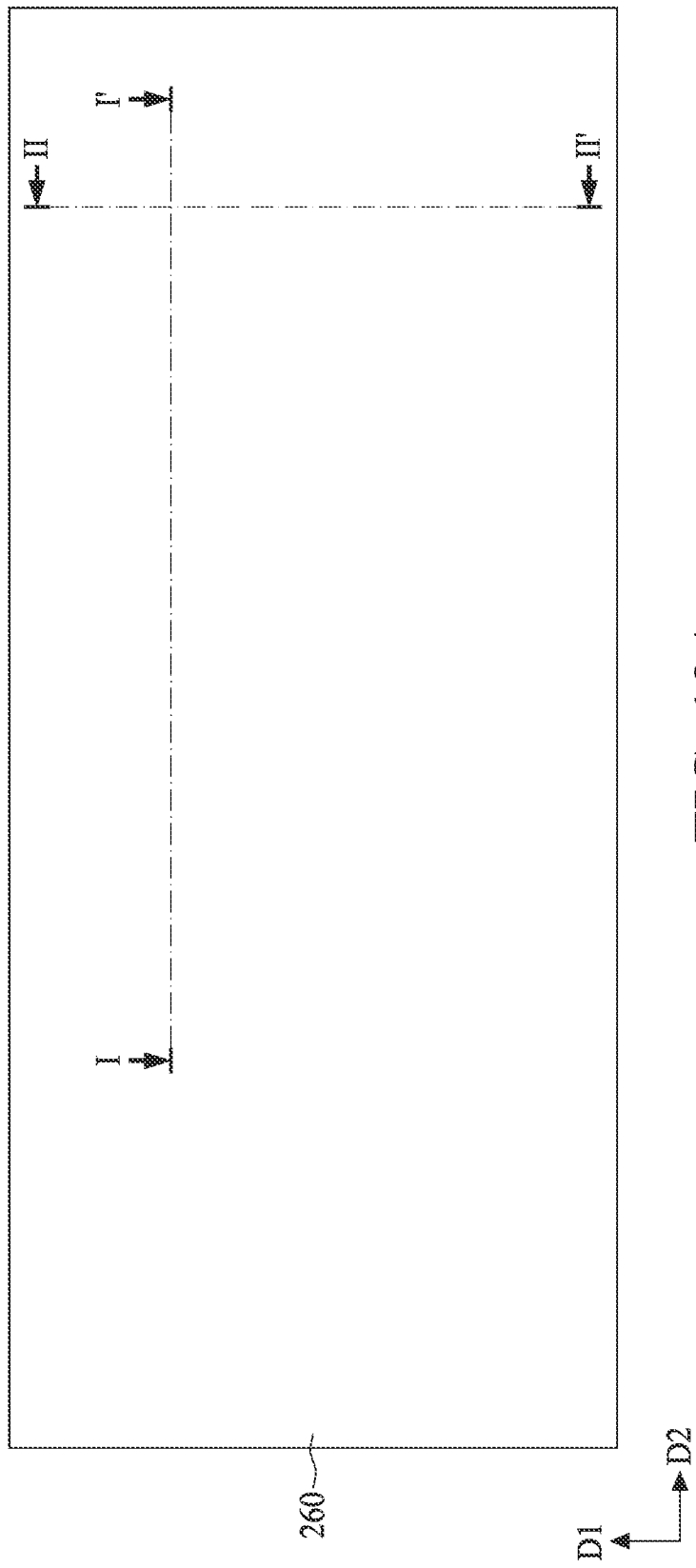
Figure 13B:
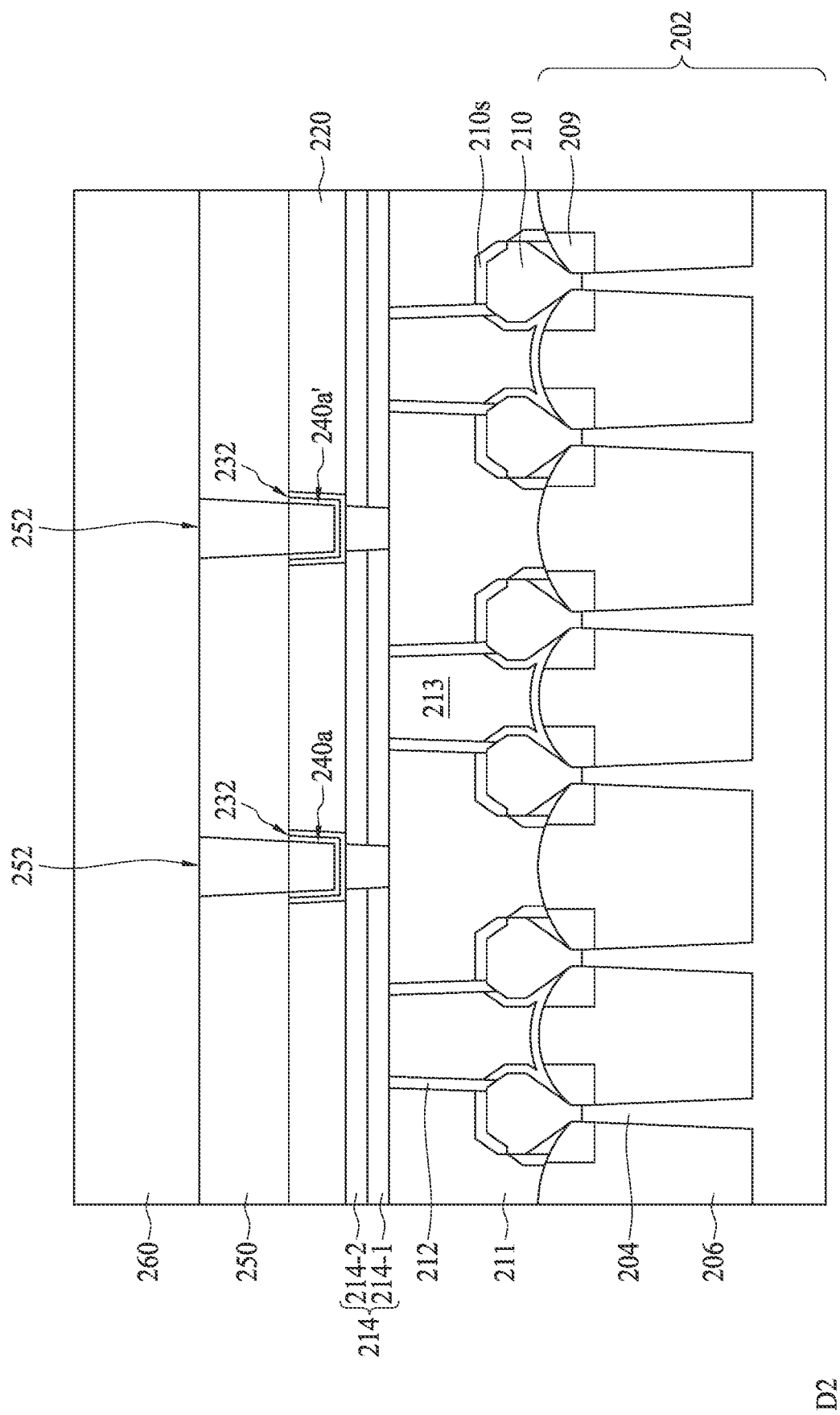
Figure 13C:
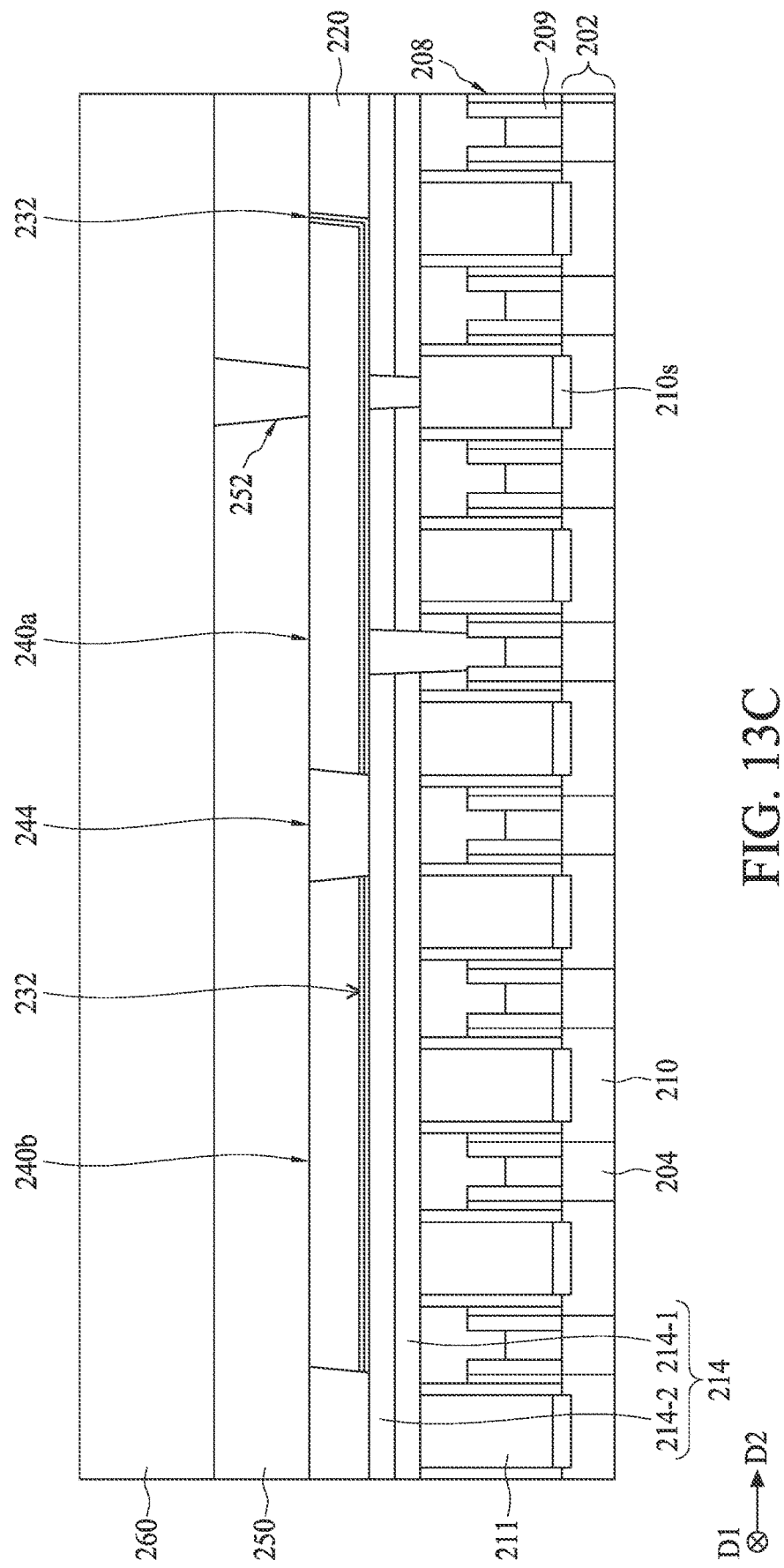

Referring to FIGS. 13A to 13C, in operation 11, the method 10 receives (or is provided with) the structure 200 that includes the semiconductor substrate 202. The semiconductor substrate 202 may include various FEOL devices configured with, for example, epitaxial source/drain structures and gate structures, MEOL interconnecting structures such as, for example, the connecting vias electrically coupled to VDs or VGs, and at least a metal layer Mn−1 formed thereon and including at least the metallization features 240a and 240b as discussed in detail above. In some embodiments, the structure 200 further includes connecting vias 252 disposed in a dielectric layer 250 that is formed over and electrically coupled to the metallization features 240a and 240b. The dielectric layer 250 may include a single-layered structure or a multilayered structure. The dielectric layer 250 may be referred to as an IMD layer and may include substantially the same composition as the dielectric layer 220 as discussed above. In some embodiments, when the connecting via 252 is coupled to a metallization feature, such as the metallization feature 240a or 240b, in the metal layer Mn−1, the connecting via 252 is referred to as the (N−1)th via, or Vn−1. For example, the connecting via 252 that is coupled to the metallization features 240a (or 240b; not shown), may be referred to as a zeroth via V0. In some embodiments, the connecting via 252 is similar to the connecting via 216 in structure and is formed by similar processes. In the depicted embodiments, the connecting vias 252 are each electrically coupled to one of the metallization features 240a and 240a', such that the connecting vias 252 are spaced from each other along the direction D1 and separated by the dielectric layer 220; of course, the present disclosure is not limited to this arrangement. For example, additional connecting vias 252 may be formed to electrically couple with the metallization features 240b and/or 240b'.

Still referring to FIGS. 13A to 13C, the method 10 forms a dielectric layer 260 over the structure 200. In the present embodiments, the dielectric layer 260 is similar to the dielectric layer 250 in composition and structure. In some embodiments, the dielectric layer 250 and the dielectric layer 260 are referred to as an IMDn layer, which accommodates the forming of the Nth metal layer Mn and the (N−1)th via Vn−1. For example, the dielectric layer 250 and the dielectric layer 260 may be referred to as a first IMD1 layer which accommodates the forming of the first metal layer M1 and the zeroth via V0 (i.e., the connecting via 252).

Figure 14A:
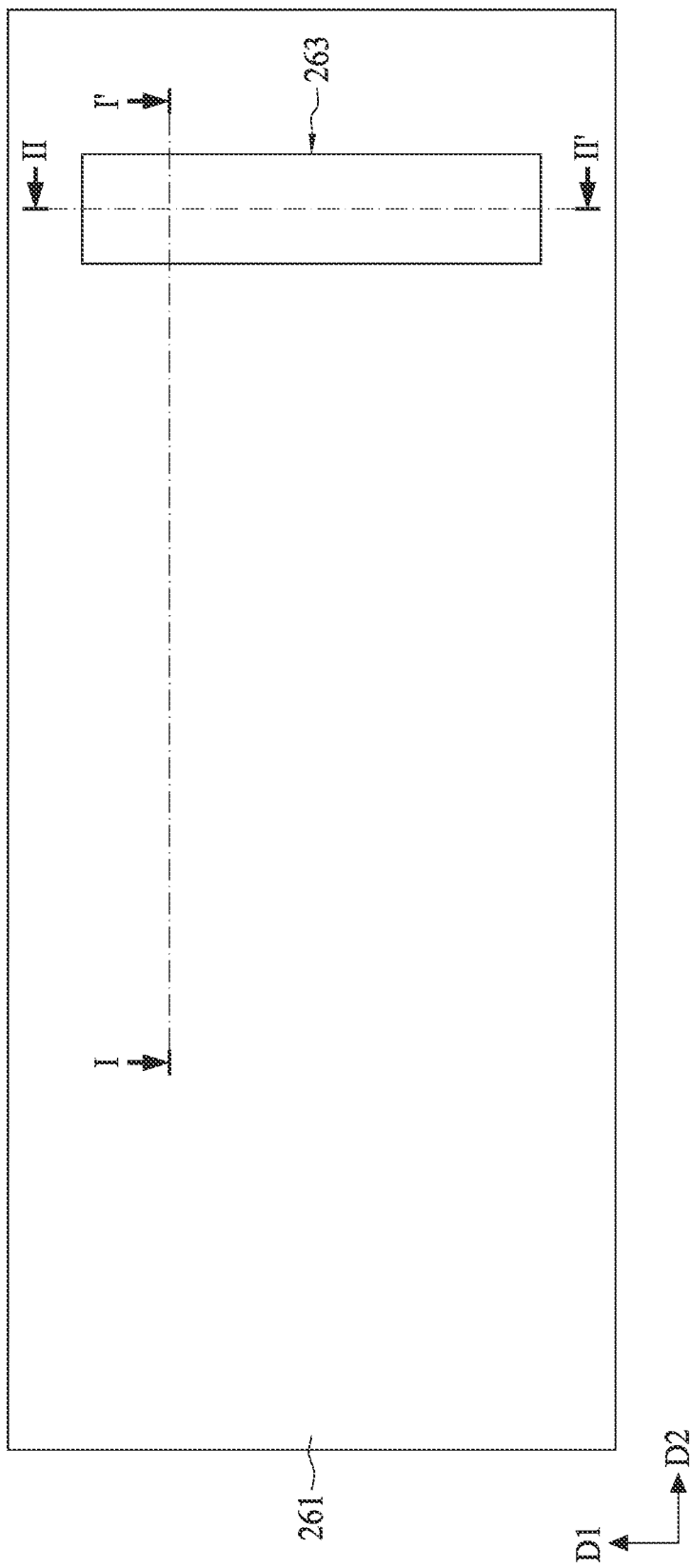
Figure 14B:
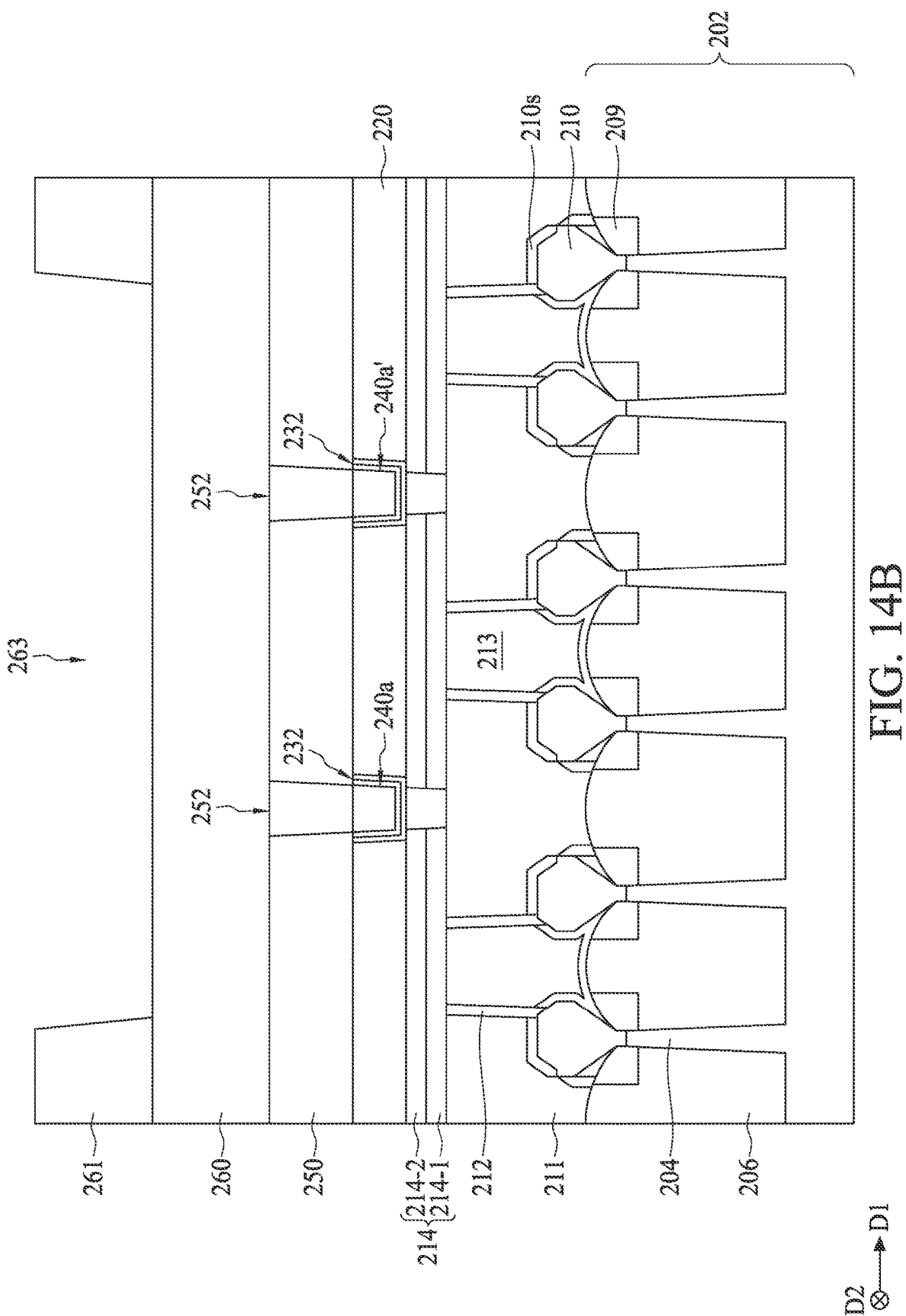
Figure 14C:
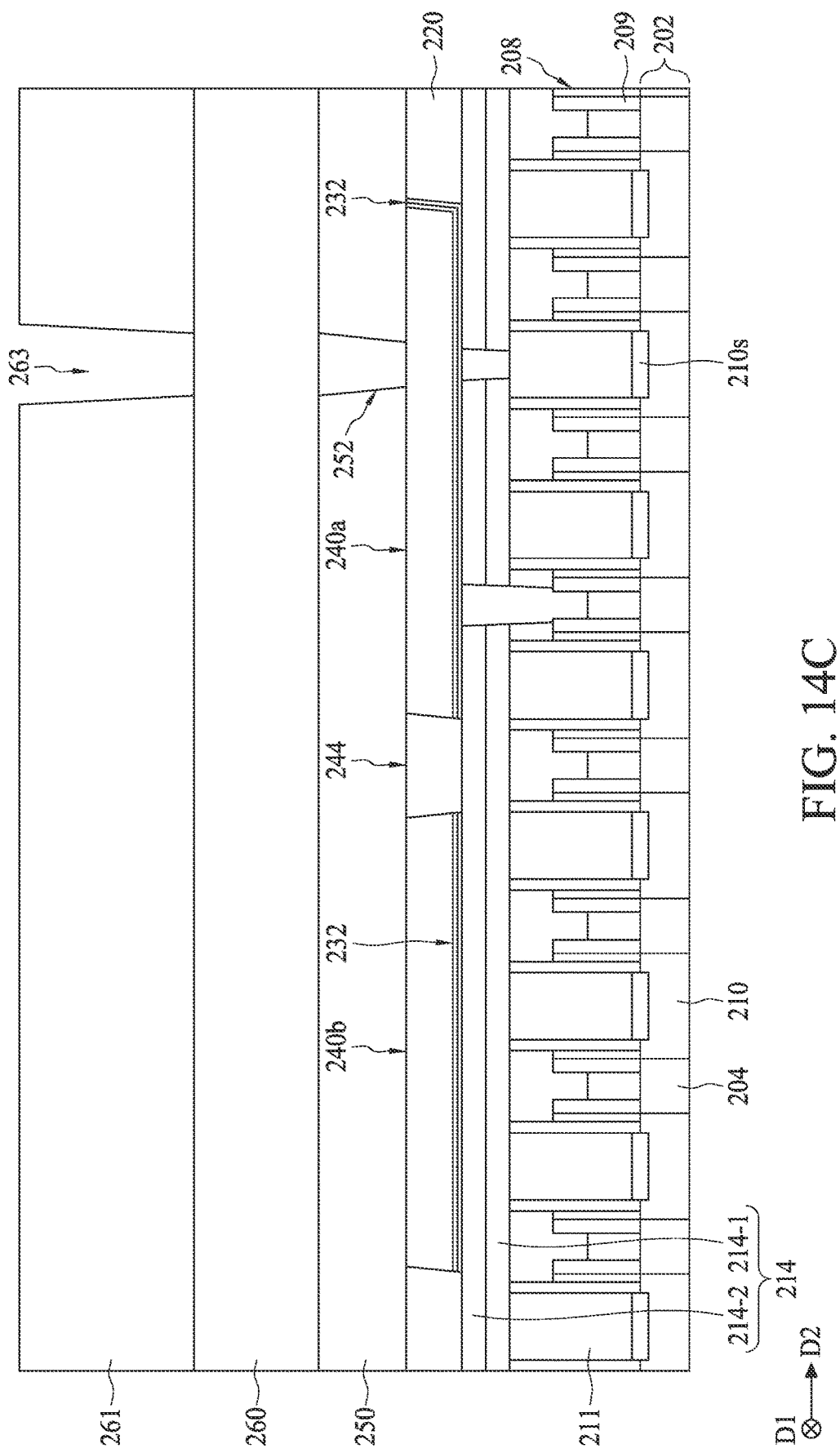

In operation 12, the method 10 forms a trench 265 in the dielectric layer 260. Referring to FIGS. 14A to 14C, in some embodiments, forming the trench 265 includes first forming a patterned masking element 261 over the dielectric layer 260, where the patterned masking element 261 includes at least an opening 263 configured to define a dimension and a location of the trench 265 to be formed in the dielectric layer 260. In some embodiments, the patterned masking element 261 is similar to the patterned masking element 221 in terms of structure and method of processing.

Figure 15A:
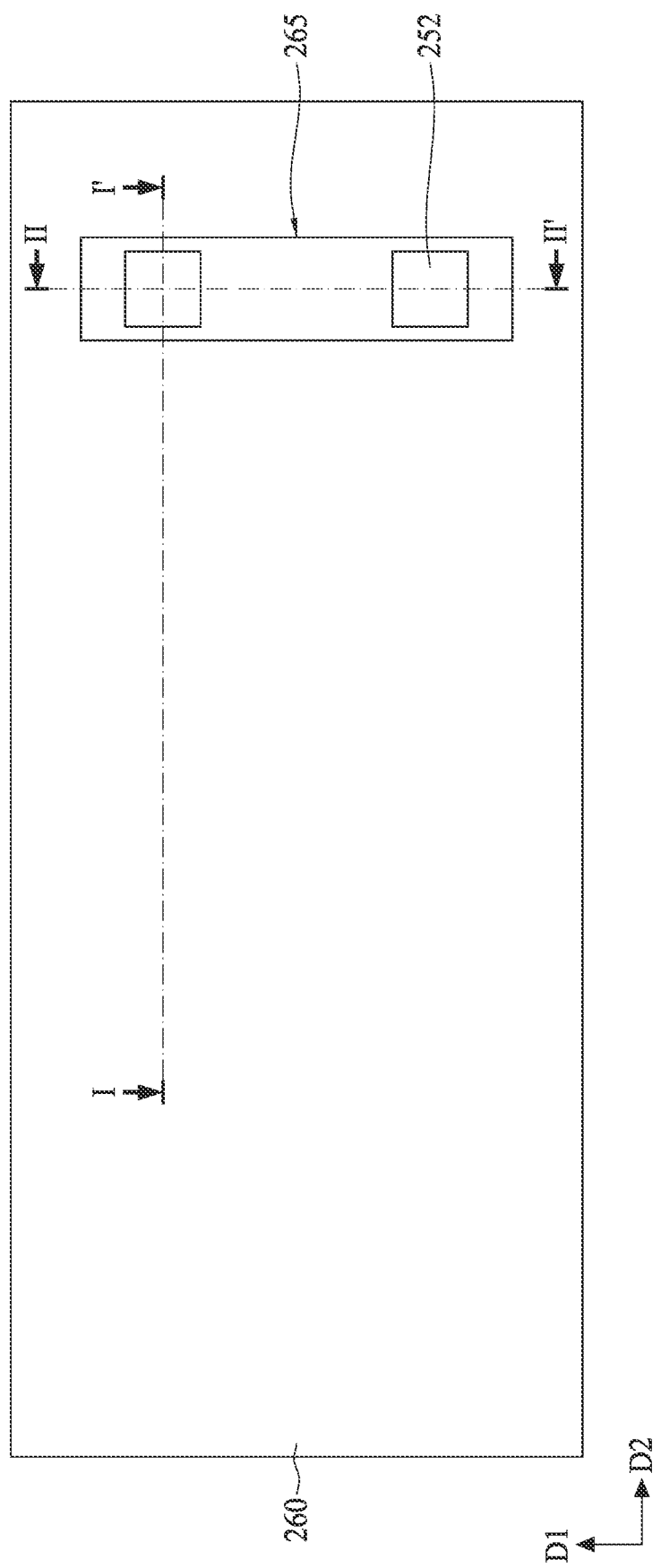
Figure 15B:
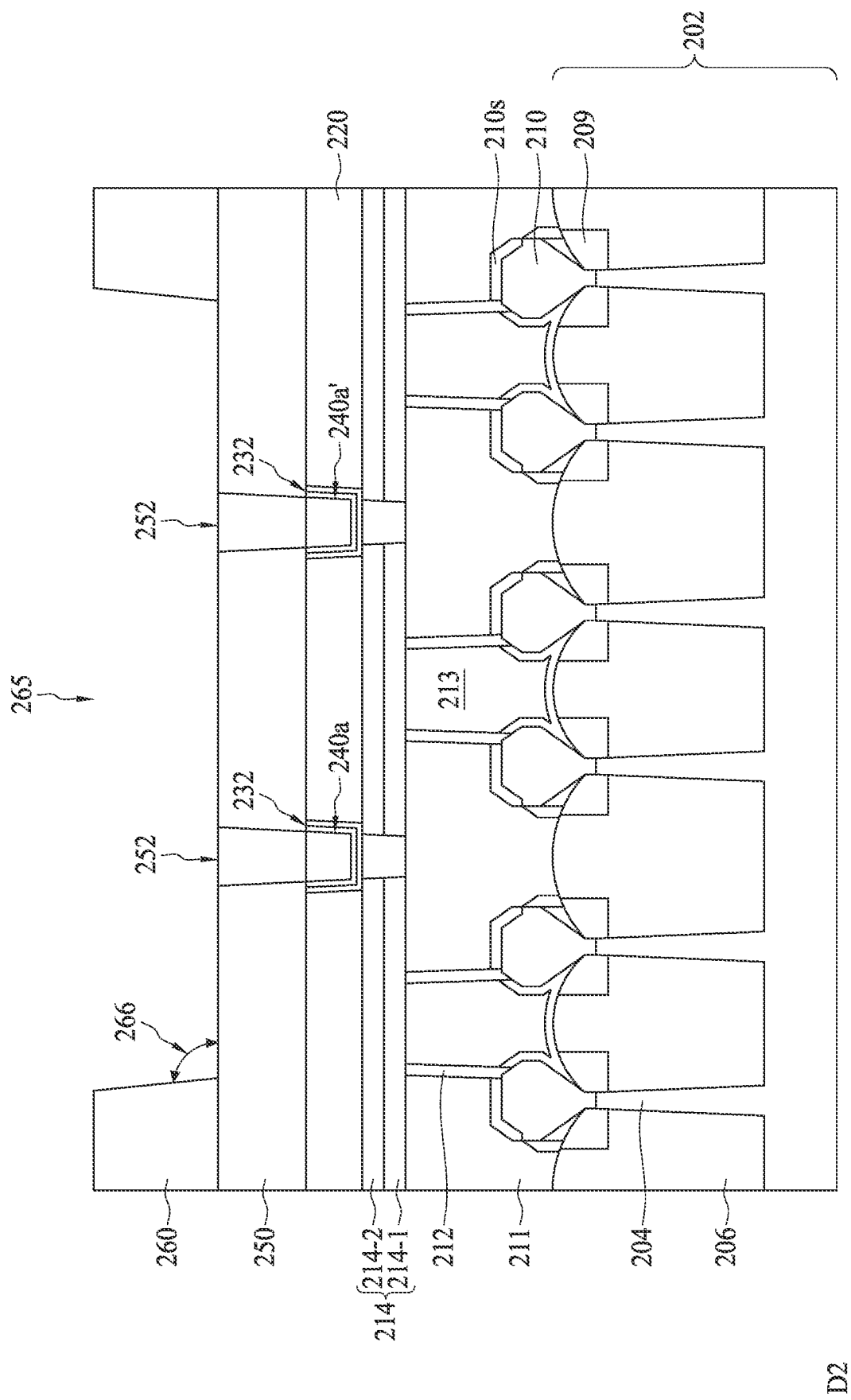
Figure 15C:
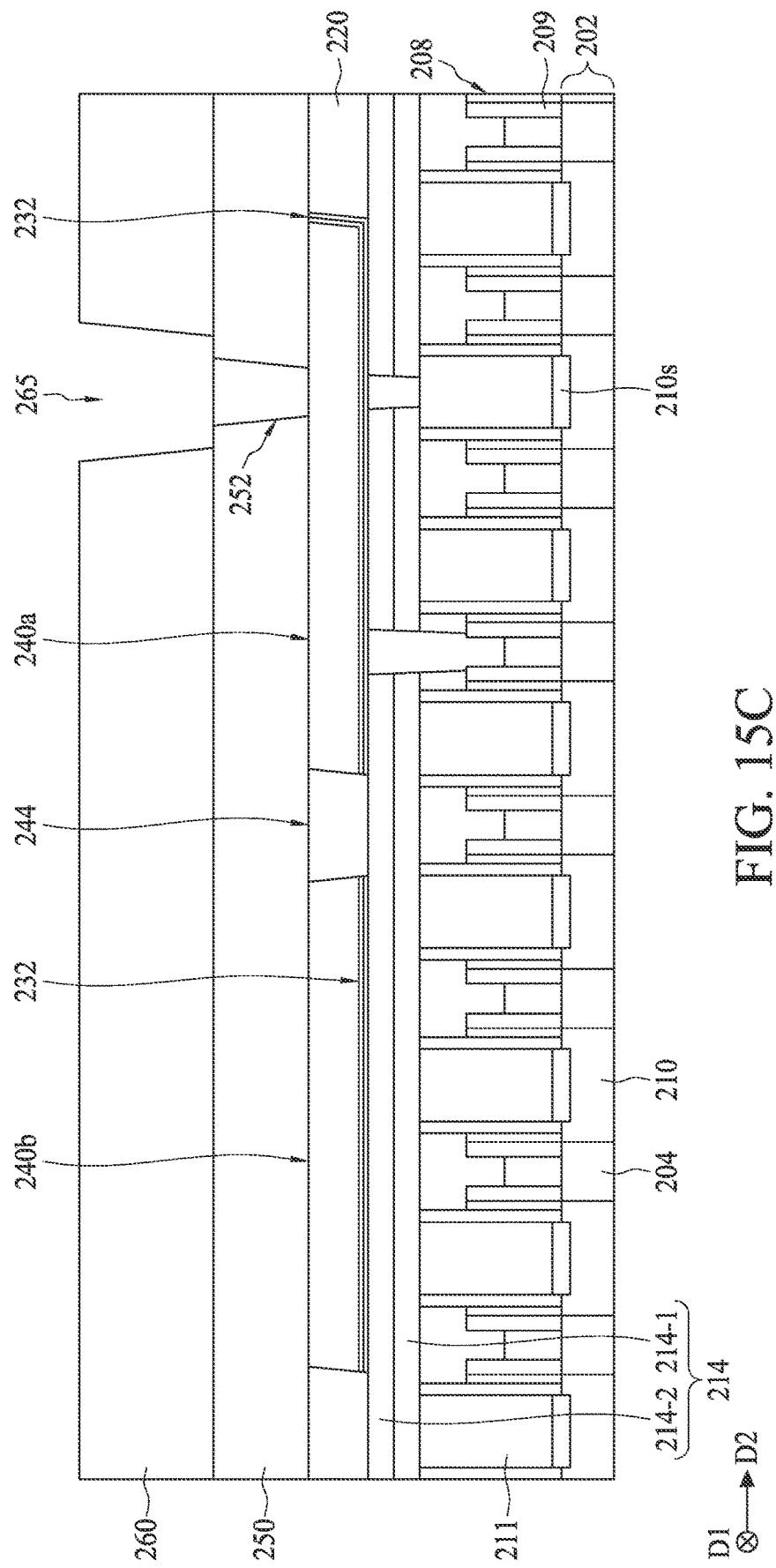

Referring to FIGS. 15A to 15C, portions of the dielectric layer 260 exposed through the patterned masking element 261 is removed by a suitable etching process, such as a dry etching process, a wet etching process, an RIE process, or combinations thereof, to form the trench 265 in the dielectric layer 260. The patterned masking element 261 is then removed after the forming of the trench 265 by a suitable method, such as plasma ashing and/or resist stripping. In the depicted embodiments, the trench 265 extends lengthwise along the direction D1, as shown in FIGS. 15A and 15B, but the disclosure is not limited thereto. For example, the trench 265 may also be formed to extend lengthwise along the direction D2, i.e., substantially parallel to the metallization features 240a and 240b, according to specific design requirements. In the depicted embodiments, the connecting vias 252 and portions of the dielectric layer 250 are exposed through the trench 265, whose sidewalls are defined by the dielectric layer 260. Similar to the discussion above with respect to the trench 225, an opening of a bottom portion of the trench 265 (for example, a length of the trench 225 defined along the direction D2) is less than an opening of a top portion of the trench 265, i.e., the trench 265 is configured with an inverted trapezoidal profile, as shown in FIG. 15B. In other words, an included angle 266 as shown in FIG. 15B is greater than about 90°, i.e., the included angle 266 is an obtuse angle.

Figure 16A:
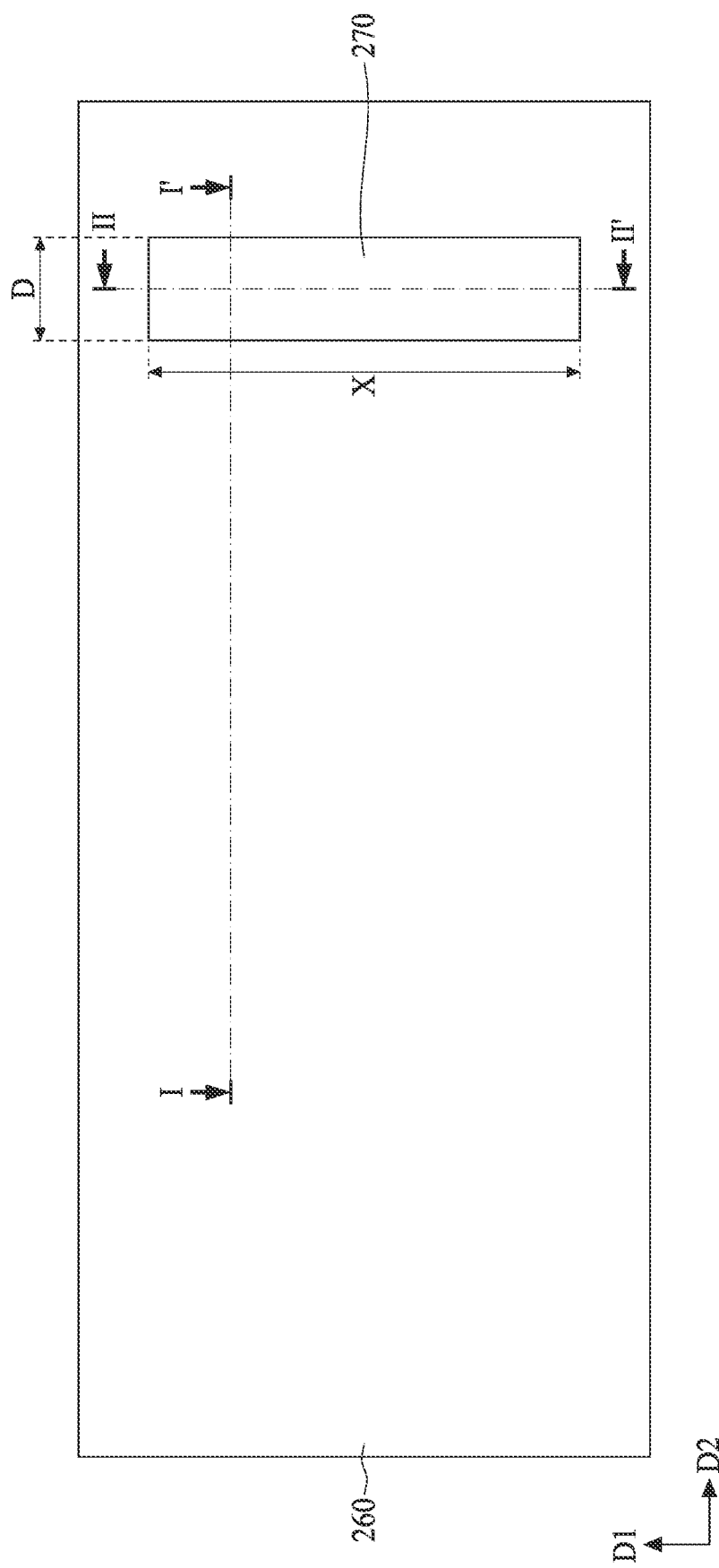
Figure 16B:
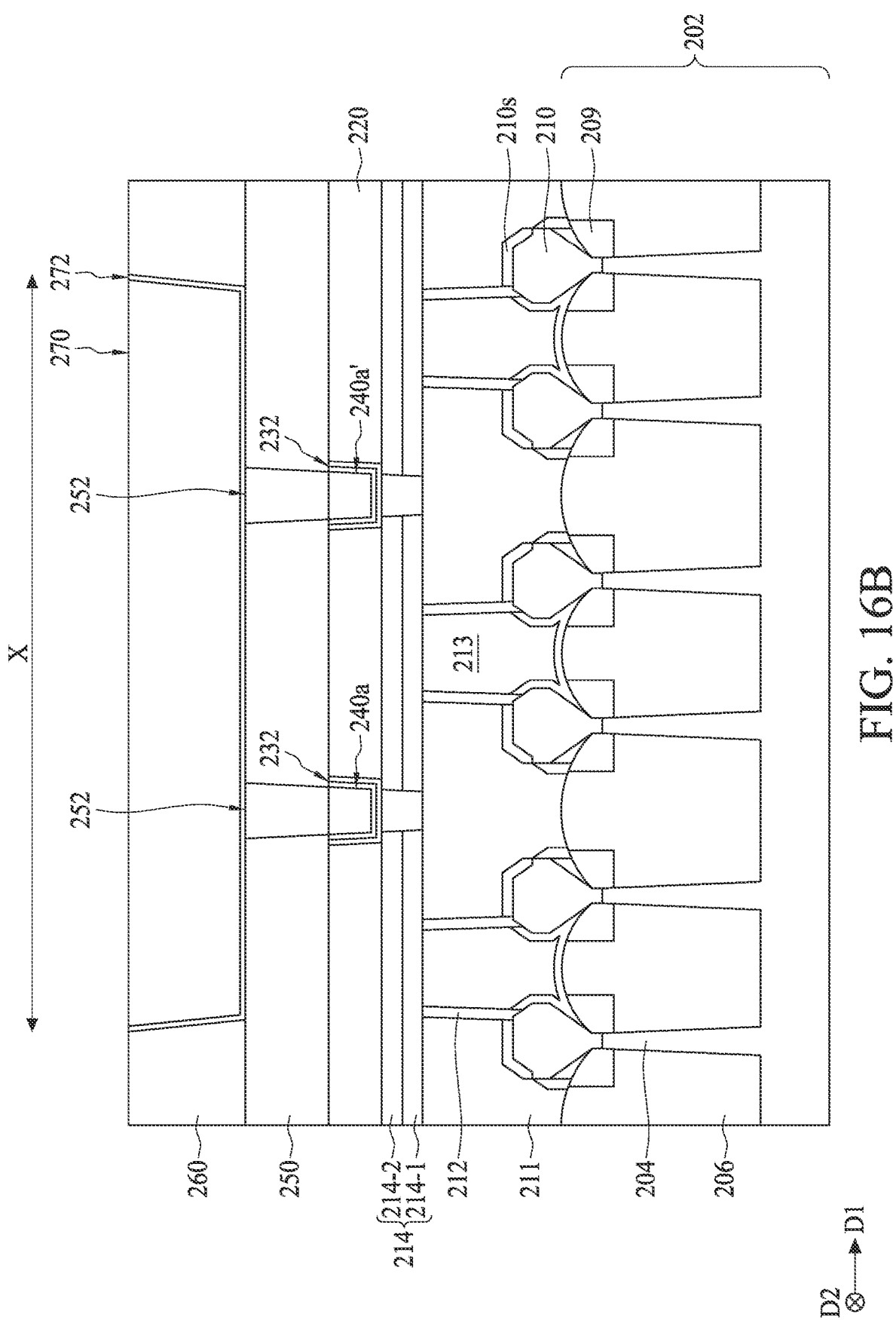
Figure 16C:
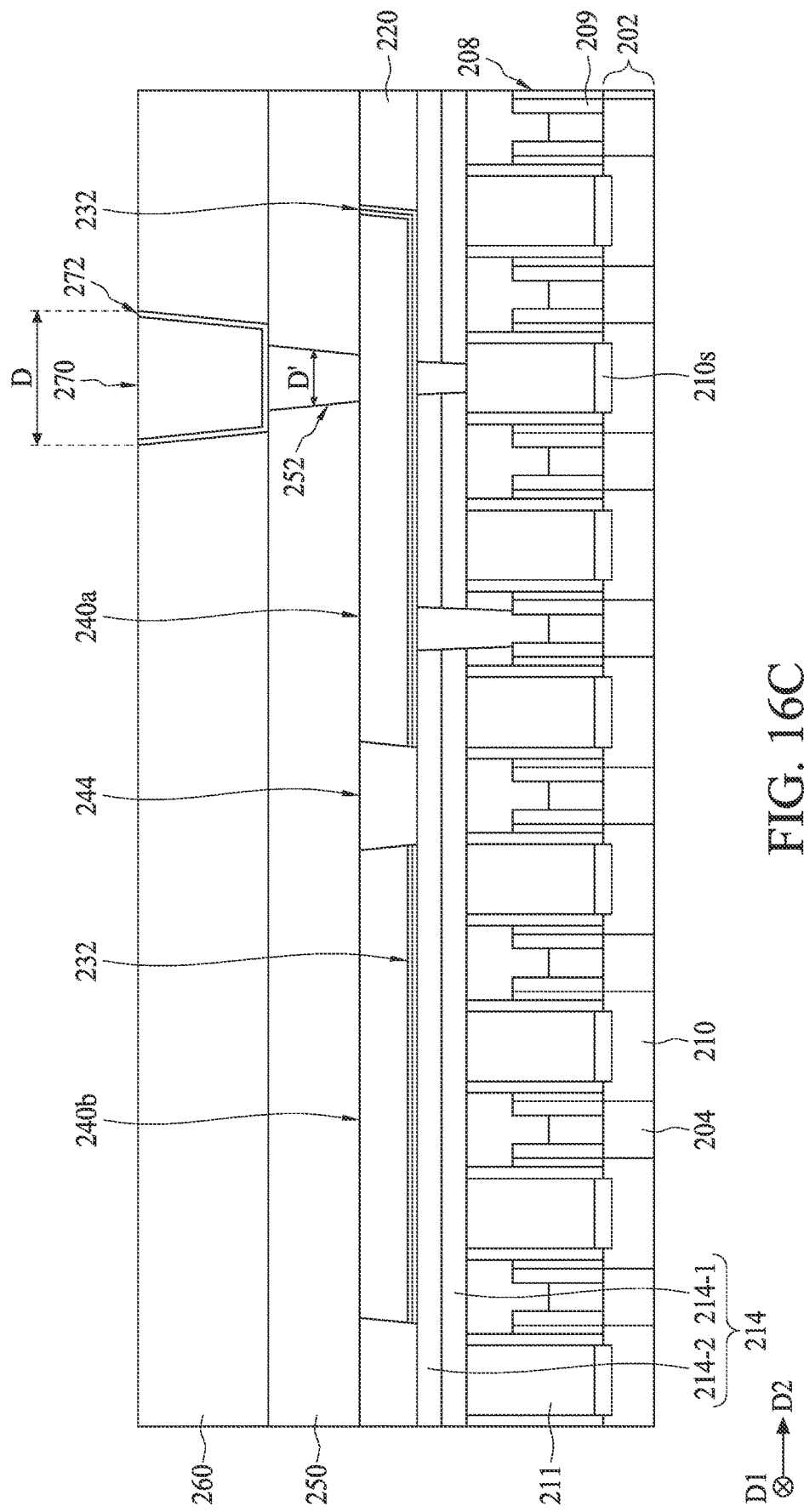

In operation 13, referring to FIGS. 16A to 16C, the method 10 fills the trench 265 with a conductive material to form a metallization line 270 in the dielectric layer 260. In some embodiments, the conductive material of the metallization line 270 includes Co, W, Ru, Al, Mo, Ti, Cu, other suitable conductive materials, or combinations thereof, and may be formed by any suitable method, such as CVD, PVD, ALD, electroplating, other suitable methods, or combinations thereof. In some embodiments, the conductive material used to form the metallization line 270 is the same as the composition of the conductive material 230 discussed in detail above with respect to the metallization line 234. Subsequently, any superfluous conductive material is removed by a planarization process such as a CMP operation, resulting in the metallization line 270. In the present embodiments, the resulting metallization line 270 is configured with an inverted trapezoidal shape according to the same profile of the trench 265 discussed above.

In some embodiments, a barrier layer 272 is formed prior to the filling of the trench 265. In some embodiments, the barrier layer 272 is a single-layered structure. In some embodiments, the barrier layer 272 is a multi-layered structure. The barrier layer 272 may include materials similar to those of the barrier layer 232 and may be formed by similar process as those discussed with respect to the barrier layer 232. In some embodiments, the barrier layer 272 includes Ti, TiN, Ta, TaN, W, WN, other suitable materials, or combinations thereof.

As shown in FIGS. 16A and 16B, the metallization line 270 extends lengthwise along the direction D1. In some embodiments, a width D of the metallization line 270 defined along the direction D2 is greater than a width D' of the connecting via 252 defined along the same direction, as shown in FIG. 16C. In the present embodiments, the metallization line 270 is configured to be in contact with (i.e., electrically coupled to) the connecting via 252. Further, in the present embodiments, the metallization line 270 is electrically connected to the FEOL device over the semiconductor substrate 202 through the connecting via 252, the metallization feature 240a (or the metallization feature 240b), and the connecting via 216. In the present embodiments, the metallization line 270 includes a plurality of bottom corners each defined by an included angle that is greater than about 90°, i.e., the included angle is an obtuse angle.

Figure 17A:
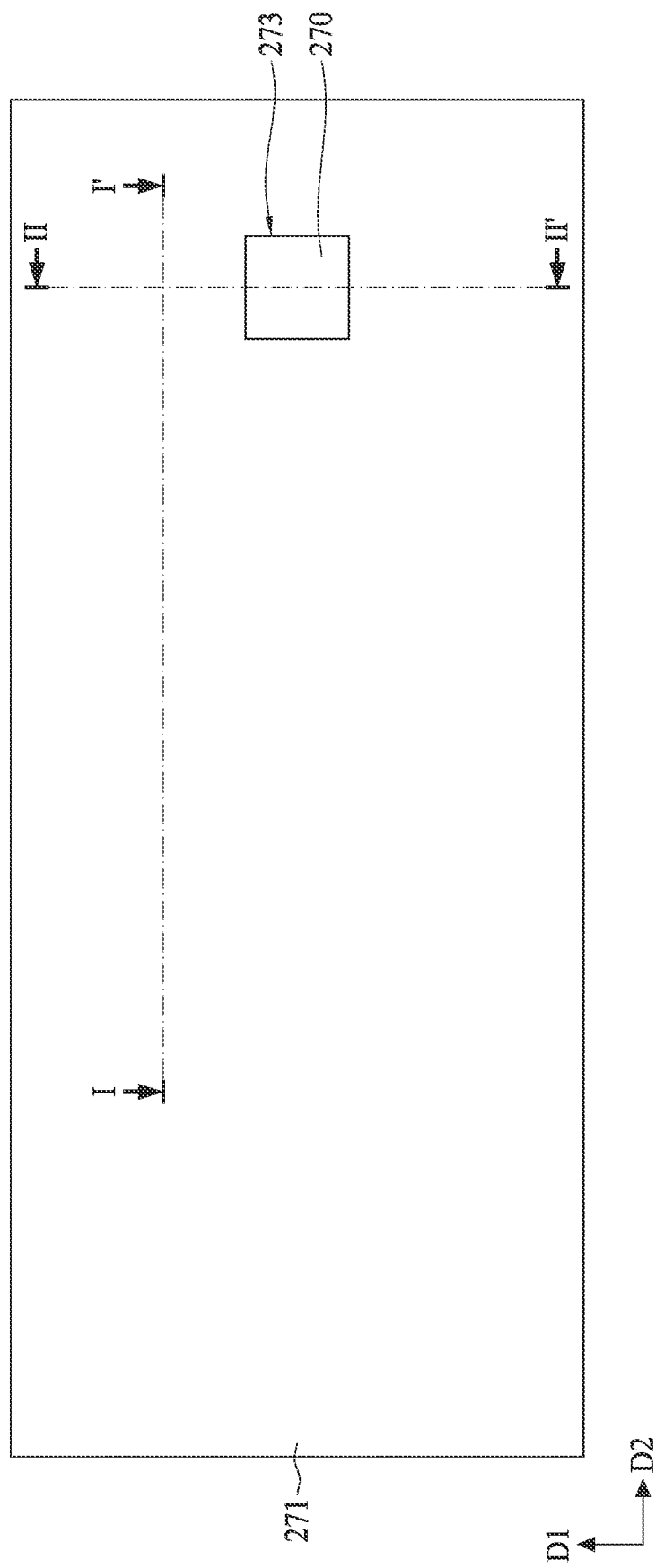
Figure 17B:
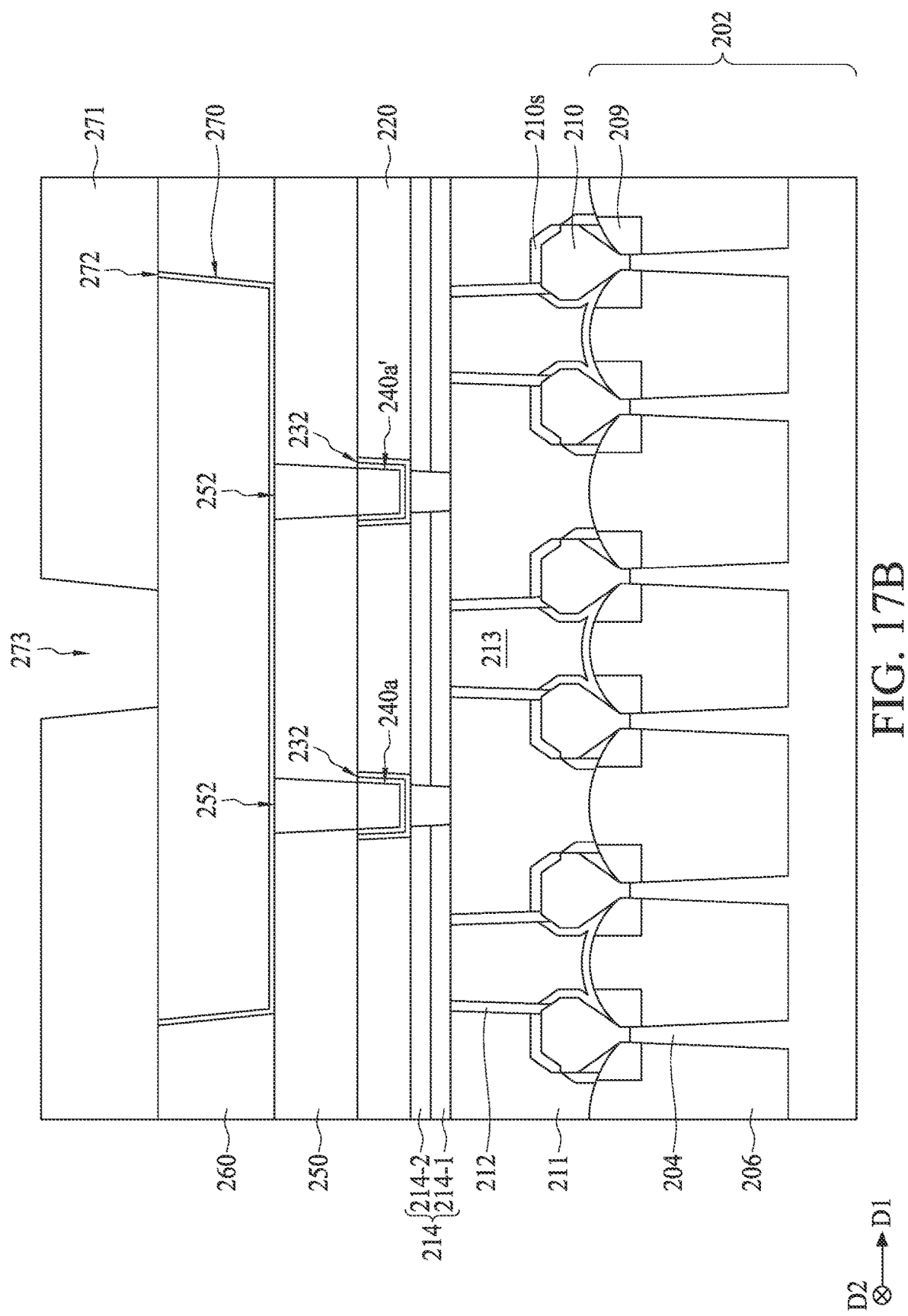
Figure 17C:
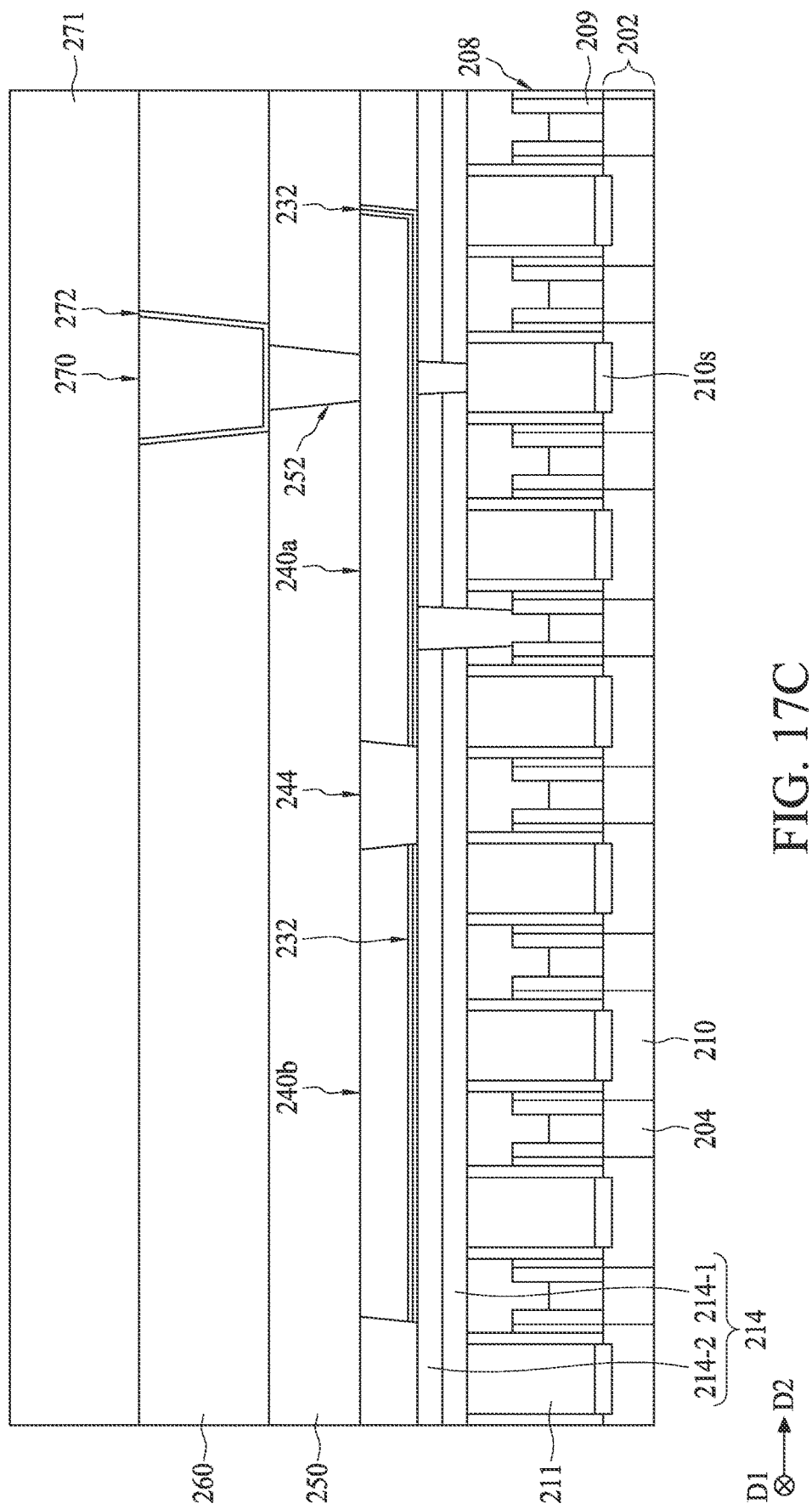

In operation 14, the method 10 segments (or separates) the metallization line 270 to form a metallization feature 280a and a metallization feature 280b. Referring to FIGS. 17A to 17C, in the present embodiments, a patterned masking element 271 is formed over the structure 200. The patterned masking element 271 includes at least an opening 273 for defining a dimension and a location of a recess 281 to be formed in the metallization line 270. As such, a portion of the metallization line 270 is exposed through the opening 273. In some embodiments, the patterned masking element 271 is similar to the patterned masking element 221 in terms of structure and method of processing.

Figure 18A:
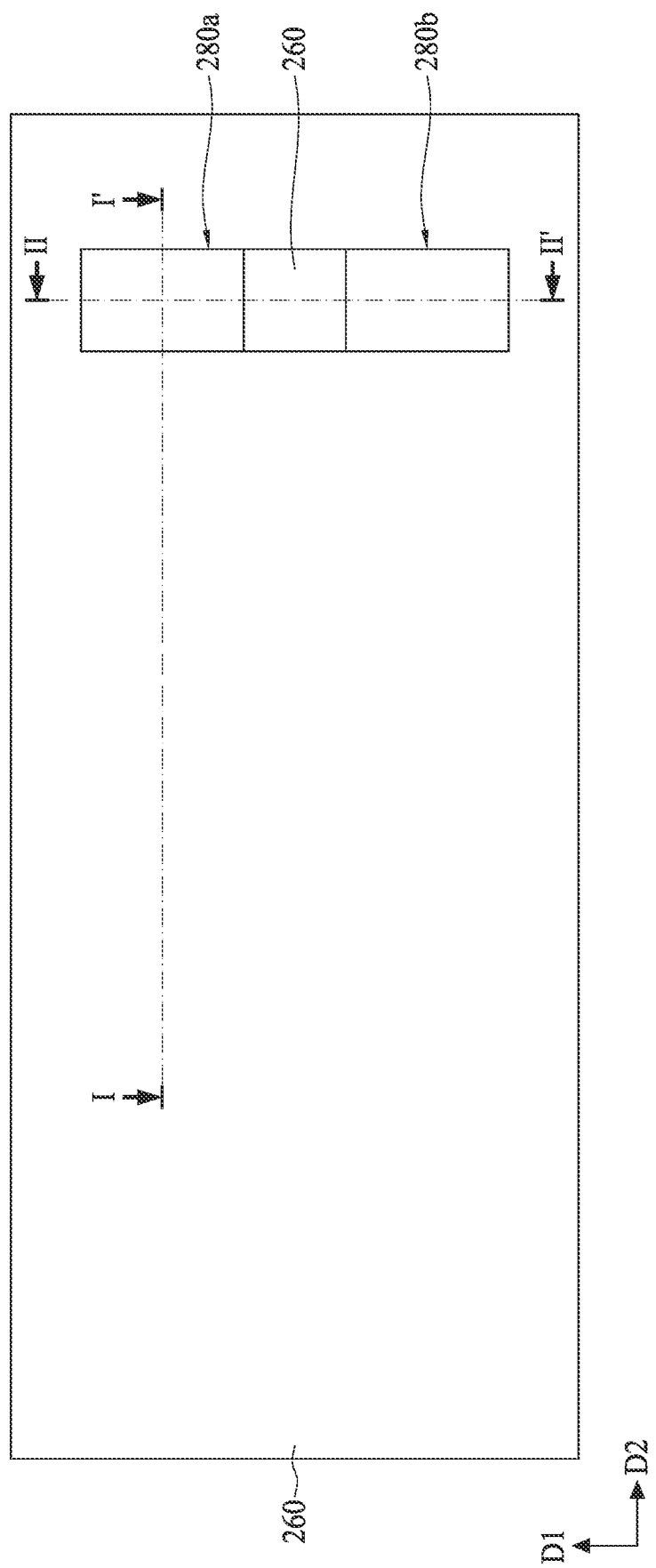
Figure 18B:
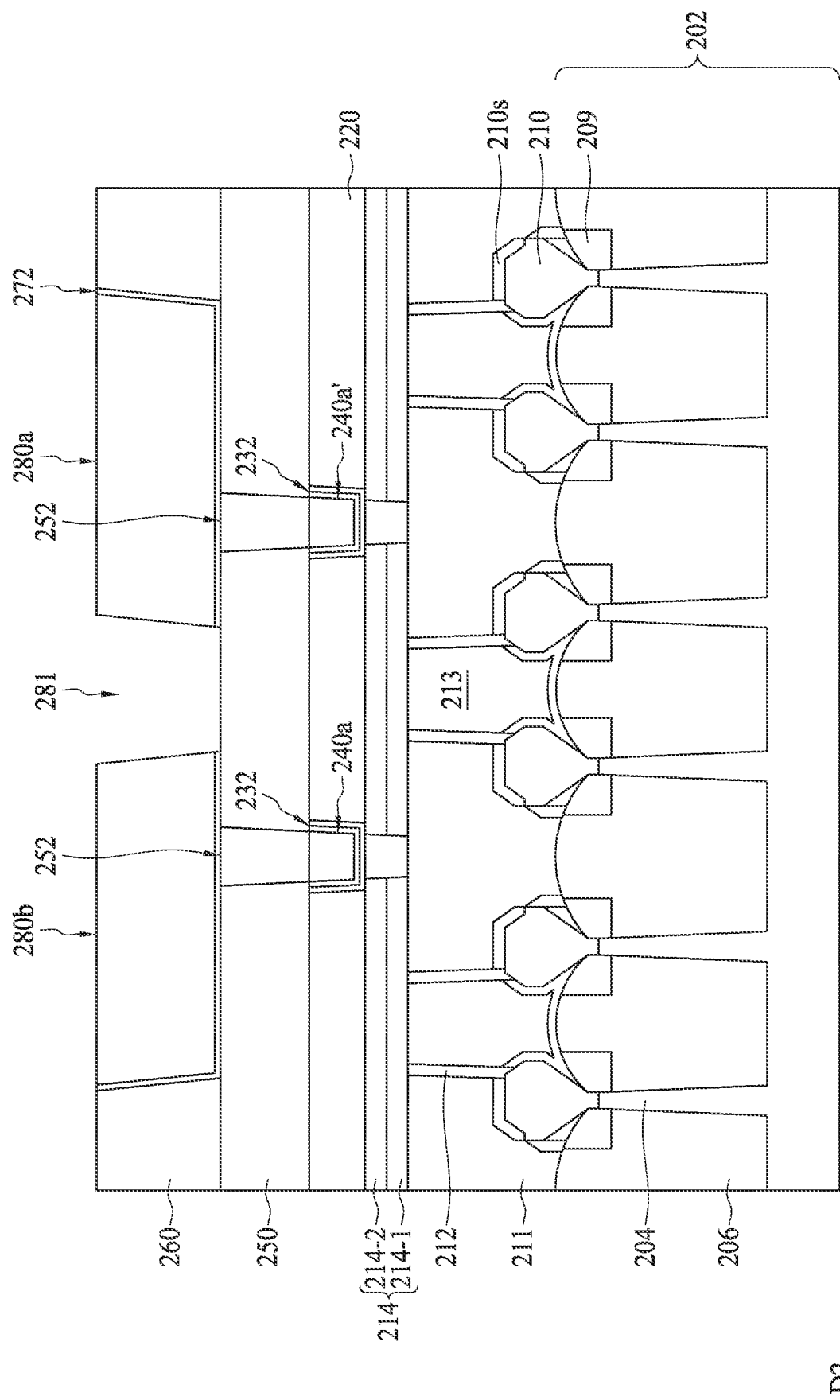
Figure 18C:
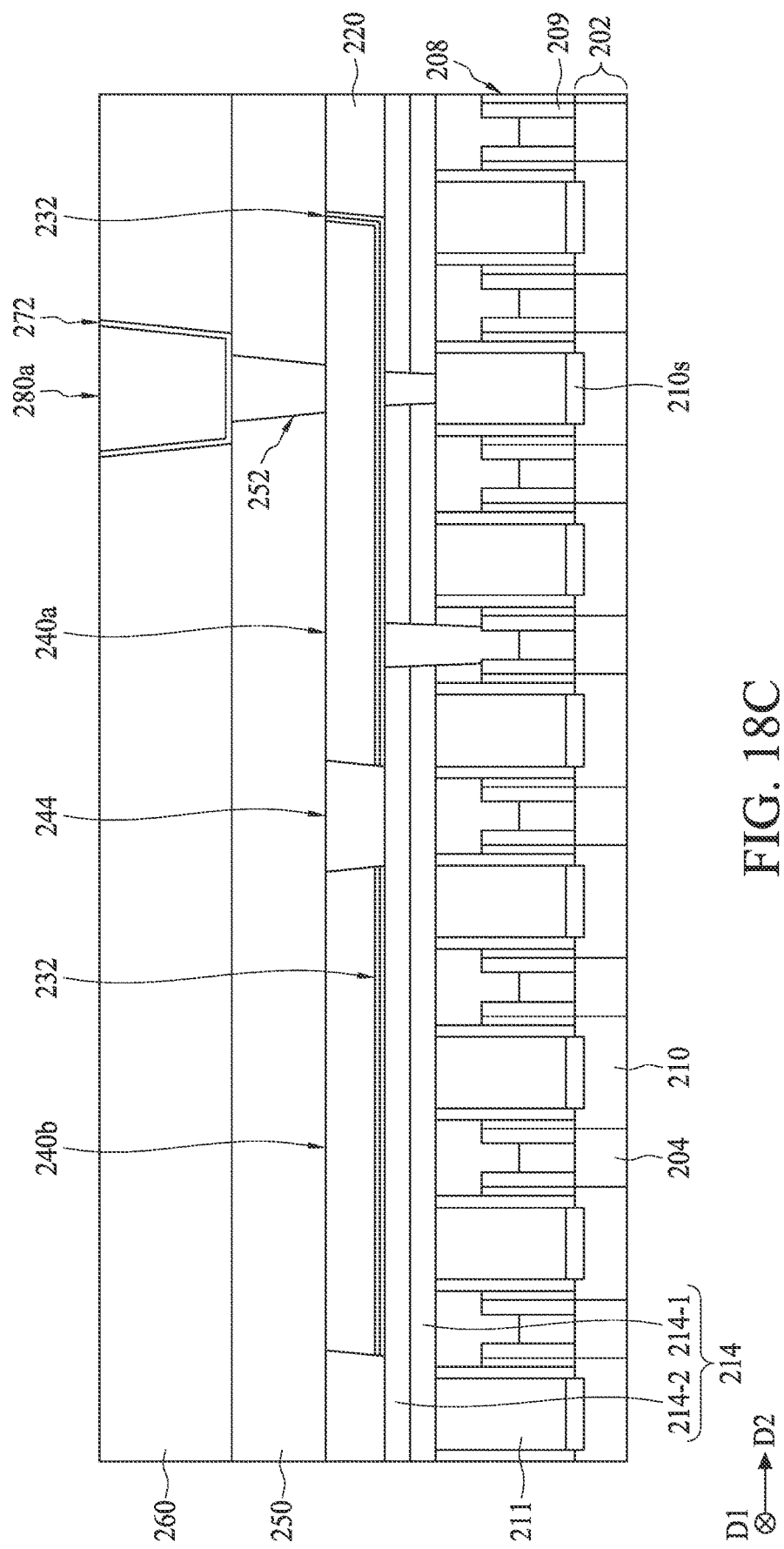

Referring to FIGS. 18A to 18C, the method 10 performs an etching operation to remove the portion of the metallization line 270 exposed through the opening 273 of the patterned masking element 271, thereby forming the recess 281 that separates the metallization line 270 into metallization features 280a and 280b along the direction D2. In the present embodiments, a portion of the dielectric layer 250 is exposed through the recess 281.

Figure 19A:
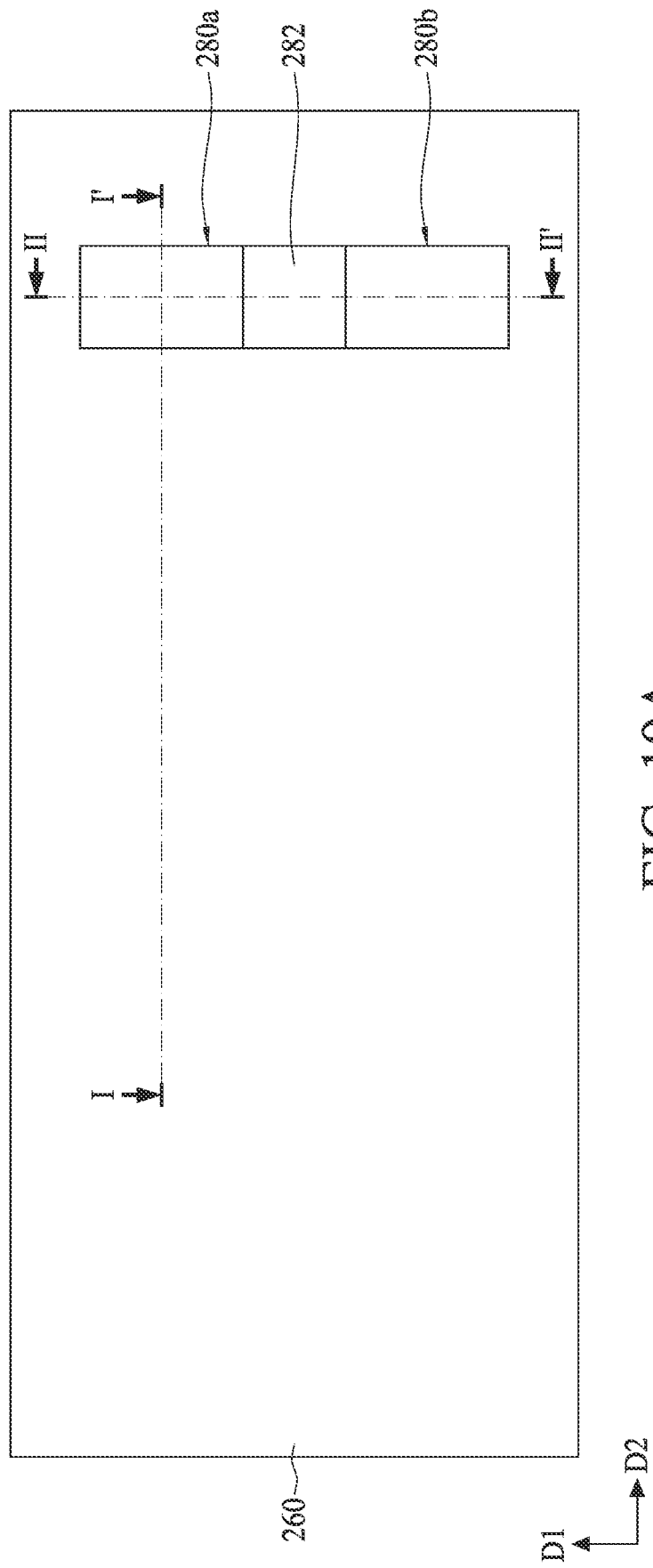
Figure 19B:
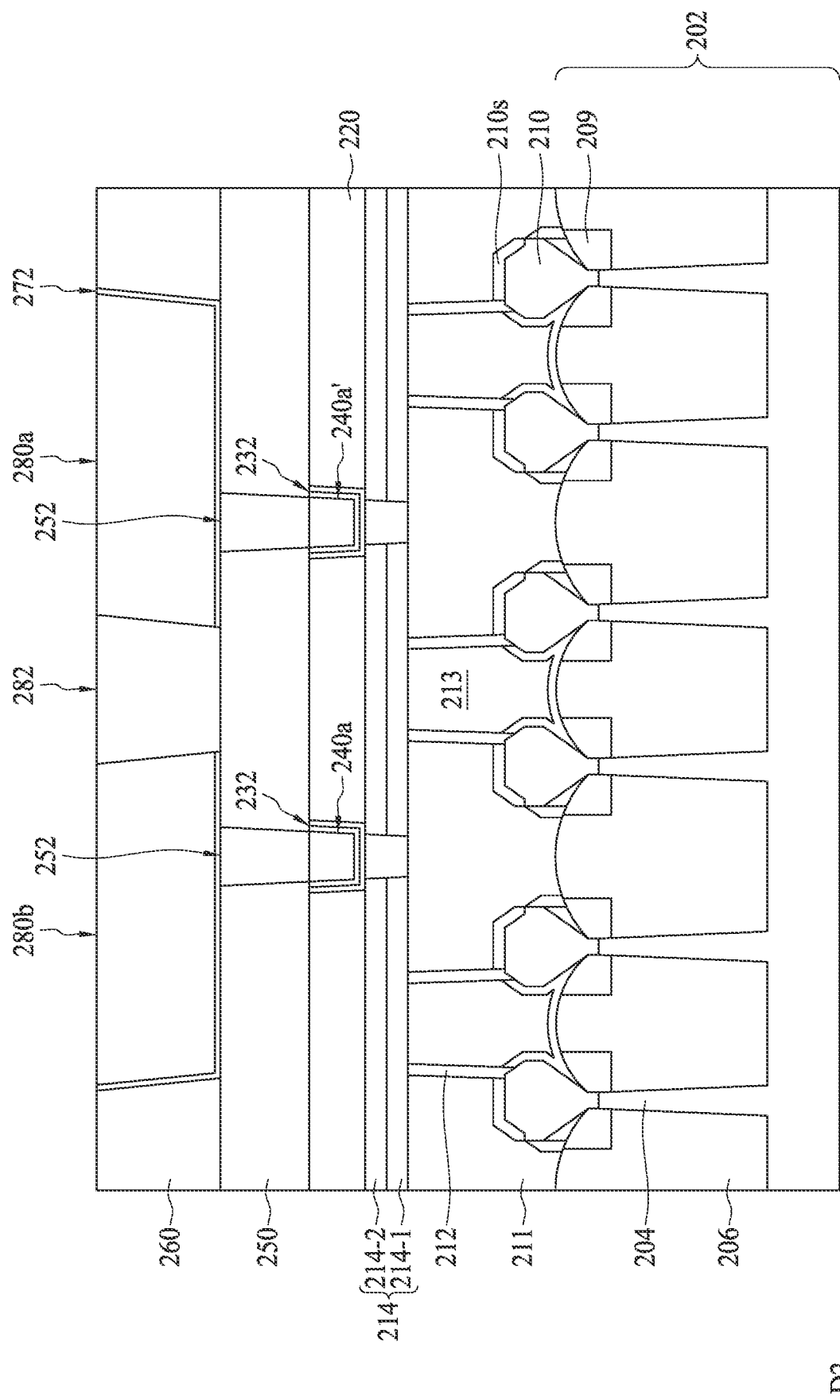
Figure 19C:
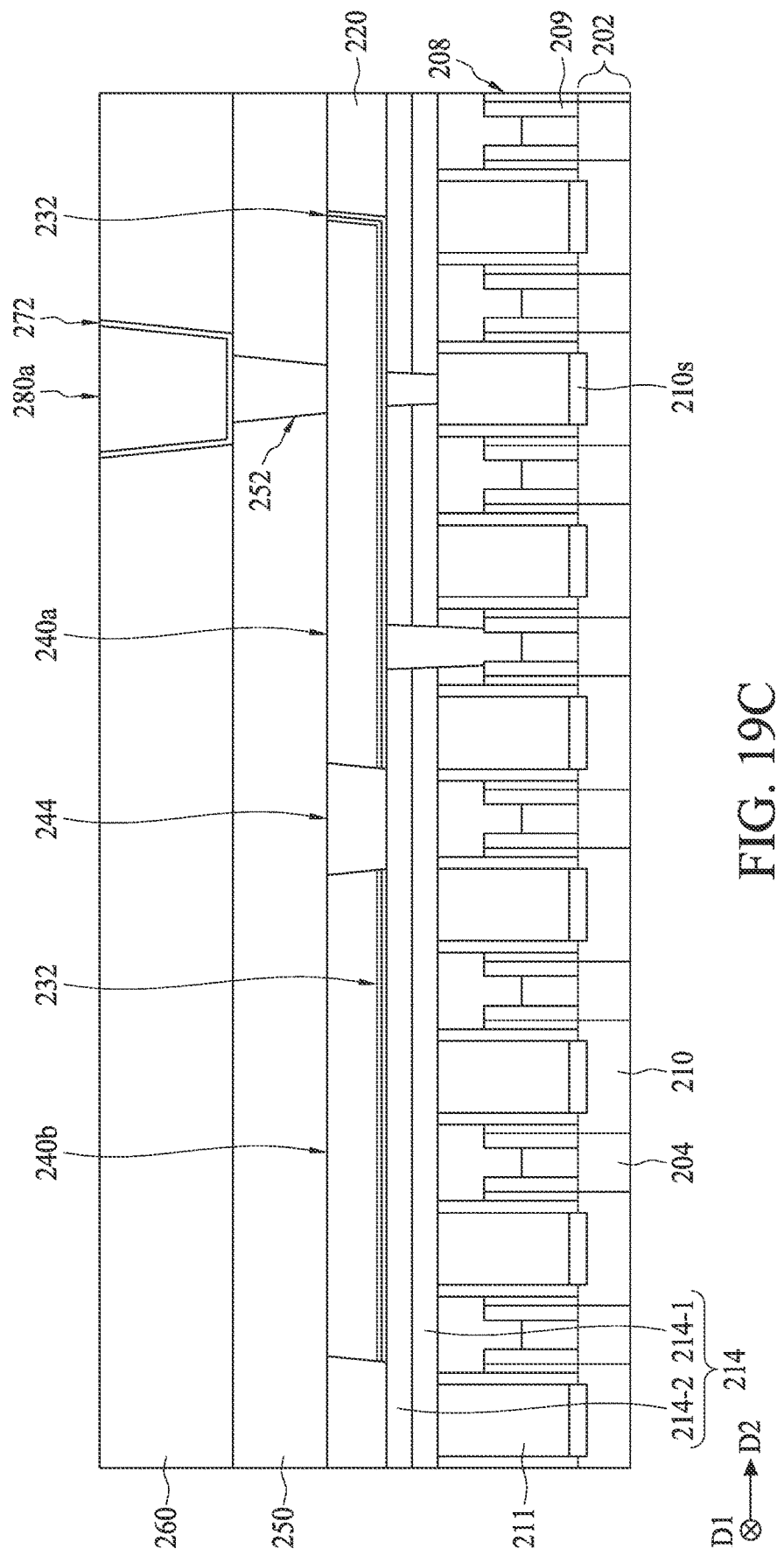

In operation 15, the method 10 fills the recess 281 with a dielectric feature 282. Referring to FIGS. 19A to 19C, in the present embodiments, the dielectric feature 282 fills the recess 281 and provides isolation between the metallization features 280a and 280b. In the present embodiments, the dielectric feature 282 includes silicon oxide, TEOS, PSG, BPSG, low-k dielectric material (examples provided above), other suitable materials, or combinations thereof. In some embodiments, the dielectric feature 282 includes a material similar to that of the dielectric feature 244 discussed in detail above. In some embodiments, the dielectric feature 282 and the dielectric layer 260 include different materials. In some embodiments, the dielectric feature 282 and the dielectric layer 260 include the same material. As shown in FIG. 19C, top surfaces of the metallization features 280a and 280b, a top surface of the dielectric layer 260, and a top surface of the dielectric feature 282 are aligned (i.e., substantially co-planar) with each other. As shown in FIGS. 19A and 19B, along the direction D1, the metallization features 280a and 280b are separated from each other by the dielectric feature 282.

Figure 20:
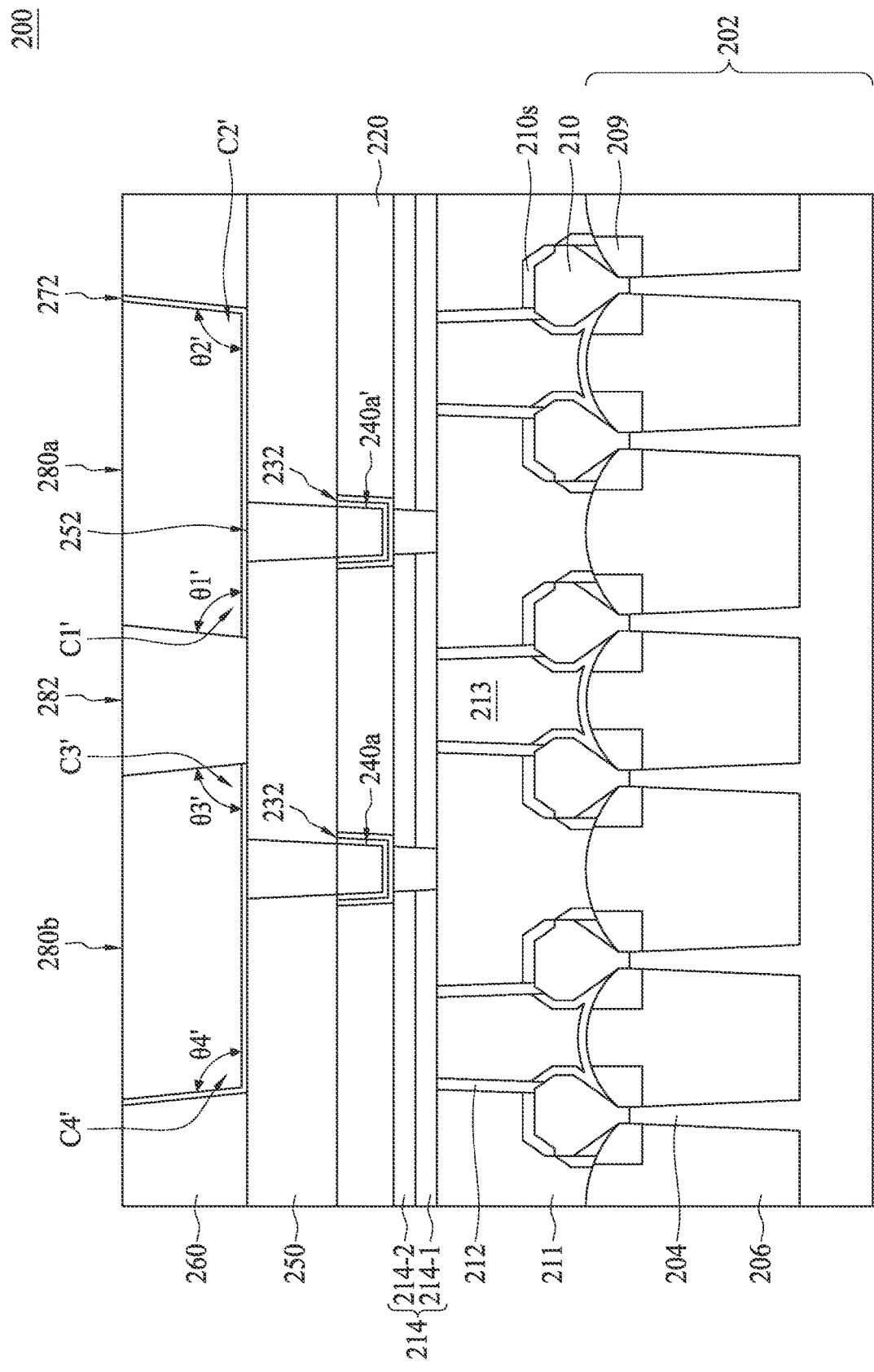
FIG. 20 is a schematic cross-sectional view of the semiconductor structure taken along line II-II' of FIG. 19A according to aspects of one or more embodiments of the present disclosure.

Referring to FIG. 20, which is the same as FIG. 19C but depicted with more details, the structure 200 includes an Nth metal layer Mn formed by the method 10. For example, the first metal layer M1 may be formed over the zeroth metal layer M0 by the method 10. Of course, additional metal layers may be formed over the first metal layer M1 using the method 10 as provided herein.

In the present embodiments, referring to FIGS. 19A to 19C and 20, each of the metallization features 280a and 280b includes a pair of long sides defined by a portion of the dielectric layer 260 (the portion is alternatively referred to as the dielectric feature 260 hereafter), one short side defined by the dielectric feature 282, and another short side defined by the dielectric layer 260. In some embodiments, if one end of the metallization feature 280a defines an end of the metallization line 270, such end of the metallization feature 280a is defined by the dielectric layer 260, while the opposite end of the metallization feature 280a is defined by the dielectric feature 282. Similarly, if one end of the metallization feature 280b defines an end of the metallization line 270, such end is defined by the dielectric layer 260, while the opposite end of the metallization feature 280b is defined by the dielectric feature 282.

In the present embodiments, the metallization feature 280a has a first bottom corner C1' adjacent to the dielectric feature 282 and a second bottom corner C2' adjacent to the dielectric layer 260 (i.e., opposite to the first bottom corner C1' along the direction D1), where the first bottom corner C1' is defined by an included angle θ1' and the second bottom corner C2' is defined by an included angle θ2', which corresponds to the angle 266 as depicted in FIG. 15B. In the present embodiments, the included angle θ1' of the first bottom corner C1' is less than about 90° (i.e., is an acute angle), while the included angle θ2' of the second bottom corner C2' is greater than about 90° (i.e., is an obtuse angle). Further, similar to the discussion above with respect to the barrier layer 232, because the barrier layer 272 is formed before forming the dielectric feature 282, the barrier layer 272 is disposed along (i.e., in direct contact with an entirety of) the sidewall of the metallization feature 280a defined by the dielectric layer 260 but not along the opposite sidewall of the metallization feature 280a defined by the dielectric feature 282. In the present embodiments, a portion of the barrier layer 272 is disposed between the metallization feature 280a and the dielectric layer 250. Still further, in the present embodiments, the metallization feature 280a is in direct contact with at least one connecting via 252, thereby allowing the FEOL device disposed over the semiconductor substrate 202 to be electrically connected to the metallization feature 280a.

In the depicted embodiments, still referring to FIGS. 19A to 19C and 20, the metallization feature 280b has a geometry that is substantially similar to that of the metallization feature 280a. For example, the metallization feature 280b also includes a pair of long sides defined by a portion of the dielectric layer 260 (i.e., the dielectric feature 260) along the direction D1, a short side defined by the dielectric feature 282, and an opposite short side defined by the dielectric layer 260. Further, in the present embodiments, the metallization feature 240b has a third bottom corner C3' adjacent to the dielectric feature 282 and a fourth bottom corner C4' adjacent to the dielectric layer 260, where the third bottom corner C3' is defined by an included angle θ3' and the fourth bottom corner C4' is defined by an included angle θ4'. In the present embodiments, the included angle θ3' of the third bottom corner C3' is less than about 90° (i.e., is an acute angle), while the included angle θ4' of the fourth bottom corner C4' is greater than about 90° (i.e., is an obtuse angle). Still further, a portion of the barrier layer 272 is disposed between the metallization feature 280b and the dielectric layer 250 and between the metallization feature 280b and the dielectric layer 260 but is not disposed along a sidewall defined by the dielectric feature 282. Additionally, in the present embodiments, the metallization feature 280b is in direct contact with one connecting via 252, allowing the FEOL device disposed over the semiconductor substrate 202 to be electrically connected to the metallization feature 280b.

In the present embodiments and for reasons discussed above with respect to the included angle 226, the included angle θ2' of the second bottom corner C2' of the metallization feature 280a and the included angle θ4' of the fourth bottom corner C4' of the metallization feature 280b, which are adjacent to the dielectric feature 260 formed prior to the forming of the metallization features 280a and 280b, are greater than about 90°. In contrast, the included angle θ1' of the first bottom corner C1' of the metallization feature 280a and the included angle θ3' of the third bottom corner C3' of the metallization feature 280b, which are adjacent to the dielectric feature 282 and formed with the forming of the metallization features 280a and 280b, are less than about 90°. Accordingly, the present embodiments provide that the dielectric feature 282 is defined by an inverted trapezoid shape. In other words, a width of the dielectric feature 282 defined along the direction D1 decreases towards the semiconductor substrate 202.

According to the present embodiments, a metallization line is formed in a trench disposed in an IMD (or ILD) layer, the trench having a relatively greater dimension (i.e., greater length) than the metallization features to be formed in the metallization line, where the metallization features are configured as portions of an BEOL interconnect structure. Thus, any gap-filling issue related to the forming of the metallization line at reduced length scales may be mitigated by filling a trench of greater dimension. Subsequently, a metal-cutting operation (including, for example, patterning and etching processes) is performed to segment the metallization line by one or more recesses, resulting in the metallization features. Further, in the present embodiments, the metallization features are electrically isolated from each other by filling the recesses with a dielectric material. In some embodiments, the dielectric material used to fill the recesses differs from the IMD (or ILD) layer in composition, thereby providing greater design freedom during device fabrication.

In some embodiments, a semiconductor structure is provided. The semiconductor structure includes a semiconductor substrate, a metallization feature over the semiconductor substrate, a first dielectric feature, a second dielectric feature, and a via contact. The metallization feature includes a first bottom corner and a second bottom corner opposite to the first bottom corner. The first dielectric feature is adjacent to the first bottom corner, and the second dielectric feature is adjacent to the second bottom corner. The metallization feature is interposed between the first dielectric feature and the second dielectric feature. In some embodiments, an included angle of the first bottom corner defined by a sidewall of first dielectric feature and a bottom surface of the metallization feature is less than 90°. The via contact is configured to connect the metallization feature to the semiconductor substrate.

In some embodiments, a semiconductor structure is provided. The semiconductor structure includes a semiconductor substrate, a first metallization feature over the semiconductor substrate, a second metallization feature over the semiconductor substrate, a first dielectric feature between the first metallization feature and the second metallization feature, and a second dielectric feature adjacent to the first metallization feature at a side opposite to the first dielectric feature. The first metallization feature includes a first bottom corner and a second bottom corner opposite to the first bottom corner, and the second metallization feature includes a third bottom corner and a fourth bottom corner opposite to the third bottom corner. In some embodiments, the first metallization feature, the second metallization feature, the first dielectric feature, and the second dielectric feature are arranged along the same direction. In some embodiments, the first bottom corner of the first metallization feature is adjacent to the first dielectric feature and defined by an acute angle. The third bottom corner of the second metallization feature is adjacent to the first dielectric feature and defined by an acute angle.

In some embodiments, a method for forming a semiconductor structure is provided. The method includes following operations. A semiconductor substrate is received. In some embodiments, a first dielectric layer is formed over the semiconductor substrate. A trench is formed in the first dielectric layer. The trench is filled to form a conductive layer in the first dielectric layer. The conductive layer is segmented to form a first conductive feature and a second conductive feature separated from each other by a recess. The recess is filled with a second dielectric layer, such that one or both of the conductive features are end-capped by a portion of the first dielectric layer and a portion of the second dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor structure, comprising:
   receiving a semiconductor substrate, wherein a first dielectric layer is formed over the semiconductor substrate;
   forming a trench in the first dielectric layer;
   filling the trench to form a conductive layer in the first dielectric layer;
   segmenting the conductive layer to form a first conductive feature and a second conductive feature separated from each other by a recess; and
   filling the recess with a second dielectric layer, such that one or both of the conductive features are end-capped by a portion of the first dielectric layer and a portion of the second dielectric layer.

2. The method of claim 1, further comprising:
   forming a third dielectric layer between the semiconductor substrate and the first dielectric layer; and
   forming a connecting via in the third dielectric layer, wherein forming the first conductive feature and the second conductive feature results in the first conductive feature and the second conductive feature to be electrically coupled to the semiconductor substrate through the connecting via.

3. The method of claim 1, wherein the first dielectric layer and the second dielectric layer have the same composition.

4. The method of claim 1, wherein the first dielectric layer and the second dielectric layer have different compositions.

5. The method of claim 1, wherein filling the trench results in the conductive layer to have a first inverted trapezoidal shape, and wherein filling the recess results in the second dielectric layer to have a second inverted trapezoidal shape.

6. The method of claim 1, further comprising:
   forming a gate structure over the semiconductor substrate; and
   depositing the first dielectric layer over the gate structure.

7. The method of claim 6, further comprising:
   depositing an etch stop layer over the gate structure prior to depositing the first dielectric layer.

8. The method of claim 1, wherein the filling the trench to form the conductive layer includes:
   depositing a barrier layer; and
   depositing a conductive material over the barrier layer.

9. A method for forming a semiconductor structure, comprising:
- forming a semiconductor device over the semiconductor structure;
- conformally depositing a first dielectric layer;
- etching a trench in the first dielectric layer, wherein the trench has a first length and a first width;
- filling the trench to form a conductive layer in the first dielectric layer, wherein the conductive layer has the first length and the first width;
- etching the conductive layer to form a recess at a first portion along the first length; and
- filling the recess with a second dielectric layer.

10. The method of claim 9, wherein the etching the recess forms the recess having tapered sidewalls, the recess having a first width at a top surface of the conductive layer and a second width at a bottom surface of the conductive layer, the second width less than the first width.

11. The method of claim 9, wherein the etching the trench forms the trench having tapered sidewalls, the recess having a first width at a top surface of the first dielectric layer and a second width at a bottom surface of the first dielectric layer, the second width less than the first width.

12. The method of claim 9, wherein the recess has the first width.

13. The method of claim 9, wherein the first dielectric layer comprising a same composition as the second dielectric layer.

14. The method of claim 9, wherein the first dielectric layer comprises a different composition than the second dielectric layer.

15. A method, comprising:
- forming a dielectric layer over a semiconductor substrate;
- etching a first trench in the dielectric layer, wherein etching the first trench provides a recess having a first tapered sidewall, wherein the first tapered sidewall extends from an upper point to a lower point in a first direction;
- filling the first trench with metallization to form a metallization line, wherein the metallization line abuts the first tapered sidewall;
- etching a second trench in the metallization line, wherein etching the second trench provides a second tapered sidewall, wherein the second tapered sidewall extends from an upper point to a lower point in the first direction, wherein a contiguous portion of the metallization line extends from the first tapered sidewall to the second tapered sidewall; and
- filling the second trench with another dielectric material.

16. The method of claim 15, wherein filling the first trench with metallization includes depositing barrier layer and a conductive material over the barrier layer.

17. The method of claim 16, wherein the barrier layer is formed on the first tapered sidewall but omitted from the second tapered sidewall.

18. The method of claim 15, further comprising:
- forming etch stop layer under the dielectric layer.

19. The method of claim 18, wherein the etching the first trench exposes a surface of the etch stop layer.

20. The method of claim 19, wherein etching the second trench in the metallization line exposes a portion of the surface of the etch stop layer.

* * * * *